US012181917B2

(12) United States Patent
Shin et al.

(10) Patent No.: US 12,181,917 B2
(45) Date of Patent: Dec. 31, 2024

(54) ELECTRONIC DEVICE COMPRISING DISPLAY SUPPORT STRUCTURE

(71) Applicant: Samsung Electronics Co., Ltd., Suwon-si (KR)

(72) Inventors: Moonchul Shin, Suwon-si (KR); Youngmin Kang, Suwon-si (KR); Yeonggyu Yoon, Suwon-si (KR); Seungjoon Lee, Suwon-si (KR); Joongyeon Cho, Suwon-si (KR); Junyoung Choi, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 259 days.

(21) Appl. No.: 17/586,096

(22) Filed: Jan. 27, 2022

(65) Prior Publication Data

US 2022/0147101 A1    May 12, 2022

Related U.S. Application Data

(63) Continuation of application No. PCT/KR2021/008290, filed on Jun. 30, 2021.

(30) Foreign Application Priority Data

Jul. 14, 2020  (KR) .................. 10-2020-0086823
Oct. 7, 2020   (KR) .................. 10-2020-0129528
(Continued)

(51) Int. Cl.
    *G06F 1/16*         (2006.01)
(52) U.S. Cl.
    CPC .......... *G06F 1/1624* (2013.01); *G06F 1/1652* (2013.01); *G06F 1/1681* (2013.01)

(58) Field of Classification Search
    CPC .... G06F 1/1624; G06F 1/1652; G06F 1/1681; G06F 1/1637; G06F 1/1641;
    (Continued)

(56) References Cited

U.S. PATENT DOCUMENTS 6,771,232 B2   8/2004  Fujieda et al.
7,667,962 B2   2/2010  Mullen
(Continued)

FOREIGN PATENT DOCUMENTS

CN   101370366 B   8/2011
CN   108259649 A   7/2018
(Continued)

OTHER PUBLICATIONS

Extended European Search Report dated May 18, 2022, issued in European Patent Application No. 21754692.8.
(Continued)

*Primary Examiner* — Rockshana D Chowdhury
(74) *Attorney, Agent, or Firm* — Jefferson IP Law, LLP

(57) ABSTRACT

An electronic device is provided. The electronic device includes a first housing including a first space, a second housing including a second space, the second housing coupled to the first housing such that the second housing is slidable in a first direction, and a bendable member connected to the first housing. The bendable member is partially accommodated in the second space in a slid-in state and is at least partially coplanar to the first housing in a slid-out state. The electronic device includes a flexible display including a first portion disposed to be visible in the slid-in state and a second area extending from the first portion and accommodated in the second space through at least a portion of the bendable member, and a support assembly disposed to (Continued)

be oriented from the first housing toward the second space and configured to press the second housing in a slid-out direction.

20 Claims, 48 Drawing Sheets

(30) Foreign Application Priority Data

| Oct. 12, 2020 | (KR) | 10-2020-0131321 |
|---|---|---|
| Oct. 12, 2020 | (KR) | 10-2020-0131459 |
| Dec. 18, 2020 | (KR) | 10-2020-0178328 |

(58) Field of Classification Search
CPC ....... H10K 2102/311; C09J 9/00; G06K 7/00; G09F 9/30; H04M 1/02
See application file for complete search history.

(56) References Cited

U.S. PATENT DOCUMENTS

| 7,724,508 | B2 | 5/2010 | Bemelmans et al. |
|---|---|---|---|
| 8,199,471 | B2 | 6/2012 | Bemelmans et al. |
| 8,536,667 | B2 | 9/2013 | De Graff et al. |
| 9,293,111 | B2 | 3/2016 | Kwack et al. |
| 9,823,697 | B2 | 11/2017 | Hsu et al. |
| 10,553,135 | B2* | 2/2020 | Lee .................. G06F 3/147 |
| 10,684,714 | B2 | 6/2020 | Seo et al. |
| 10,708,395 | B1 | 7/2020 | Han |
| 10,757,823 | B2* | 8/2020 | Park ................ G06F 1/1626 |
| 10,820,433 | B2* | 10/2020 | Cha ................. H05K 5/0226 |
| 10,868,897 | B2 | 12/2020 | Cha et al. |
| 10,963,014 | B1* | 3/2021 | Park ................ H04B 1/3827 |
| 11,051,413 | B2* | 6/2021 | Yang ............... G06F 1/1624 |
| 11,315,443 | B2* | 4/2022 | Han ................ G06F 1/1624 |
| 11,675,392 | B2* | 6/2023 | Park ................ G06F 1/1698 |
| | | | 361/679.01 |
| 11,689,651 | B2* | 6/2023 | Feng ................ H04M 1/0237 |
| | | | 455/566 |
| 11,775,016 | B2* | 10/2023 | Choi ................ G06F 1/1681 |
| | | | 361/679.01 |
| 11,860,694 | B2 | 1/2024 | Shin et al. |
| 2003/0109286 | A1 | 6/2003 | Hack et al. |
| 2003/0218860 | A1 | 11/2003 | Shiraiwa |
| 2004/0183958 | A1 | 9/2004 | Akiyama et al. |
| 2005/0041012 | A1 | 2/2005 | Daniel et al. |
| 2008/0153558 | A1 | 6/2008 | Mifune et al. |
| 2011/0051347 | A1 | 3/2011 | Yamagiwa et al. |
| 2012/0241304 | A1 | 9/2012 | Liu |
| 2012/0314400 | A1 | 12/2012 | Bohn et al. |
| 2013/0058063 | A1* | 3/2013 | O'Brien ............ G06F 1/1624 |
| | | | 361/807 |
| 2013/0314387 | A1 | 11/2013 | Kwack et al. |
| 2015/0187136 | A1 | 7/2015 | Grimaud |
| 2017/0006738 | A1 | 1/2017 | Lee et al. |
| 2018/0102072 | A1 | 4/2018 | Lee et al. |
| 2018/0164852 | A1 | 6/2018 | Lim et al. |
| 2018/0181164 | A1 | 6/2018 | Chen |
| 2018/0188778 | A1 | 7/2018 | Shin |
| 2018/0329456 | A1 | 11/2018 | Myers |
| 2019/0098121 | A1 | 3/2019 | Jeon et al. |
| 2019/0146558 | A1 | 5/2019 | Ohata et al. |
| 2019/0261519 | A1 | 8/2019 | Park et al. |
| 2019/0296259 | A1 | 9/2019 | Baek et al. |
| 2019/0305237 | A1 | 10/2019 | Shin et al. |
| 2019/0346954 | A1 | 11/2019 | Jung et al. |
| 2019/0384438 | A1 | 12/2019 | Park et al. |
| 2020/0013317 | A1* | 1/2020 | Cho ................. H05K 5/0217 |
| 2020/0170114 | A1 | 5/2020 | Choi et al. |
| 2020/0218353 | A1 | 7/2020 | Song et al. |
| 2020/0264660 | A1* | 8/2020 | Song ................ G06F 1/1624 |
| 2020/0329572 | A1 | 10/2020 | Wittenberg et al. |
| 2020/0363841 | A1* | 11/2020 | Kim ................. G06F 1/1675 |
| 2020/0371558 | A1 | 11/2020 | Kim et al. |
| 2021/0044683 | A1 | 2/2021 | He et al. |
| 2021/0116959 | A1 | 4/2021 | Heo et al. |
| 2021/0185835 | A1 | 6/2021 | Song et al. |
| 2021/0219437 | A1 | 7/2021 | Kim et al. |
| 2022/0011821 | A1 | 1/2022 | Han et al. |
| 2022/0019261 | A1 | 1/2022 | Kang et al. |
| 2022/0232716 | A1 | 7/2022 | Lim et al. |
| 2022/0240400 | A1* | 7/2022 | Zhou ............... G09F 9/301 |
| 2022/0322551 | A1 | 10/2022 | Cheng et al. |
| 2022/0342448 | A1 | 10/2022 | Shin et al. |
| 2022/0361347 | A1 | 11/2022 | Feng |
| 2023/0010760 | A1 | 1/2023 | Lee et al. |
| 2023/0095247 | A1* | 3/2023 | Feng ................ G09F 9/301 |
| | | | 361/679.27 |
| 2023/0097200 | A1* | 3/2023 | Feng ................ G06F 1/1656 |
| | | | 361/679.01 |
| 2023/0109963 | A1* | 4/2023 | Feng ................ H04M 1/0235 |
| | | | 361/679.01 |
| 2023/0156105 | A1* | 5/2023 | Feng ................ G06F 1/1652 |
| | | | 361/679.01 |
| 2023/0217611 | A1* | 7/2023 | Lee ................. G06F 1/1601 |
| | | | 361/807 |

FOREIGN PATENT DOCUMENTS

| CN | 110599912 A | 12/2019 |
|---|---|---|
| CN | 110839095 A | 2/2020 |
| EP | 3 531 230 A2 | 8/2019 |
| JP | 2005-309086 A | 11/2005 |
| JP | 2011-049805 A | 3/2011 |
| KR | 10-2008-0058168 A | 6/2008 |
| KR | 10-2011-0066562 A | 6/2011 |
| KR | 10-2014-0059274 A | 5/2014 |
| KR | 10-2015-0076119 A | 7/2015 |
| KR | 10-2017-0004068 A | 1/2017 |
| KR | 10-2018-0039027 A | 4/2018 |
| KR | 10-2019-0034063 A | 4/2019 |
| KR | 10-2019-0077107 A | 7/2019 |
| KR | 10-2019-0086305 A | 7/2019 |
| KR | 10-2019-0128843 A | 11/2019 |
| KR | 10-2019-0141518 A | 12/2019 |
| KR | 10-2019-0143029 A | 12/2019 |
| KR | 10-2020-0007510 A | 1/2020 |

OTHER PUBLICATIONS

U.S. Notice of Allowance dated Jul. 29, 2022, issued in U.S. Appl. No. 17/363,236.
European Search Report dated Aug. 17, 2023, issued in European Application No. 21841672.5.
European Search Report dated Sep. 7, 2023, issued in European Application No. 21841741.8.
U.S. Notice of Allowance dated Aug. 24, 2023, issued in U.S. Appl. No. 17/433,404.
U.S. Non-final Office Action dated Apr. 18, 2023, issued in U.S. Appl. No. 17/433,404.
Extended European Search Report dated Nov. 23, 2023, issued in European Patent Application No. 21841221.1.
U.S. Notice of Allowance dated Mar. 19, 2024, issued in U.S. Appl. No. 18/096,714.
European Notice of Allowance dated May 28, 2024, issued in European Patent Application No. 21841221.1.

* cited by examiner

ELECTRONIC DEVICE COMPRISING DISPLAY SUPPORT STRUCTURE

CROSS-REFERENCE TO RELATED APPLICATION(S)

This application is a continuation application, claiming priority under § 365(c), of an International application No. PCT/KR2021/008290, filed on Jun. 30, 2021, which is based on and claims the benefit of a Korean patent application number 10-2020-0086823, filed on Jul. 14, 2020, in the Korean Intellectual Property Office, of a Korean patent application number 10-2020-0129528, filed on Oct. 7, 2020, in the Korean Intellectual Property Office, of a Korean patent application number 10-2020-0131321, filed on Oct. 12, 2020, in the Korean Intellectual Property Office, of a Korean patent application number 10-2020-0131459, filed on Oct. 12, 2020, in the Korean Intellectual Property Office, and of a Korean patent application number 10-2020-0178328, filed on Dec. 18, 2020, in the Korean Intellectual Property Office, the disclosure of each of which is incorporated by reference herein in its entirety.

BACKGROUND

1. Field

The disclosure relates to an electronic device including a display support structure.

2. Description of Related Art

Electronic devices are being gradually slimmed, and are being developed to increase rigidity, to enhance a design aspect, and to differentiate functional elements thereof. Electronic devices are gradually departing from a uniform rectangular shape so as to have various shapes. An electronic device may have a deformable structure that makes it easy to carry the electronic device and enables a large screen display to be used. For example, as a type of a deformable structure, an electronic device may have a structure capable of varying the display area of a flexible display by supporting housings that operate in a sliding manner with respect to each other (e.g., a rollable structure or a slidable structure). Such an electronic device needs to be provided with a reliable sliding operation.

The above information is presented as background information only to assist with an understanding of the disclosure. No determination has been made, and no assertion is made, as to whether any of the above might be applicable as prior art with regard to the disclosure.

SUMMARY

Among the electronic devices, a deformable slidable electronic device (e.g., a rollable electronic device) may have a display area that can be expanded when used. The slidable electronic device may include a first housing (e.g., a first housing structure, a base housing, a base bracket, or a base structure) and a second housing (e.g., a second housing structure, a slide housing, a slide bracket, or a slide structure), which are movably coupled to each other in a manner of being at least partially fitted together. For example, the first housing and the second housing are slidably operated with respect to each other and support at least a portion of a flexible display (or an expandable display), whereby, in a slide-in state, the flexible display can be induced to have a first display, and in a slide-out state, the flexible display can be induced to have a second display area that is larger than the first display area.

A slidable electronic device may include a plurality of electronic components disposed in the internal space thereof. Since these electronic components require different mounting spaces, it is necessary to properly arrange the electronic components in the internal spaces of the housings, which are slidable with respect to each other. In addition, in a slid-out state of the electronic device, an empty space is generated under at least a partial area of a flexible display due to the separation of two housings, and this space causes the flexible display to sag, which may make it difficult to secure surface quality.

Aspects of the disclosure are to address at least the above-mentioned problems and/or disadvantages and to provide at least the advantages described below. Accordingly, an aspect of the disclosure is to provide an electronic device that includes a display support structure.

Another aspect of the disclosure is to provide an electronic device capable of guiding efficient arrangement of electronic components having different mounting spaces.

Another aspect of the disclosure is to provide an electronic device having a display support structure that is capable of helping secure surface quality by continuously supporting the flexible display during transition from a slid-in state into a slid-out state.

Additional aspects will be set forth in part in the description which follows and, in part, will be apparent from the description, or may be learned by practice of the presented embodiments.

In accordance with an aspect of the disclosure, an electronic device is provided. The electronic device includes a first housing including a first space, a second housing including a second space, the second housing coupled to the first housing such that the second housing is slidable in a first direction, and a bendable member connected to the first housing. The bendable member is at least partially accommodated in the second space in a slid-in state and is at least partially coplanar to the first housing in a slid-out state. The electronic device further includes a flexible display including a first portion disposed to be visible when the second housing is in the slid-in state and a second portion extending from the first portion and accommodated in the second space through at least a portion of the bendable member, and a support assembly disposed to be oriented from the first housing toward the second space and configured to press the second housing in a slid-out direction. In the slid-in state, a portion of the first housing may be fully disposed in the second space of the second housing, and a remaining portion may extend from the second housing.

According to various embodiments of the disclosure, the electronic device has a sliding structure in which, in the slid-in state, a partial area of the first housing is disposed to be visible to the outside without being slid into the inner space of the second housing, which can be helpful in a strategy of efficiently arranging electronic components having different mounting structures. In addition, in the electronic device, the support assembly, which is provided to continuously support the flexible display during the transition from the slid-in state into the slid-out state, can help ensure surface quality and smooth sliding operation of the flexible display.

In addition, various effects directly or indirectly identified through this document may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
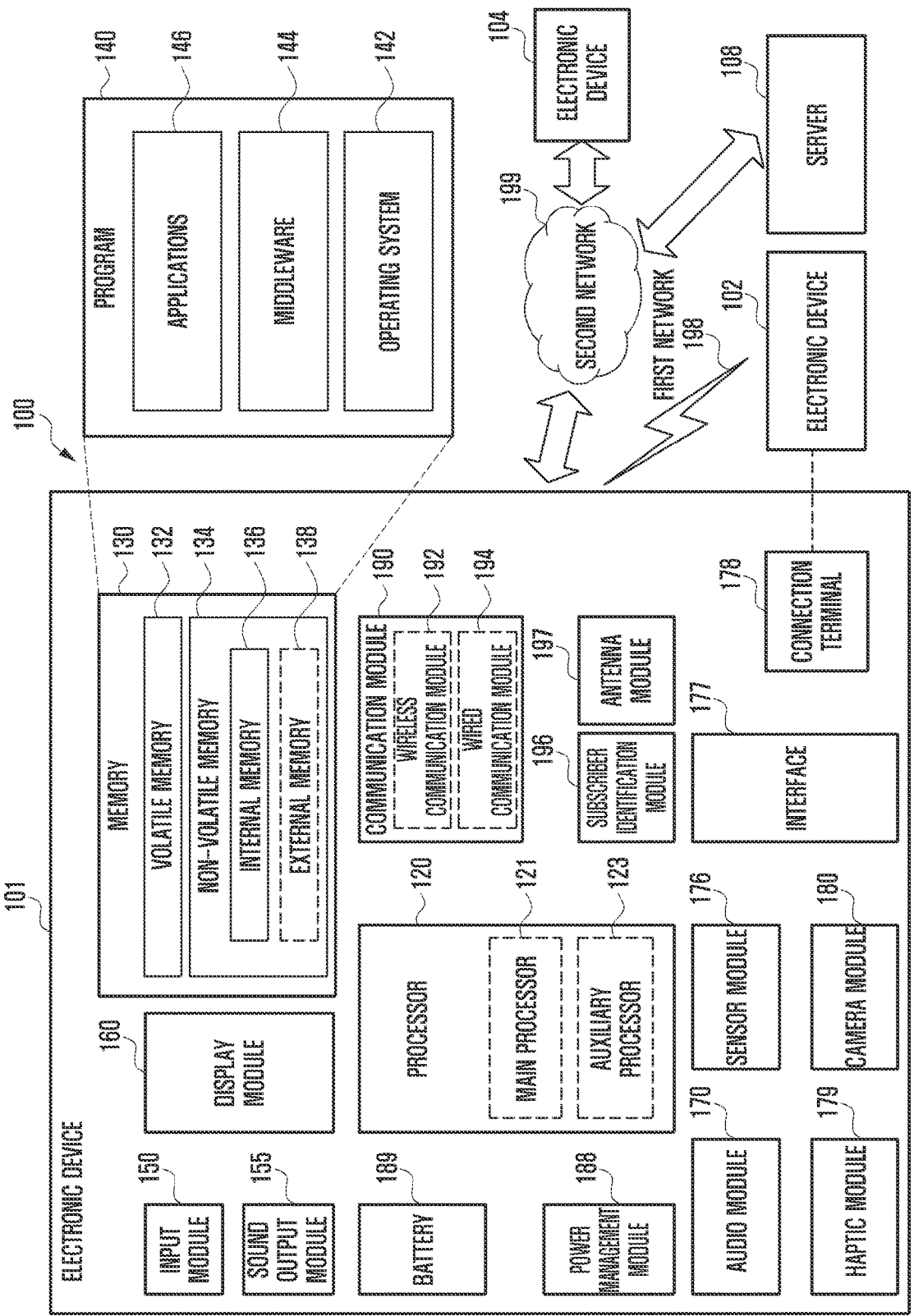
FIG. 1 is a block diagram of an electronic device in a network environment according to an embodiment of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 136 may include internal memory 136 and external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beam-forming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
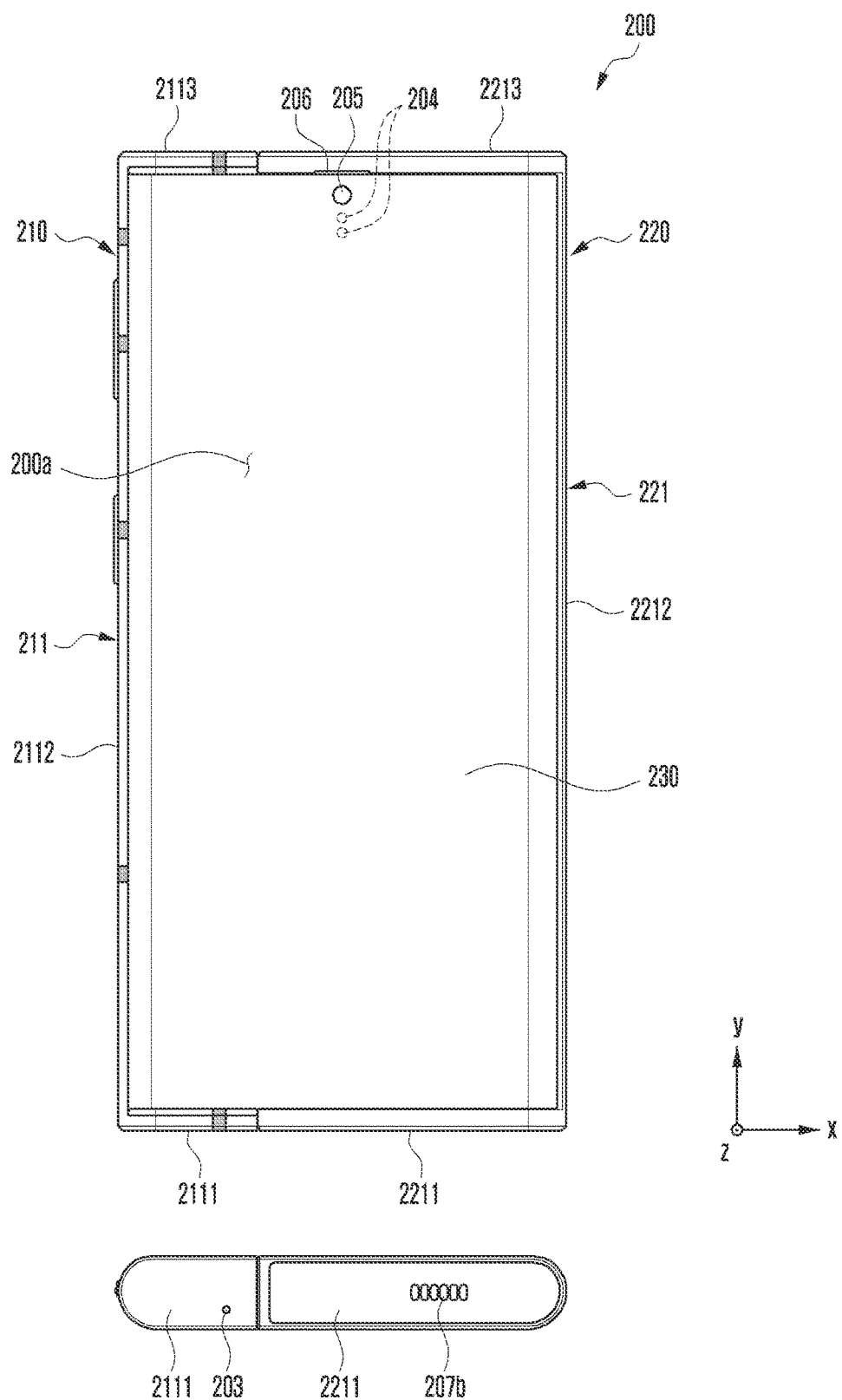
FIG. 2A is a view illustrating the front surface of an electronic device in the slide-in state according to an embodiment of the disclosure.
Figure 2B:
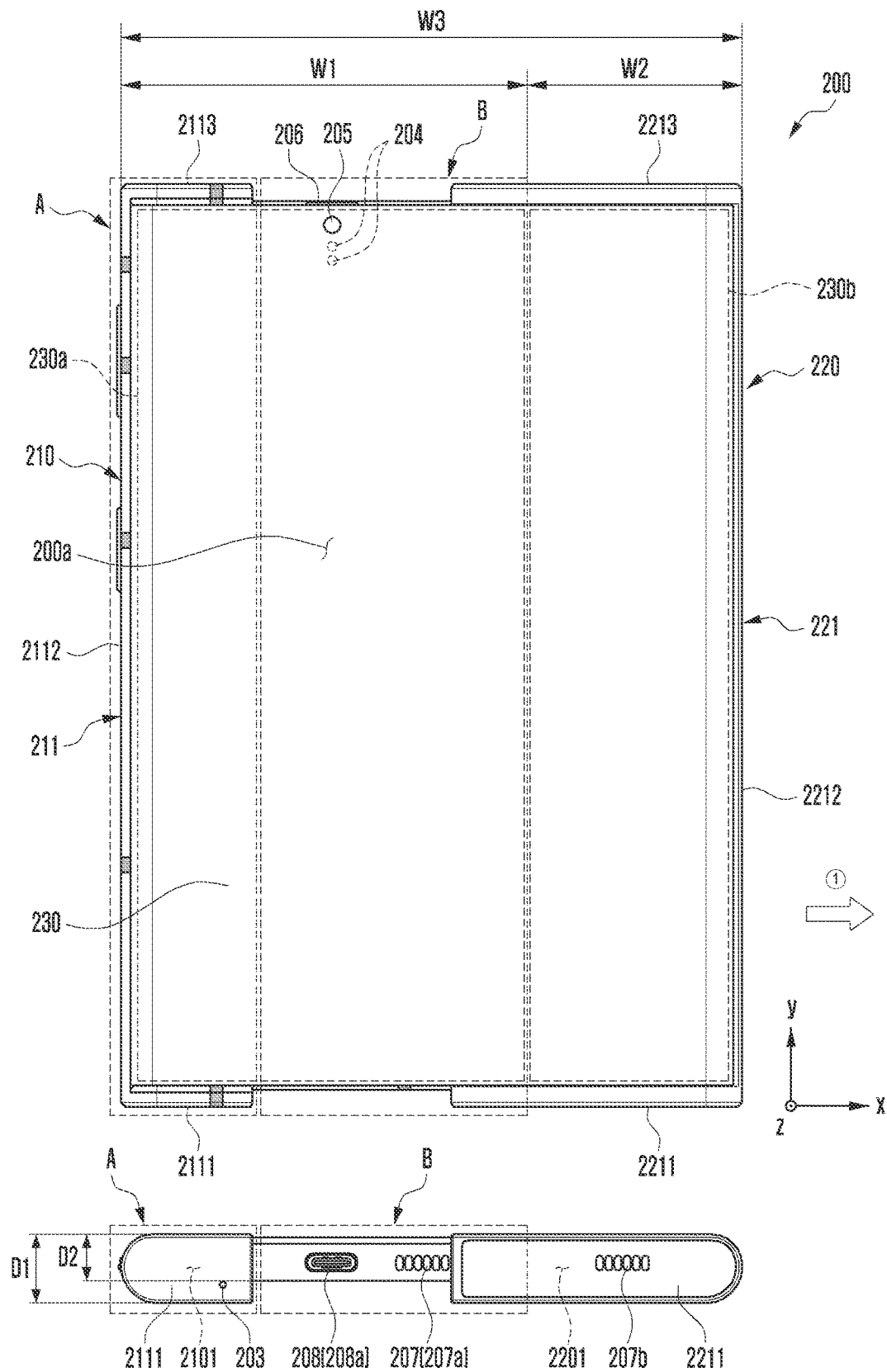
FIG. 2B is a view illustrating the front surface of the electronic device in the slide-out state according to an embodiment of the disclosure.

FIG. 2A is a view illustrating the front and side surfaces of an electronic device in the slide-in state according to an embodiment of the disclosure, and FIG. 2B is a view illustrating the front and side surfaces of the electronic device in the slide-out state according to an embodiment of the disclosure.

Figure 3A:
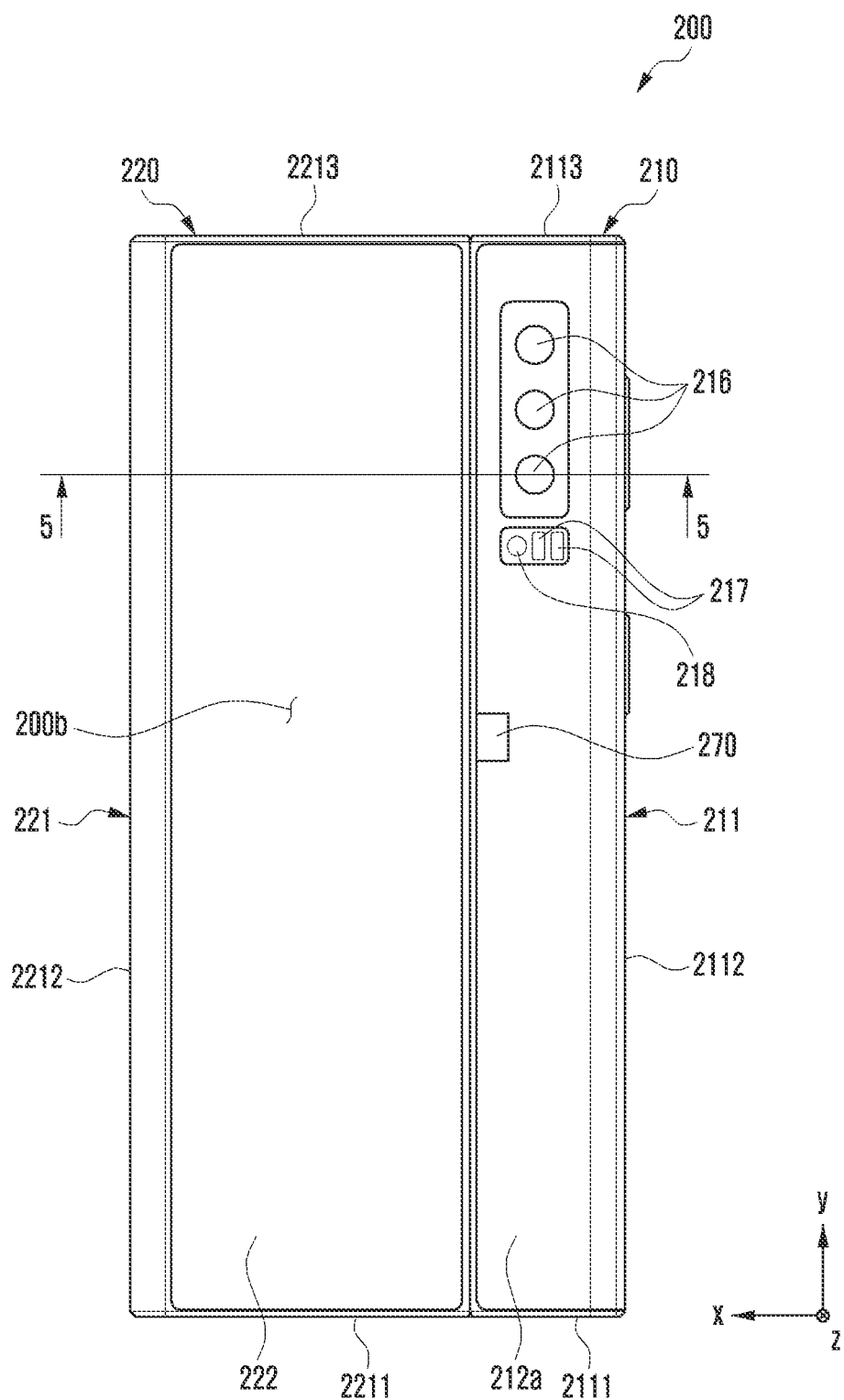
FIG. 3A is a view illustrating the rear surface of the electronic device in the slide-in state according to an embodiment of the disclosure.
Figure 3B:
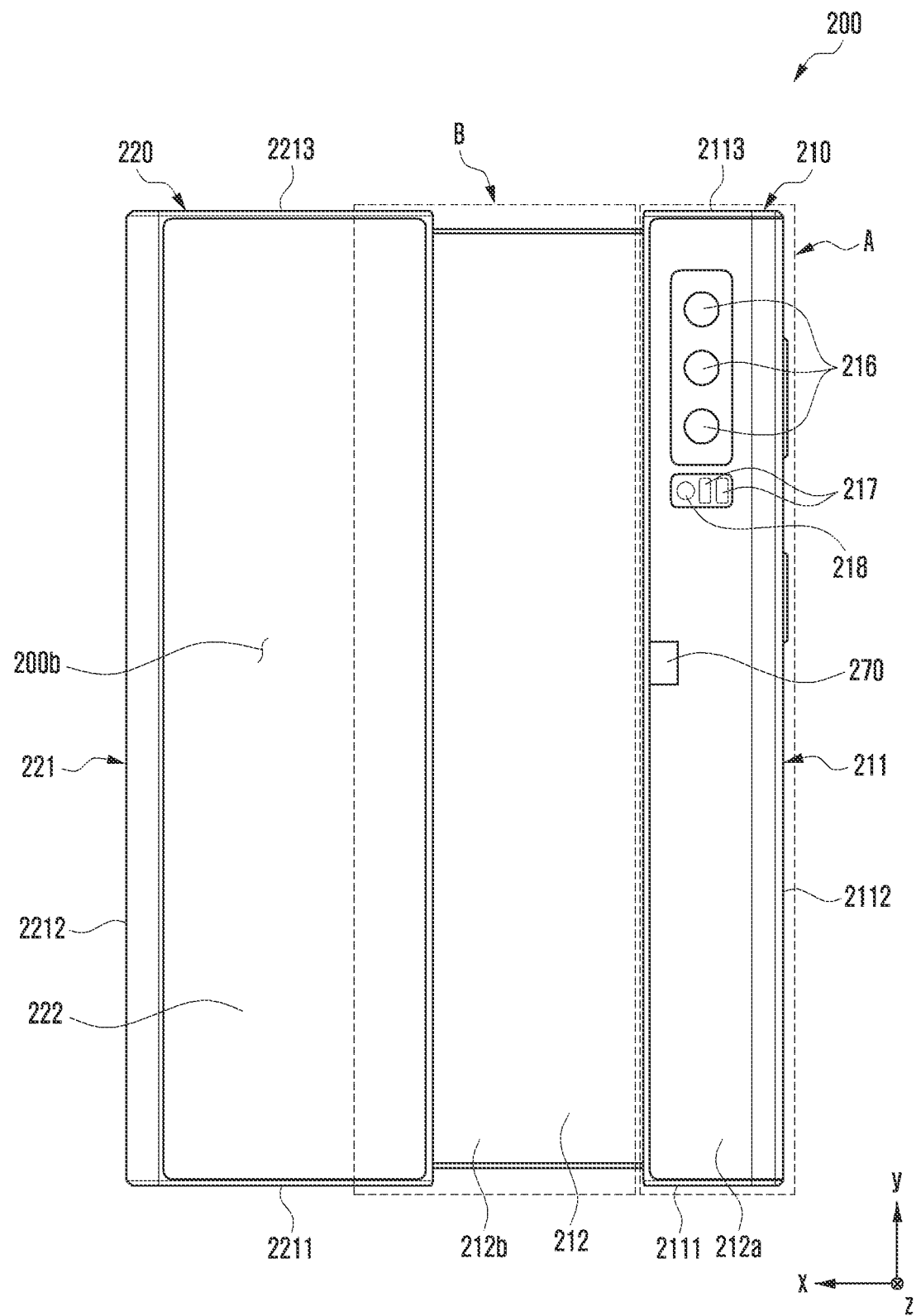
FIG. 3B is a view illustrating the rear surface of the electronic device in the slide-out state according to an embodiment of the disclosure.

FIG. 3A is a view illustrating the rear surface of the electronic device in the slide-in state according to an embodiment of the disclosure, and FIG. 3B is a view illustrating the rear surface of the electronic device in the slide-out state according to an embodiment of the disclosure.

The electronic device 200 of FIGS. 2A, 2B, 3A, and 3B may be at least partially similar to the electronic device 101 of FIG. 1, or may further include other embodiments of the electronic device.

Referring to FIGS. 2A, 2B, 3A, and 3B, the electronic device 200 may include a first housing 210 (e.g., a first housing structure or a base housing), a second housing 220 (e.g., a second housing structure or a slide housing) coupled to the first housing 210 to be movable by a predetermined reciprocating distance from the first housing 210 in a predetermined first direction (direction ①), and a flexible display (e.g., an expandable display) 230 disposed to be supported by at least a portion of the first housing 210 and the second housing 220. According to an embodiment, the electronic device 200 may include a bendable member or a bendable support member (e.g., the bendable member 240 in FIG. 5) (e.g., a multi joint hinge module), which at least partially forms the same plane as at least a portion of the first housing 210 in the slide-out state and is at least partially accommodated into the internal space (e.g., the second space 2201 in FIG. 5) of the second housing 220 in the slide-in state. According to an embodiment, in the slide-in state, at least a portion of the flexible display 230 may be accommodated into the internal space of the second housing 220 (e.g., the second space 2201 in FIG. 5) while being supported by the bendable member (e.g., the bendable member 240 in FIG. 5), thereby being invisible from the outside. According to an embodiment, at least a portion of the flexible display 230 may be disposed to be visible from the outside while being supported by the bendable member (e.g., the bendable member 260 in FIG. 5), which at least partially forms the same plane as the first housing 210 in the slide-out state.

According to various embodiments, the electronic device 200 may include a front surface 200a (e.g., a first surface), a rear surface 200b (e.g., a second surface) facing away from the front surface 200a, and a side surface (not illustrated) surrounding the space between the front surface 200a and the rear surface 200b. According to an embodiment, the electronic device 200 may include a first housing 210 including a first side member 211 and a second housing 220 including a second side member 221. According to an embodiment, the first side member 211 may include a first side surface 2111 having a first length along a first direction (the x-axis direction), a second side surface 2112 extending from the first side surface 2111 in a direction substantially perpendicular thereto and having a second length that is longer than the first length, and a third side surface 2113 extending from the second side surface 2111 to be substantially parallel to the first side surface 2111 and having a first length. According to an embodiment, at least a portion of the first side member 211 may be formed of a conductive material (e.g., metal). According to an embodiment, at least a portion of the first side member 211 may include a first support member 212 extending to at least a portion of the internal space of the first housing 210 (e.g., the first space 2101 in FIG. 5).

According to various embodiments, the second side member 221 may include a fourth side surface 2211 at least partially corresponding to the first surface 2111 and having a third length, a fifth side surface 2212 extending from the fourth side surface 2211 in a direction substantially parallel to the second side surface 2112 and having a fourth length that is longer than the third length, and a sixth side surface 2213 extending from the fifth side surface 2212 to correspond to the third side surface 2113 and having the third length. According to an embodiment, at least a portion of the second side member 221 may be formed of a conductive material (e.g., metal). According to an embodiment, at least a portion of the second side member 221 may include a second support member 222 extending to at least a portion of the internal space of the second housing 220 (e.g., the second space 2201 in FIG. 5). According to an embodiment, the first side 2111 and the fourth side 2211 may be slidably coupled to each other, and the third side 2113 and the sixth side 2213 may be slidably coupled to each other. According to an embodiment, in the slide-in state, at least a portion of the first side surface 2111 overlaps at least a portion of the fourth side surface 2211, whereby the remaining portion of the first side 2111 may be disposed to be visible from the outside. According to an embodiment, in the slide-in state, at least a portion of the third side surface 2113 overlaps at least a portion of the sixth side surface 2213, whereby the remaining portion of the third side 2113 may be disposed to be visible from the outside. According to an embodiment, in the slide-in state, at least a portion of the first support member 212 may overlap at least a portion of the second support member 222, and the remaining portion of the first support member 212 may be disposed to be visible from the outside. Accordingly, the first support member 212 includes a non-overlapping portion 212a that does not overlap the second support member 222 in the slide-in state and an overlapping portion 212b that overlaps the second support member 222 in the slide-in state. In some embodiments, the non-overlapping portion 212a and the overlapping portion 212b may be integrally formed. In some embodiments, the non-overlapping portion 212a and the overlapping portion 212b may be provided separately, and may be structurally coupled to each other.

According to various embodiments, in the first space 2101, the first housing 210 may include a first sub-space A corresponding to the non-overlapping portion 212a and a second sub-space corresponding to the overlapping portion 212b. According to an embodiment, the first sub-space A and the second sub-space B may be disposed so as to be at least partially connected to each other or to be separated from each other. According to an embodiment, the first sub-space A may have a larger spatial volume than the second sub-space B. This may be due to an overlapping structure in which the second support member 222 and the first support member 212 overlap in an area corresponding to the second sub-space B. According to an embodiment, the electronic device 200 may include multiple electronic components (e.g., a camera module 216, a sensor module 217, a flash 218, a main board (e.g., the main board 250 in FIG. 4) or a battery (e.g., the battery 251 in FIG. 4)) disposed in the first space of the first housing 210 (e.g., the first space 2101 in FIG. 5). According to an embodiment, the first sub-space A may be used as an area in which, for example, electronic components that require a relatively large mounting space (a relatively large mounting height) or have to be operated in the state of avoiding an overlapping structure (e.g., a camera module 216, a sensor module 217, or a flash 218) are disposed. According to an embodiment, the second sub-space B may be used as an area in which, for example, electronic components that require a relatively small mounting space (a relatively small mounting height) or are capable of operating regardless of an overlapping structure (e.g., the main board (PCB) 250 in FIG. 4 or a battery (e.g., the battery 251 in FIG. 4)) are disposed.

According to various embodiments, the areas of the front surface 200a and the rear surface 200b of the electronic device 200 may vary according to the sliding-in state and the sliding-out state. In some embodiments, on the rear surface 200b, the electronic device 200 may include a first rear cover (e.g., the first rear cover 213 in FIG. 4) disposed in at least a portion of the first housing 210 and a second rear cover (e.g., the second rear cover 223 in FIG. 3) disposed in at least a portion of the second housing 220. In this case, the first rear cover 213 and the second rear cover 223 may be integrally formed with the side members 211 and 221, respectively. In some embodiments, the first rear cover 213 and the second rear cover 223 may be separately disposed on the first support member 212 and the second support member 213, respectively. According to an embodiment, the first rear cover 213 and/or the second rear cover 223 may be formed of a polymer, coated or colored glass, ceramic, or a metal (e.g., aluminum, stainless steel (STS), or magnesium), or a combination of two or more of these materials. In some embodiments, the first rear cover 213 and the second rear cover 223 may extend to at least a portion of the side member 211 and at least a portion of the side member 221, respectively. In some embodiments, at least a portion of the first support member 212 may be replaced with the first rear cover 213, and at least a portion of the second support member 222 may be replaced with the second rear cover 223.

According to various embodiments, the electronic device 200 may include a flexible display 230 disposed to be supported by at least a portion of the first housing 210 and at least a portion of the second housing 220. According to an embodiment, the flexible display 230 may include a first portion 230a (e.g., a flat portion) that is always visible from the outside, and a second portion 230b (e.g., a bendable portion) extending from the first portion 230a and at least partially slid into the internal space of the second housing 220 (e.g., the first space 2201 in FIG. 5) so as to be invisible from the outside in the slide-in state. According to an embodiment, the first portion 230a may be disposed so as to be supported by the first housing 210, and the second portion 230b may be disposed so as to be at least partially supported by the bendable member (e.g., the bendable member 240 in FIG. 5). According to an embodiment, in the state in which the second housing 220 is slid out along a predetermined first direction (direction ①), the flexible display 230 may extend from the first portion 230a while being supported by the bendable member (e.g., the bendable member 240 in FIG. 5), may form substantially the same plane as the first portion 230a, and may be disposed to be visible from the outside. According to an embodiment, in the state in which the second housing 220 is lid in along a predetermined second direction (−X axis direction), the second portion 230b of the flexible display 230 may be slid into the internal space of the second housing 220 (e.g., the second space 2201 in FIG. 5), and may be disposed so as to be invisible from the outside. Accordingly, in the electronic device 200, as the second housing 220 moves in a sliding manner along a predetermined direction from the first housing 210, the display area of the flexible display 230 may be variable.

According to various embodiments, the first housing 210 and the second housing 220 may be operated with respect to each other in a sliding manner such that the entire width is variable. According to an embodiment, the electronic device 200 may be configured to have a first width W1 from the second side surface 2112 to the fourth side surface 2212 in the slide-in state. According to an embodiment, the electronic device 200 may be configured such that, in the slide-out state, a portion of the bendable member (e.g., the bendable member 240 in FIG. 5) slid into the internal space of the second housing 210 (e.g., the second space 2201 in FIG. 5) is moved so as to have an additional second width W2, whereby the electronic device 200 has a third width W3 that is greater than the first width W1. For example, in the slide-in state, the flexible display 230 may have a display area substantially corresponding to the first width W1, and in the slide-out state, the flexible display 230 may have an expanded display area substantially corresponding to the third width W3.

According to various embodiments, the slide-out operation of the electronic device 200 may be performed through a user's manipulation. For example, the second housing 220 may be slid out in the predetermined first direction (e.g., direction ①) through the manipulation of a locking mechanism or locker 270 exposed through the rear surface 200b of the electronic device. In this case, the locker 270 may be disposed on the first housing 210, and the second housing 220 may be regulated such that the second housing 220, which is always pressed in the slide-out direction (e.g., direction ①) by a support assembly (e.g., the support assembly 260 in FIG. 4) to be described later, is maintained in the slide-in state. In some embodiments, the electronic device 200 may be shifted from the slide-in state to the slide-out state through the user's manipulation that presses the outer surface of the flexible display 230 in the predetermined first direction (direction ①). In some embodiments, the second housing 220 may be automatically operated by a drive mechanism (e.g., a drive motor, a reduction module, and/or a gear assembly) disposed in the internal space of the first housing 210 (e.g., the first space 2101 in FIG. 5) and/or the internal space of the second housing 220 (e.g., the second space 2201 in FIG. 5). According to an embodiment, the electronic device 200 may be set to control the operation of the second housing 220 via the drive mechanism when an event for shifting between the slide-in state and the slide-out state of the electronic device is detected via a processor (e.g., the processor 120 in FIG. 1). In some embodiments, the processor of the electronic device 200 (e.g., the processor 120 in FIG. 1) may control the flexible display 230 to display an object in various ways and execute an application in response to the display area of the flexible display 230 changed according to the slide-in state, the slide-out state, or the intermediate state (e.g., including a free stop state).

Figure 5:
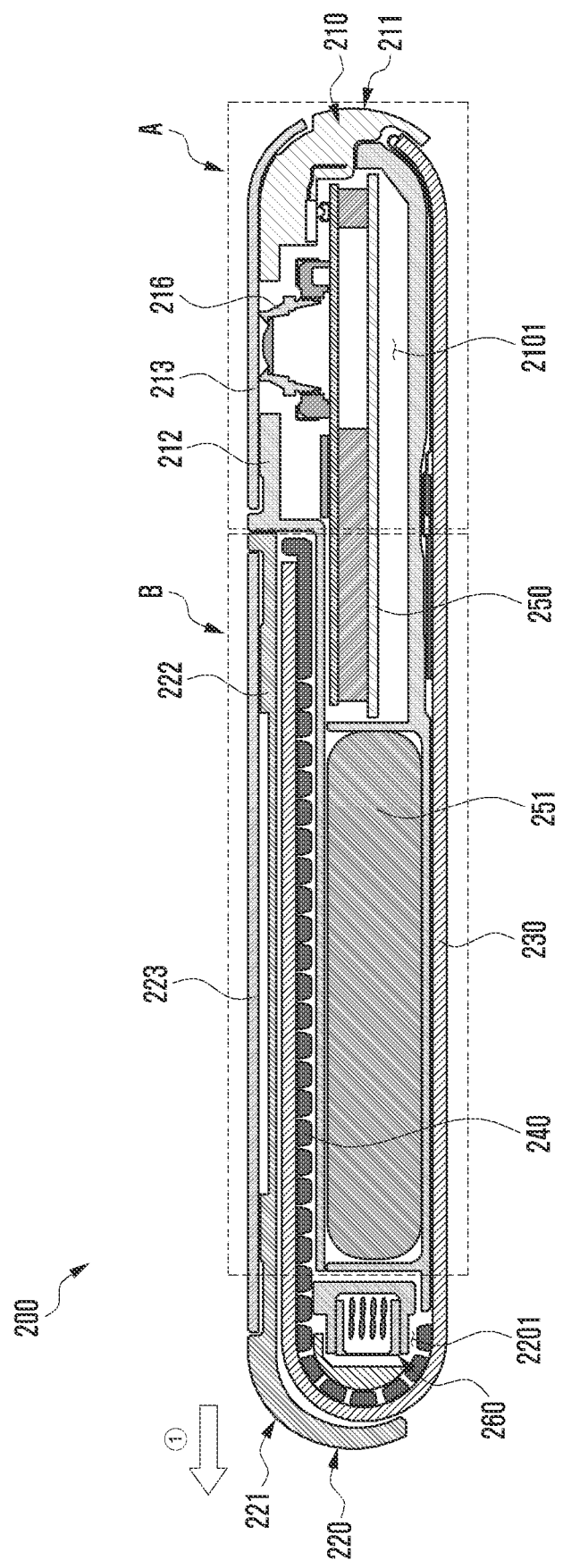
FIG. 5 is a cross-sectional view of the electronic device according to various embodiments taken along line 5-5 in FIG. 3A according to an embodiment of the disclosure.

According to various embodiments, the electronic device 200 may include at least one of an input device 203, sound output devices 206 and 207, sensor modules 204 and 217, camera modules 205 and 216, a connector port 208, a key input device (not illustrated), or an indicator (not illustrated) disposed in the first space of the first housing 210 (e.g., the first space 2101 in FIG. 5). In another embodiment, the electronic device 200 may be configured such that at least one of the above-mentioned components is omitted or other components are additionally included.

According to various embodiments, the input device 203 may include a microphone. In some embodiments, the input device 203 may include multiple microphones 203 arranged to sense the direction of sound. The sound output devices 206 and 207 may include speakers. The sound output devices 206 and 207 may include a call receiver 206 and an external speaker 207. According to an embodiment, in the slide-out state, the external speaker 207 may face the outside through a first speaker hole 207a disposed in the first housing 210. According to an embodiment, in the slide-in state, the external speaker 207 may face the outside through the first speaker hole 207a and a second speaker hole 207b disposed in the second housing 220 to correspond to the first speaker hole 207a. According to an embodiment, in the slide-out state, the connector port 208 may face the outside through a connector port hole 208a disposed in the first housing 210. According to an embodiment, in the slide-in state, the connector port 208 may be covered by the second housing 220 so as to be invisible from the outside. In some embodiments, even in the slide-in state, the connector port 208 may face the outside through another connector port hole disposed in the second housing 220 so as to correspond to the connector port hole 208a. In some embodiments, the sound output device 206 may include a speaker that is operated without a separate speaker hole (e.g., a piezo speaker).

According to various embodiments, the sensor modules 204 and 217 may generate an electrical signal or a data value corresponding to the internal operating state of the electronic device 200 or an external environmental state. The sensor modules 204 and 217 may include, for example, a first sensor module 204 (e.g., a proximity sensor or an illuminance sensor) disposed on the front surface 200a of the electronic device 200 and/or a second sensor module 217 (e.g., a heart rate monitoring (HRM) sensor) disposed on the rear surface 200b. According to an embodiment, the first sensor module 204 may be disposed under the flexible display 230 in the front surface 220a of the electronic device 200. According to an embodiment, the first sensor module 204 and/or the second sensor module 217 may include at least one of a proximity sensor, an illuminance sensor, a time of flight (TOF) sensor, an ultrasonic sensor, a fingerprint recognition sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, or a humidity sensor.

According to various embodiments, the camera modules 205 and 216 may include a first camera module 205 disposed on the front surface 200a of the electronic device 200 and a second camera module 216 disposed on the rear surface 200b. According to an embodiment, the electronic device 200 may include a flash 218 disposed in the vicinity of the second camera module 216. According to an embodiment, the camera modules 205 and 216 may include one or more lenses, an image sensor, and/or an image signal processor. According to an embodiment, the first camera module 205 may be disposed under the flexible display 230, and may be configured to image an object through a portion of an active area of the flexible display 230. According to an embodiment, the flash 218 may include, for example, a light-emitting diode or a xenon lamp.

According to various embodiments, the first camera module 205 among the camera modules 205 and 216 and the sensor module 204 among the sensor modules 204 and 217 may be disposed so as to the external environment through the flexible display 230. For example, the first camera module 205 or the sensor module 204 may be disposed in the internal space of the electronic device 200 to be in contact with the external environment through a transmission area or an opening perforated in the flexible display 230. According to an embodiment, the area of the flexible display 230, which faces the first camera module 205, may be formed as a transmission area having a predetermined transmittance as a portion of a content display area. According to an embodiment, the transmission area may have a transmittance in the range of about 5% to about 20%. The transmission area may include an area overlapping the effective area (e.g., the view angle area) of the first camera module 205 through which light imaged by an image sensor to generate an image passes. For example, the transmission area of the flexible display 230 may include an area having a lower pixel density and/or a lower wiring density than the surrounding area. For example, the transmission area may replace the above-mentioned opening. For example, the first camera module 205 may include an under display camera (UDC). In some embodiments, the sensor module 204 may be disposed to perform the function thereof without being visually exposed through the flexible display 230 in the internal space of the electronic device 200.

Figure 4:
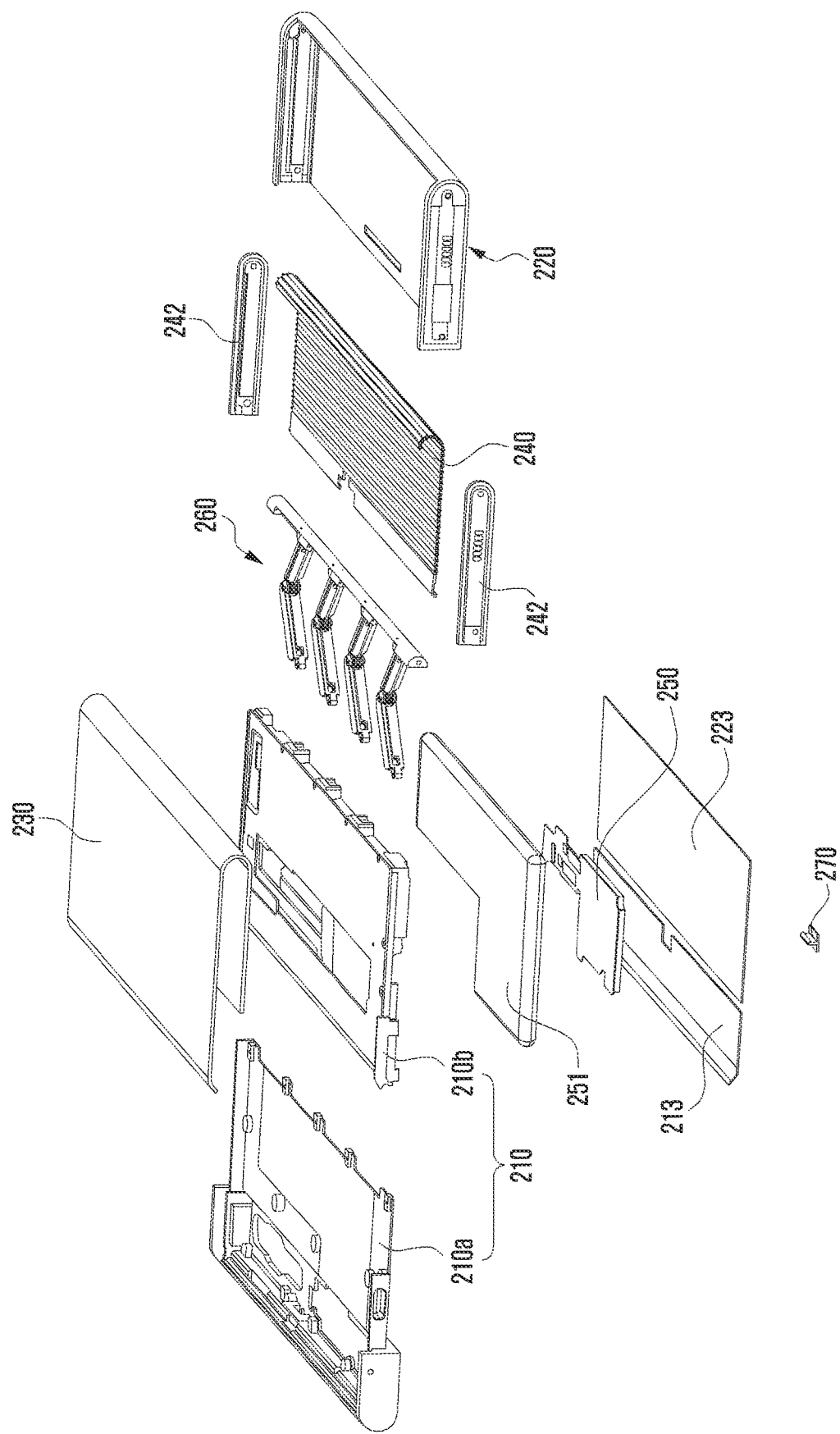
FIG. 4 is an exploded perspective view of an electronic device according to an embodiment of the disclosure.

FIG. 4 is an exploded perspective view of an electronic device according to an embodiment of the disclosure.

Referring to FIG. 4, the electronic device 200 may include a first housing 210 including a first space (e.g., the first space 2101 in FIG. 5), a second housing 220 slidably coupled to the first housing 210 and including a second space (e.g., the second space 2201 in FIG. 5), a bendable member 240 disposed in the second space (e.g., the second space 2201 in FIG. 5) to be at least partially rotatable, and a flexible display 230 disposed so as to be supported on at least a portion of the bendable member 240 and the first housing 210. According to an embodiment, the first space of the first housing 210 (e.g., the first space 2201 in FIG. 5) may be provided through the coupling of the first bracket housing 210a and the second bracket housing 210b. In some embodiments, at least a portion of the first bracket housing 210a may include a first support member (e.g., the first support member 212 in FIG. 3B), or may be replaced by the first support member 212. According to an embodiment, the electronic device 200 may include a main board 250 disposed in the first space (e.g., the first space 2201 in FIG. 5). According to an embodiment, the electronic device 200 may include a camera module (e.g., the camera module 216 in FIG. 3A) disposed on the board 250 or a sensor module (e.g., the sensor module 217 in FIG. 3A) in the first space (e.g., the first space 2101 in FIG. 5). According to an embodiment, one end of the bendable member 240 may be fixed to the first housing 210 and the other end may be disposed so as to be at least partially rotatably accommodated in the second space of the second housing 220 (e.g., the second space 2201 in FIG. 5). For example, in the slide-in state, the bendable member 240 may be at least partially accommodated in the second space (e.g., the second space 2201 in FIG. 5), and in the slide-out state, the bendable member 240 may be at least partially slid out from the second space (e.g., the second space 2201 in FIG. 5) to form substantially the same plane as the first housing 210. Accordingly, the display area of the flexible display 230 supported by the first housing 210 and the bendable member 240 may vary according to the sliding operation. According to an embodiment, the electronic device 200 may further include guide rails 242 disposed on the side surfaces of the coupled first and second bracket housings 210a and 210b to be guided into the internal space of the second housing 220 (e.g., the second space 2201 in FIG. 5). In some embodiments, the electronic device 200 may further include a cover member (not illustrated) disposed so as to cover both sides of the second support member of the second housing 220 (e.g., the second support member 222 in FIG. 3B).

According to various embodiments, the electronic device 200 may include a support assembly 260 disposed so as to face the second space (e.g., the second space 2201 in FIG. 5) from the first housing 210 and pressing the second housing 220 in the slide-out direction. According to an embodiment, the support assembly 260 may reduce sagging of the flexible display 230 by supporting the bendable member 240 during operation. According to an embodiment, the support assembly 260 may be fixed to the first housing 210, and may guide the second housing 220 in the slide-out direction by pressing the rear surface of the bendable member 240. According to an embodiment, the electronic device 200 may include a locker 270 for maintaining the electronic device 200 in the slide-in state while regulating the pressing force applied by the support assembly 260. According to an embodiment, the locker 270 may be disposed so as to be movable in the first housing 210, and may regulate the movement of the second housing 220 in the slide-out direction from the slide-in state.

FIG. 5 is a cross-sectional view of the electronic device taken along line 5-5 in FIG. 3A according to an embodiment of the disclosure.

Referring to FIG. 5, the electronic device 200 may include a first housing 210 having a first space 2101, a second housing 220 having a second space 2201, a bendable member 240 connected to the first housing and at least partially accommodated in the second space 2201 in the slide-in state, a flexible display 230 disposed so as to be supported by at least a portion of the bendable member 240 and at least a portion of the first housing 210, and a support assembly 260 disposed in the first housing 210 and pressing the second housing 220 in the slide-out direction (direction ①). According to an embodiment, the electronic device 200 may include multiple electronic components therein. According to an embodiment, the multiple electronic components may be disposed in the first space 2101 of the first housing 210. According to an embodiment, the first space 2101 may include a first sub-space A having a first space volume and a second sub-space B connected to the first sub-space A and having a second space volume that is smaller than the first space volume. According to an embodiment, the second sub-space B may include a space corresponding to an area in which a portion of the first housing 210 overlaps a portion of the second housing 220 when the electronic device is in the slide-in state.

According to various embodiments, first electronic components that require a relatively large mounting space among the multiple electronic components, require a relatively large mounting height in the electronic device 200, or have to operate while avoiding the overlapping structure of the two housings 210 and 220 may be disposed in the first sub-space A. According to an embodiment, the first electronic components may include a camera module 216, a sensor module (e.g., the sensor module 217 in FIG. 3B), or a flash (e.g., the flash 218 in FIG. 3B). In this case, at least some of the first electronic components may be disposed to face the external environment through the first support member 212 and/or the first rear cover 213. According to an embodiment, second electronic components that require a relatively small mounting space among the multiple electronic components, require a relatively small mounting height in the electronic device 200, or are capable of operating regardless of the overlapping structure of the two housings 210 and 220 may be disposed in the second sub-space B. According to an embodiment, the second electronic components may include a main board 250 and/or a battery 251. In some embodiments, when the first sub-space A and the second sub-space B are connected to each other, some of the multiple electronic components (e.g., the main board 250 or a flexible printed circuit board (FPCB)) may be disposed together in the two sub-spaces.

According to various embodiments, in the electronic device 200, electronic components may be disposed to correspond to the sub-spaces A and B having different space volumes in the first space 2101 of the first housing 210. Thus, an efficient arrangement structure may be helpful for slimming down the electronic device 200 and improving the performance of the electronic device 200. In addition, the coupling structure of the first housing 210 and the second housing 220 and/or the coupling structure of the support assembly 260 for pressing the second housing 220 to the slide-out state may provide a support function for an external force in the slide-out state.

Figure 6A:
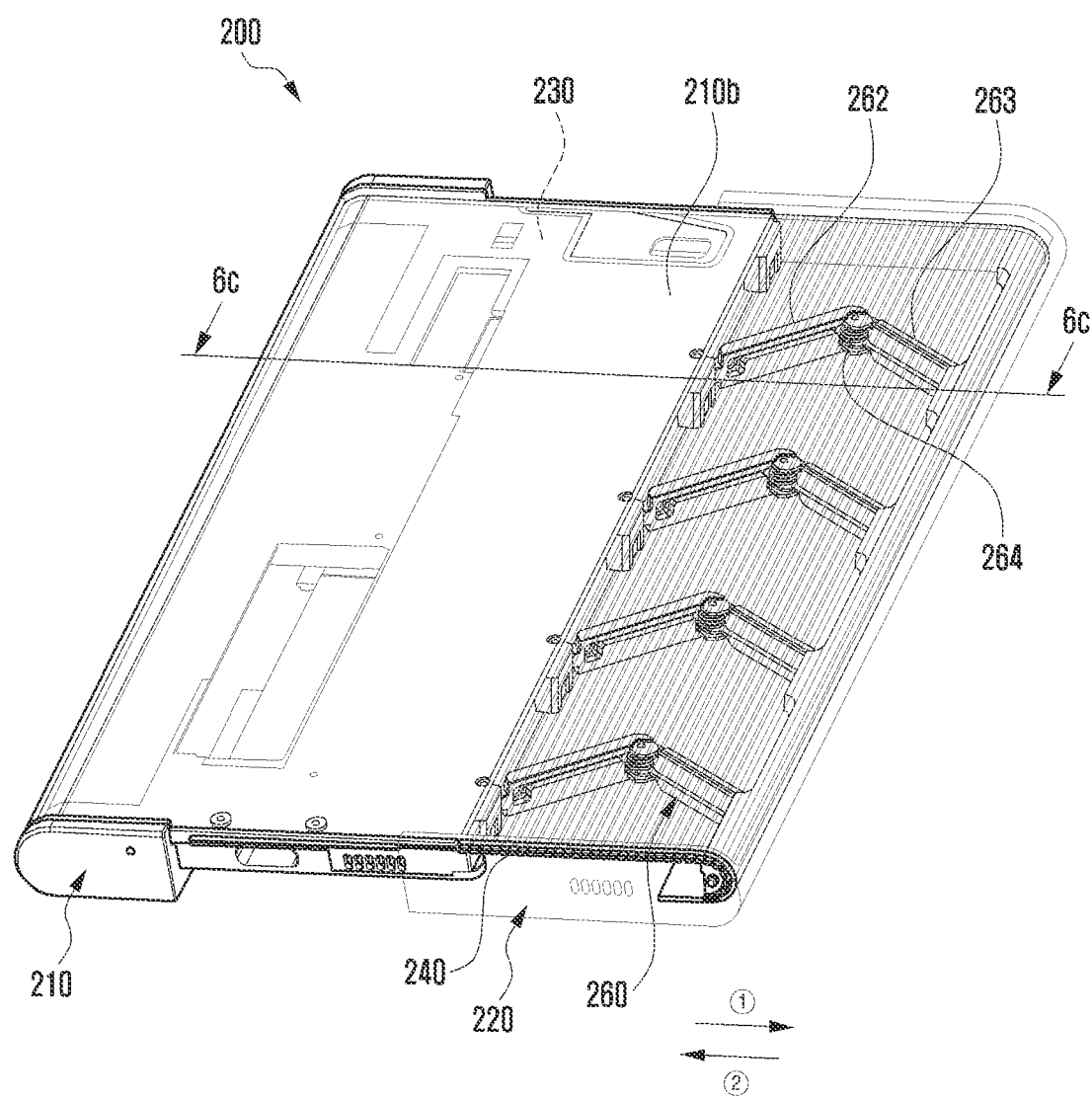
FIG. 6A is a view illustrating the configuration of an electronic device including a support assembly according to an embodiment of the disclosure.

FIG. 6A is a view illustrating the configuration of an electronic device including a support assembly according to an embodiment of the disclosure.

Figure 6B:
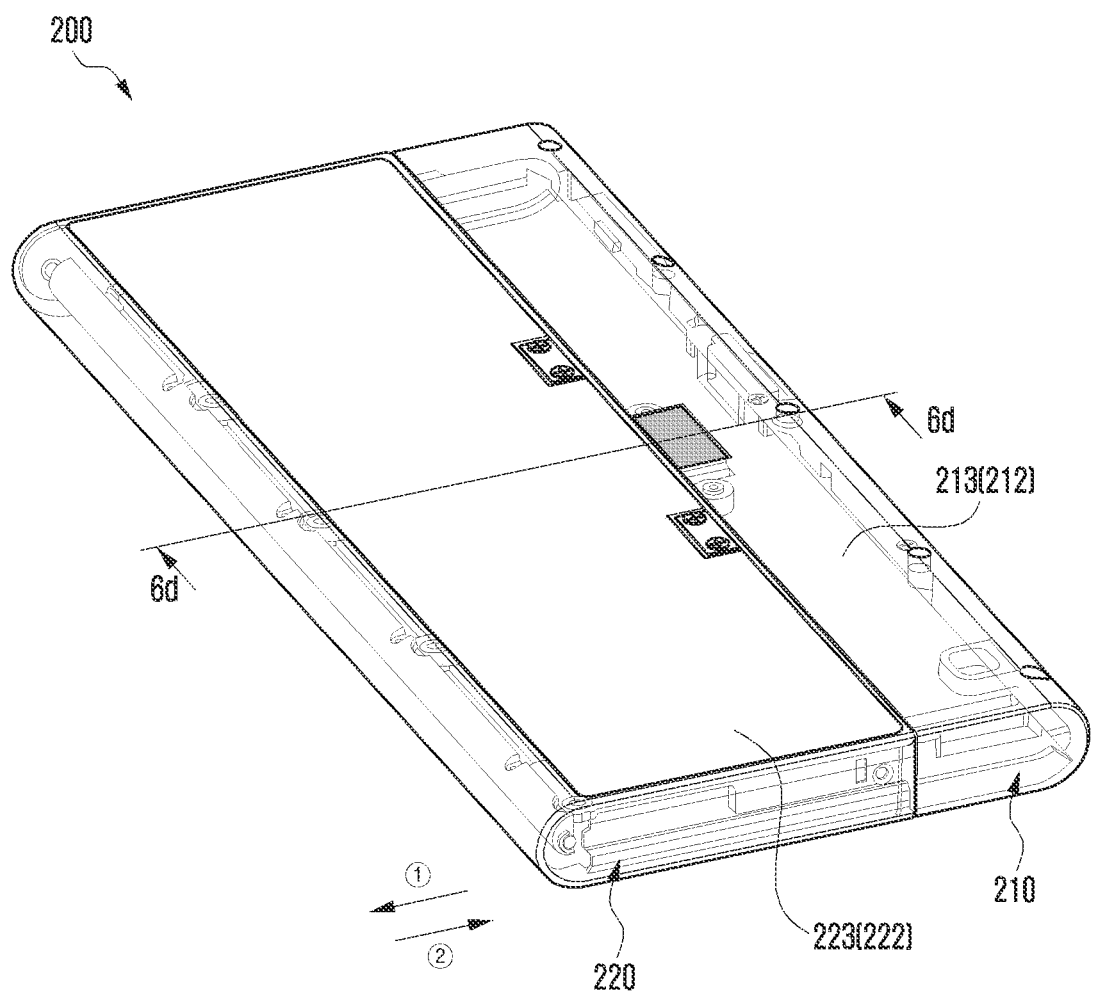
FIG. 6B is a rear side perspective view of an electronic device, illustrating an arrangement configuration of a locker according to an embodiment of the disclosure.

FIG. 6B is a rear side perspective view of an electronic device, illustrating the arrangement configuration of a locker according to an embodiment of the disclosure.

Figure 6C:
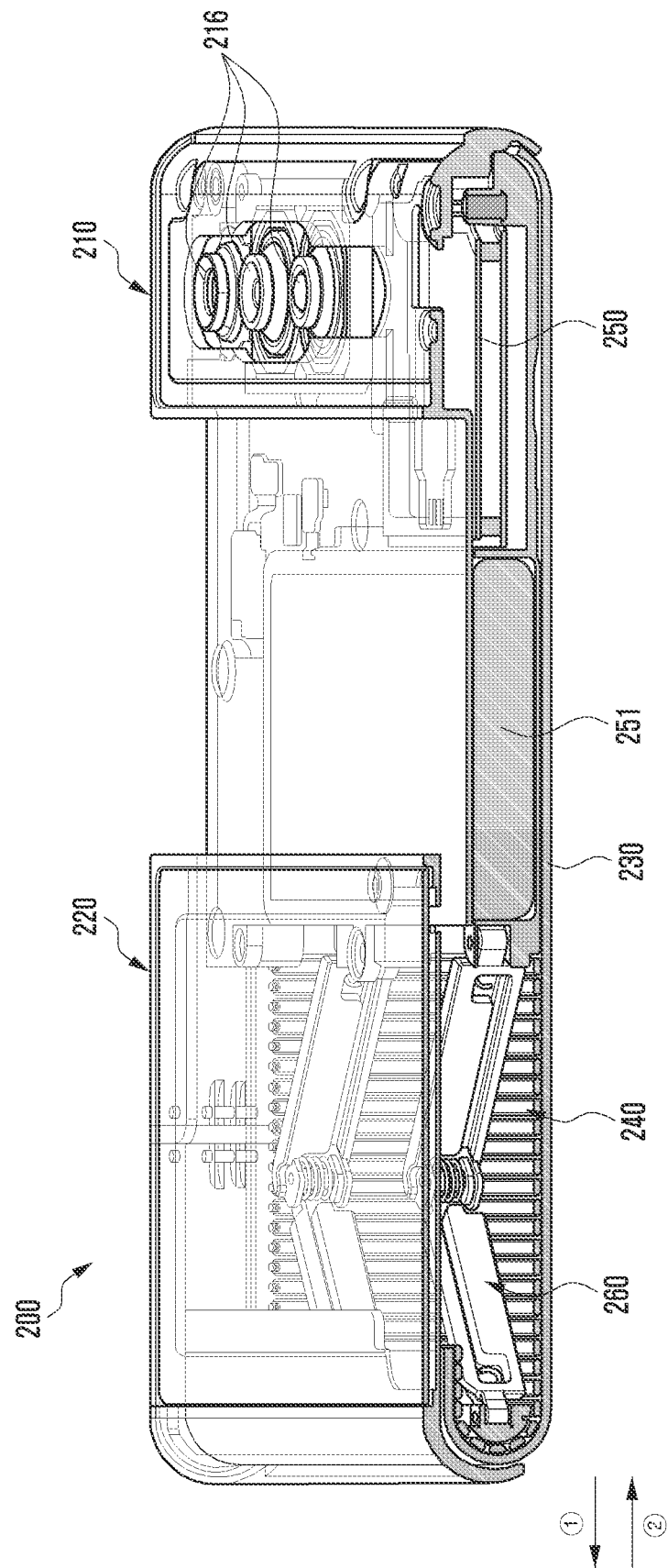
FIG. 6C is a cross-sectional view of the electronic device taken along line 6c-6c in FIG. 6A according to an embodiment of the disclosure.

FIG. 6C is a cross-sectional view of the electronic device, taken along line 6c-6c in FIG. 6A according to an embodiment of the disclosure.

Referring to FIGS. 6A to 6C, the electronic device 200 may include a support assembly 260 fixed to the first housing 210 and disposed so as to be physically expandable toward the second space 2201. According to an embodiment, the support assembly 260 may be fixed to an end of the second bracket housing 210b of the first housing 210, and may be disposed so as to press the bendable member 240 via multiple links (e.g., the first link 262 and the second link 263 in FIG. 8A) that operate to be expandable via an elastic member (e.g., the elastic member 264 in FIG. 8A) and a pressing member (e.g., the pressing member 265 in FIG. 7). In this case, by being disposed so as to be at least partially in contact with the rear surface of the bendable member 240, the multiple links 262 and 263 are capable of preventing the flexible display 230 from sagging into the second space 2201 during the shifting from the slide-in state to the slide-out state and capable of always maintaining the flat surface of the flexible display 230, thereby helping to improve the surface quality of the flexible display 230. In addition, the coupling structure of the support assembly 260 that presses the second housing 220 in the slide-out state may provide a support function for an external force in the slide-out state.

Figure 6D:
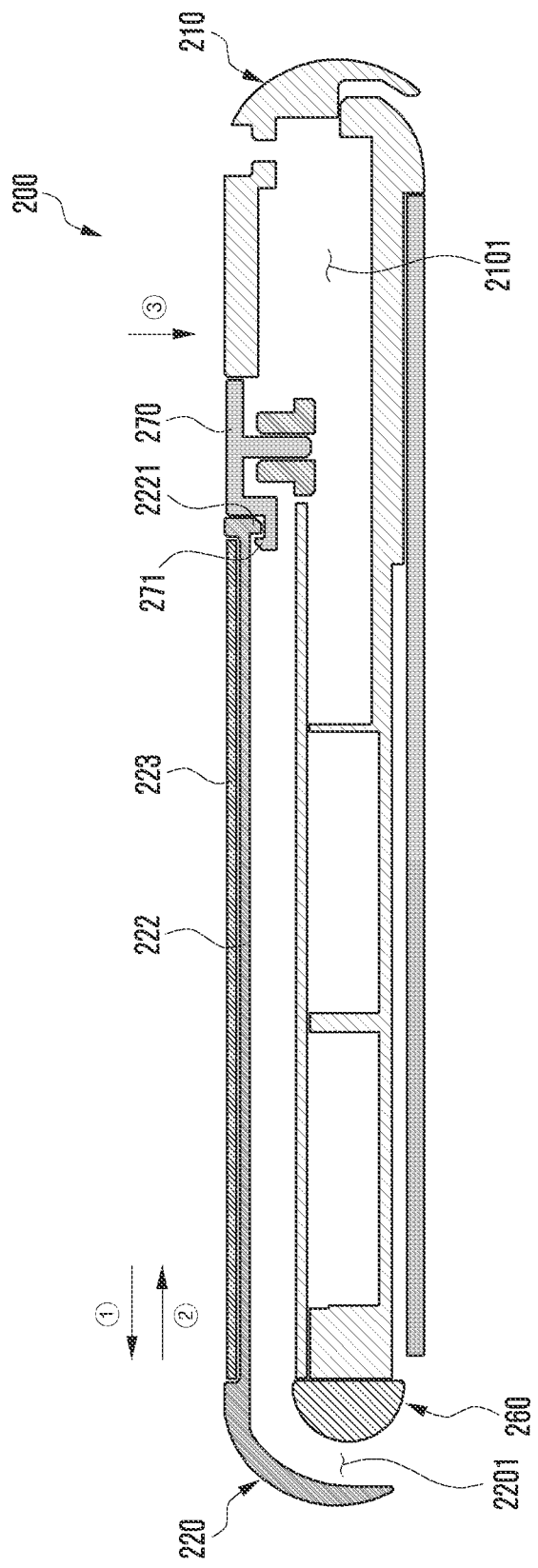
FIG. 6D is a cross-sectional view of the electronic device taken along line 6d-6d in FIG. 6B according to an embodiment of the disclosure.

FIG. 6D is a cross-sectional view of the electronic device taken along line 6d-6d in FIG. 6B according to an embodiment of the disclosure.

Referring to FIG. 6D, the electronic device 200 may be induced to maintain the slide-out state via the pressing structure of the bendable member 240 by the support assembly 260. Accordingly, the electronic device 200 may include a regulation structure for continuously maintaining the slide-in state while holding the pressing force by the support assembly 260. According to an embodiment, as the regulation structure, the electronic device 200 may include a locker 270 disposed in the first housing 210 to be movable, and an engagement step 2221 provided in the second housing 220 so as to be engaged with the locker 270. According to an embodiment, the locker 270 may be pressed from the rear surface of the first housing 210 (e.g., the rear surface 200b in FIG. 2B) in a third direction (direction ③) perpendicular to a first direction in which the second housing 220 is slid out (direction ①) and a second direction in which the second housing 220 is slid in (direction ②). According to an embodiment, the locker 270 may include a hooking structure 271 formed at an end thereof. Accordingly, in the electronic device 200, by causing the hooking structure 271 of the locker 270 to be engaged with the engagement step 2221 of the second housing 220 while the pressing force applied in the first direction (direction ①) via the support assembly 260 is maintained, the slide-in state can be continuously maintained. According to an embodiment, when the locker 270 is pressed in the third direction (direction ③) through the user's manipulation, the engagement step 2221 is released from the hooking structure 271, and the second housing 220 moves in the first direction (direction ①) by the pressing force of the support assembly 260, the electronic device 200 may be shifted to the slide-out state.

Figure 7A:
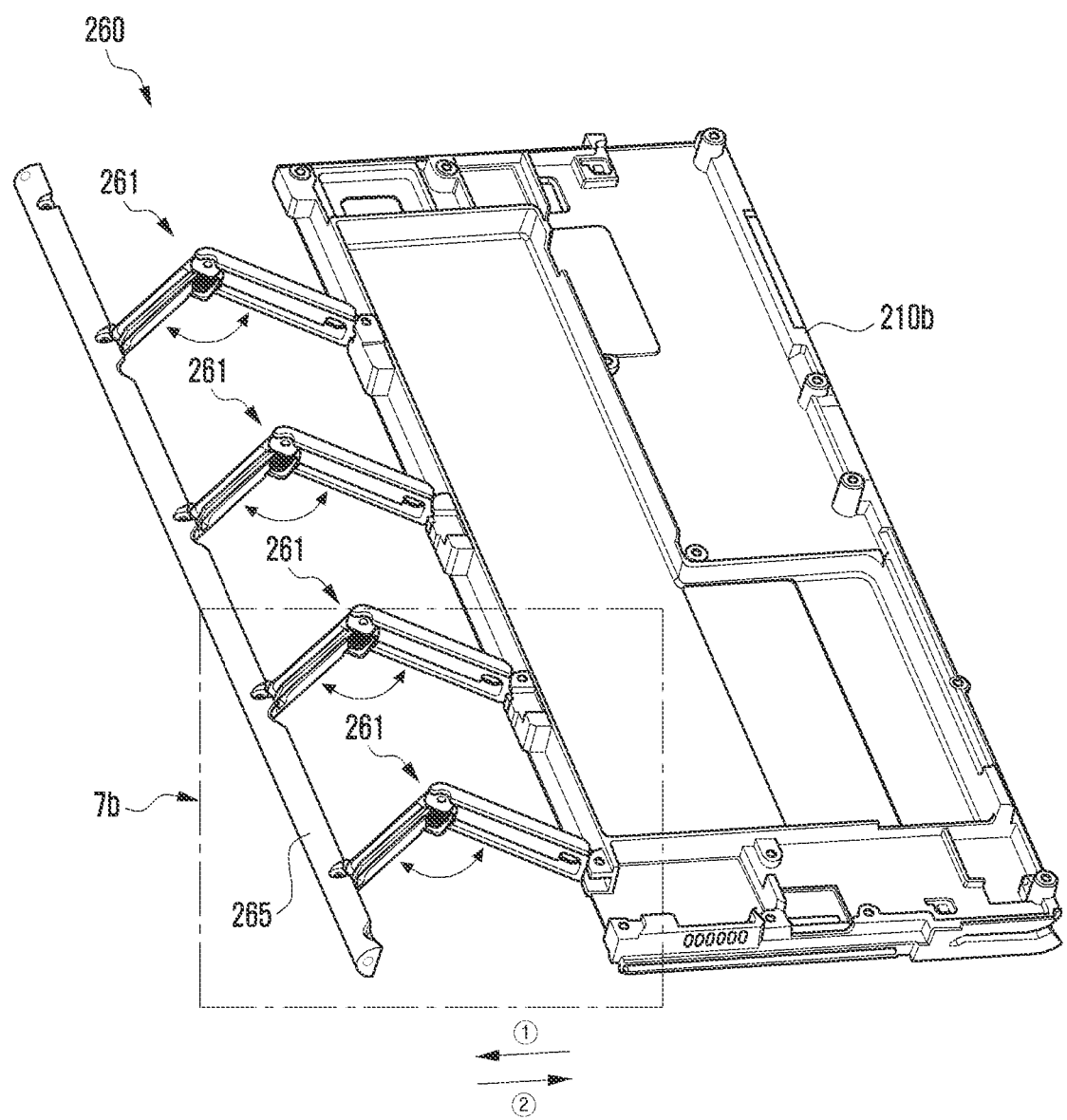
FIG. 7A is a perspective view illustrating the state in which a support assembly is coupled to a bracket housing according to an embodiment of the disclosure.

FIG. 7A is a perspective view illustrating the state in which a support assembly is coupled to a bracket housing according to an embodiment of the disclosure.

Figure 7B:
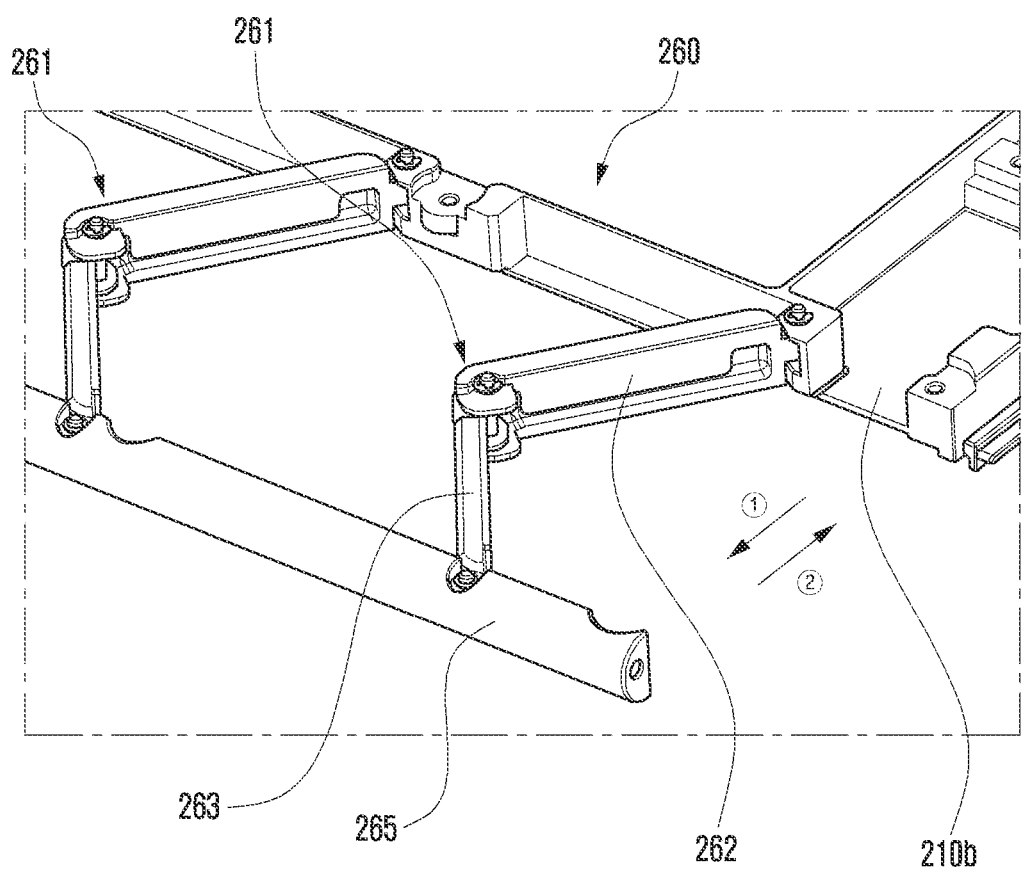
FIG. 7B is an enlarged view of the area 7b in FIG. 7A according to an embodiment of the disclosure.

FIG. 7B is an enlarged view of the area 7b in FIG. 7A according to an embodiment of the disclosure.

Referring to FIGS. 7A and 7B, the support assembly 260 may include one or more support structures 261 movably fixed to the second bracket housing 210b and pressed in the direction in which the second housing 220 is slid out (direction ①), and a pressing member 265 movably fixed to the one or more support structures 261 and configured to press a bendable member (e.g., the bendable member 240 in FIG. 6A) in a contact manner According to an embodiment, multiple support structures 261 may be disposed at predetermined intervals in the first bracket housing 210b. In some embodiments, the multiple support structures 261 may be configured to at least partially have different shapes and/or functions. In some embodiments, the multiple support structures 261 may be disposed at substantially the regular or irregular intervals. According to an embodiment, the pressing member 265 may be simultaneously connected to the multiple support structures 261. According to an embodiment, the pressing member 265 may be disposed to press the bent portion of the bendable member 240 in the second space (e.g., the second space 2201 in FIG. 5). Accordingly, the pressing member 265 may have a curved surface that is brought into contact with the rear surface of the bendable member 240. According to an embodiment, the pressing member may be formed of a metal material and/or a polymer. In some embodiments, the pressing member 265 may include rollers movably coupled to the multiple support structures 261, respectively.

According to various embodiments, at least one support structure 261 may include a first link 262 rotatably coupled to the first bracket housing 210b, and a second link 263 rotatably coupled to the first link 262, and an elastic member (e.g., the elastic member 264 in FIG. 8A) that presses the first link 262 and the second link 263 in the unfolding direction. According to an embodiment, the pressing member 265 may be movably coupled to the second link 263. According to an embodiment, in the folded state (e.g., the slide-in state), the first link 262 and the second link 263 may be disposed so as to be close to or to be at least partially in contact with the second bracket housing 210b. According to an embodiment, in the unfolded state (e.g., the slide-out state), the first link 262 and the second link 263 may be unfolded from each other by a predetermined angle (e.g., the angle θ in FIG. 8A), and may expand from the second bracket housing 210b toward the second space (direction ①).

Figure 8A:
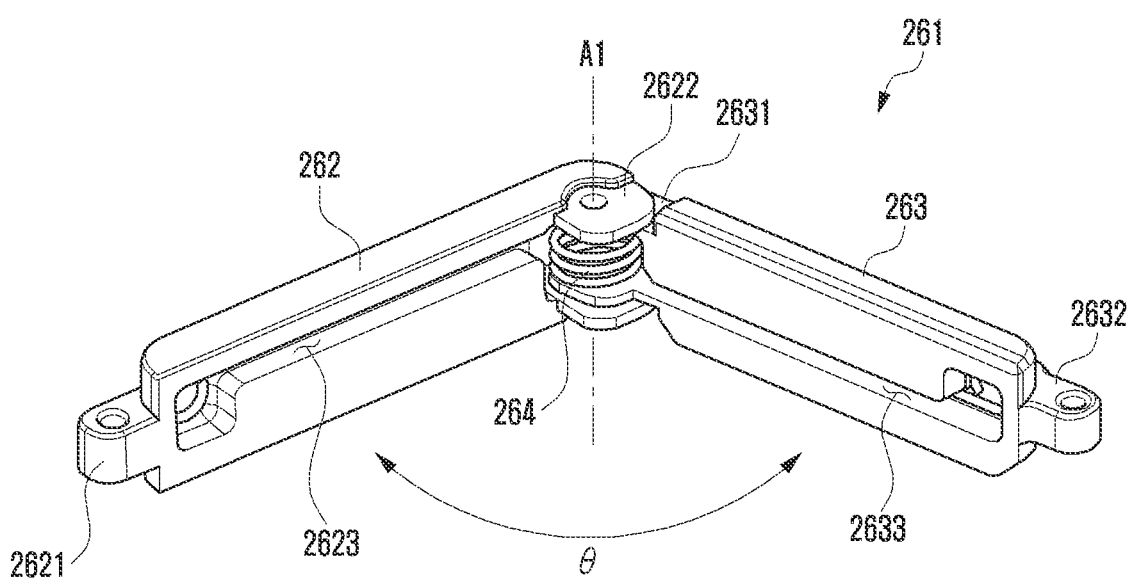
FIG. 8A is a perspective view illustrating a support structure in the state in which two links are unfolded by a predetermined angle according to an embodiment of the disclosure.

FIG. 8A is a perspective view illustrating a support structure in the state in which two links are unfolded by a predetermined angle according to an embodiment of the disclosure.

Figure 8B:
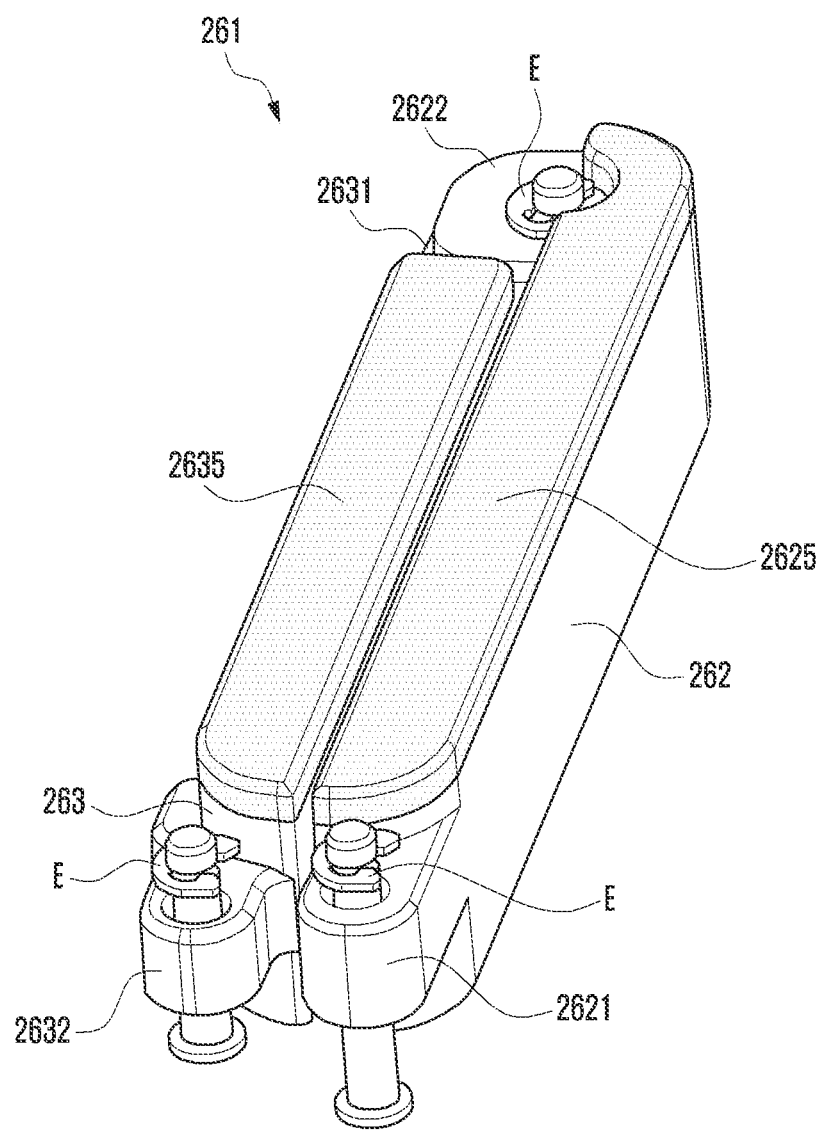
FIG. 8B is a perspective view illustrating a support structure in the state in which two links are folded according to an embodiment of the disclosure.

FIG. 8B is a perspective view illustrating a support structure in the state in which two links are folded according to an embodiment of the disclosure.

Figure 8C:
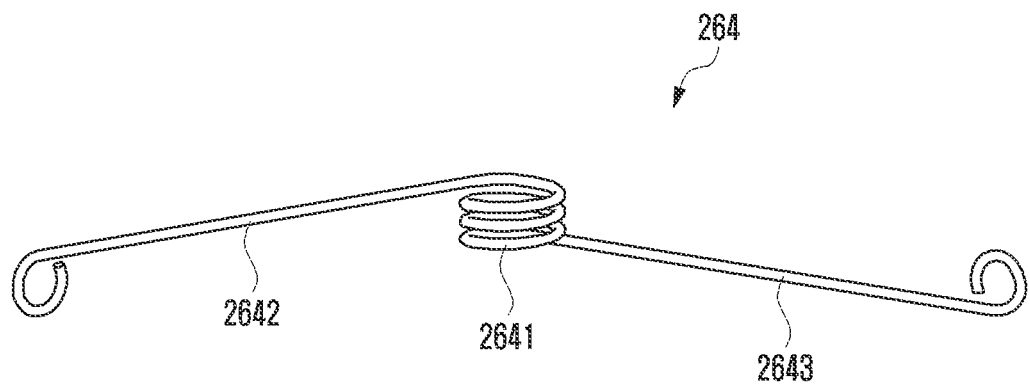
FIG. 8C is a perspective view illustrating an elastic member according to an embodiment of the disclosure.

FIG. 8C is a perspective view illustrating an elastic member according to an embodiment of the disclosure.

Referring to FIGS. 8A to 8C, the support structure 261 may include a first link 262 having a predetermined length and including a first hinge arm 2621 and a second hinge arm 2622 at opposite ends thereof, a second link 263 having a predetermined length and including a third hinge arm 2621 and a fourth hinge arm 2622 at opposite ends thereof, and an elastic member 264 disposed between the first link 262 and the second link 263 and configured to press the first link 262 and the second link 263 to unfold by a predetermined angle θ. According to an embodiment, the first hinge arm 2621 and the second hinge arm 2622 may be integrally formed with the first link 262. According to an embodiment, the third hinge arm 2631 and the fourth hinge arm 2632 may be integrally formed with the second link 263. According to an embodiment, the predetermined angle θ may be determined within a range of less than 180 degrees in order to induce a smooth folding operation of the first link 262 and the second link 263. According to an embodiment, the first link 262 and the second link 263 may be formed of a metal material and/or a polymer. According to an embodiment, the first link 262 may be disposed so as to rotatably couple the first hinge arm 2621 to the second bracket housing (e.g., the second bracket housing 210b in FIG. 7A), and the second link 263 may be disposed so as to rotatably couple the third hinge arm 2631 to the second hinge arm 2622. According to an embodiment, the pressing member (e.g., the pressing member 265 in FIG. 7A) may be rotatably coupled to the fourth hinge arm 2632 of the second link 263. Respective hinge arms 2621, 2622, 2631, and 2632 may be rotatably coupled via an E ring. According to an embodiment, the first link 262 and the second link 263 may include first friction reduction members 2625 and 2635, respectively, which are disposed on a portion that comes into contact with and support the bendable member 240. According to an embodiment, the first friction reduction members 2625 and 2635 may include at least one of a polyoxymethylene (POM) layer, an acetal layer, or a Teflon layer. Therefore, when the first link 262 and/or the second link 263 are in contact with the bendable member 240, friction with the bendable member 240 is reduced via the first friction reduction members 2625 and 2635, which may be helpful for performing a smooth sliding operation of the electronic device 200.

According to various embodiments, the elastic member 264 is a torsion spring, and may include a fixing portion 2641 fixed to a rotation axis A1 formed by the second hinge arm 2262 of the first link 262 and the third hinge arm 2631 of the second link 263, and a first free end 2642 and a second free end 243, which extend toward the first link 262 and the second link 263 from opposite ends of the fixing portion 2641, respectively. According to an embodiment, the first free end 2642 is accommodated in a first spring accommodation groove 2623 provided in the first link 262, the second free end 2643 is accommodated in a second spring accommodation groove 2633 provided in the second link 263, and the first and second free ends 2642 and 2643 are disposed so as not to protrude to the outside, which may be helpful for the operation of the links 262 and 263.

Figure 8D:
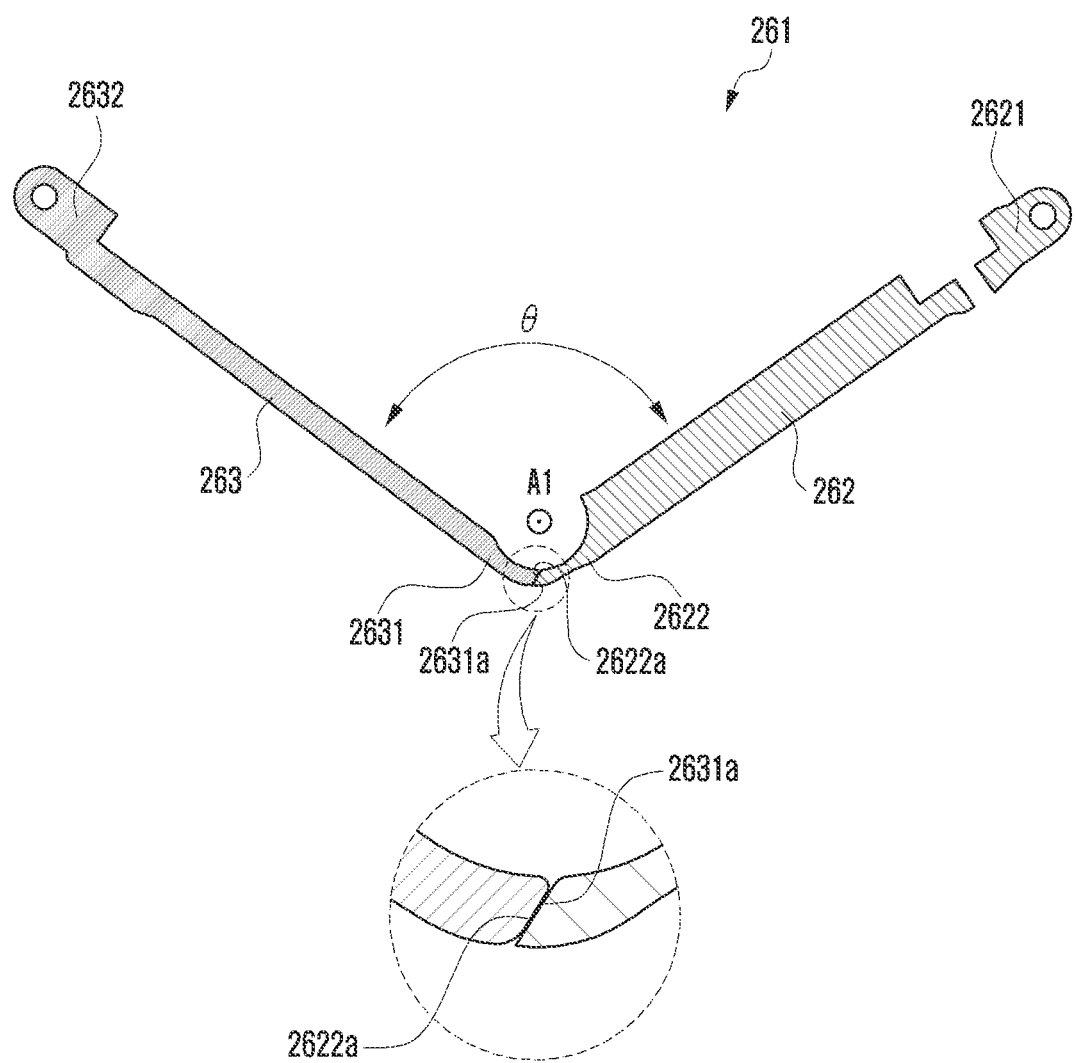
FIG. 8D is a schematic view of a support member, illustrating an angle regulation structure for regulating the unfolding angle between two links according to an embodiment of the disclosure.

FIG. 8D is a schematic view of a support member, illustrating an angle regulation structure for regulating the unfolding angle between two links according to an embodiment of the disclosure.

Referring to FIG. 8D, the support structure may include an angle regulation structure provided on the first link 262 and the second link 263 and configured to regulate the unfolding angle θ between the two links 262 and 263. According to an embodiment, the angle regulation structure may include a first engagement portion 2622a provided in the second hinge arm 2262 of the first link 262 and a second engagement portion 2631a provided in the third hinge arm 2631 of the second link 263. According to an embodiment, the first engagement portion 2262a and the second engagement portion 2631a may have shapes for determining the predetermined unfolding angle θ between the two links 262 and 263 about the rotation axis A1 by an elastic member 264. For example, the first link 262 and the second link 263 may be prevented from being further unfolded beyond the predetermined angle by the structure in which the first engagement portion 2622a and the second engagement portion 2631a are brought into contact with each other while the first link 262 and the second link 263 are unfolded from each other about the rotation axis A1 by the elastic member 264.

Figure 9:
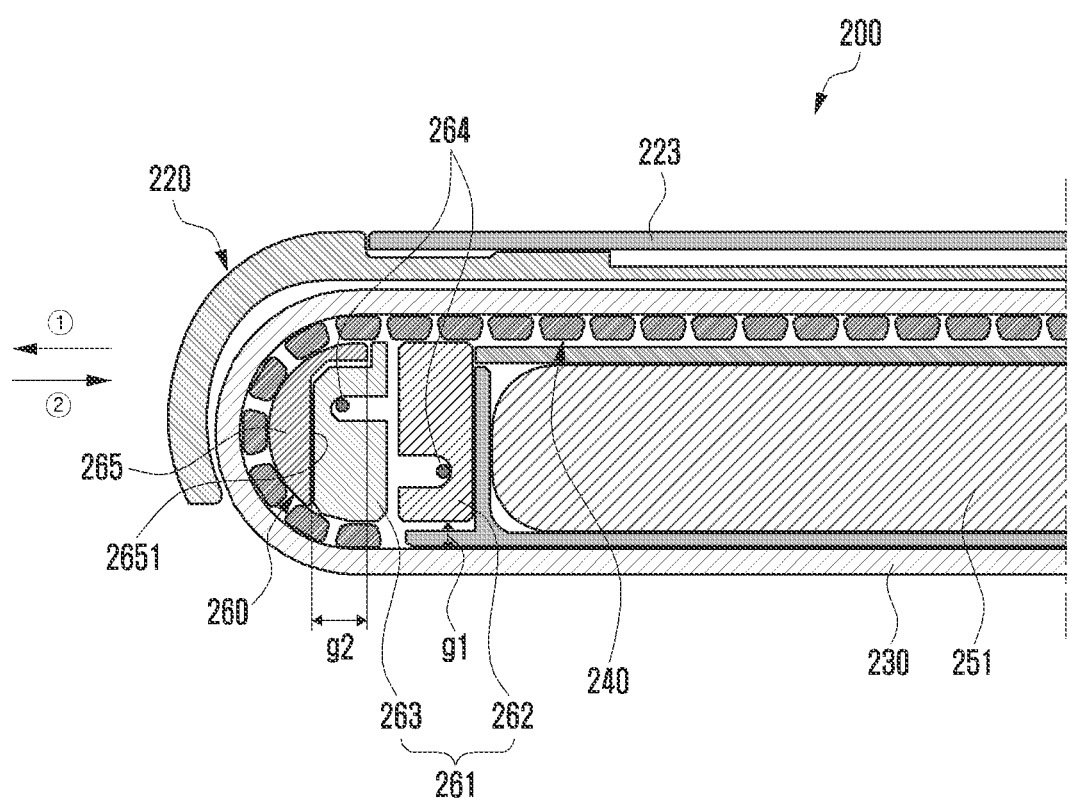
FIG. 9 is a cross-sectional view illustrating a portion of an electronic device including a support assembly in a slide-in state according to an embodiment of the disclosure.

FIG. 9 is a cross-sectional view illustrating a portion of an electronic device including a support assembly in a slide-in state according to an embodiment of the disclosure.

Referring to FIG. 9, the electronic device 200 may include an arrangement structure that is capable of being helpful for slimming down the electronic device 200 by reducing the volume of the support assembly 260 in the slide-in state. According to an embodiment, in the slide-out state, the first link 262 and the second link 263 may be arranged to have a gap g1 for accommodating the bendable member 240, which at least partially supports the flexible display 230. According to an embodiment, the gap g1 may include a space provided between the flexible display 230 and the links 262 and 263. According to an embodiment, the pressing member 265 may include a recess 2651 having a predetermined accommodation depth g2 provided at a corresponding position in order to accommodate at least a portion of the second link 263 folded to the first link 262 in the slide-in state. According to an embodiment, the electronic device 200 may be slimmed with the help of the accommodation structure of the second link 263 which is at least partially accommodated in the recess 2651 in the pressing member 265 in the slide-in state.

Figure 10A:
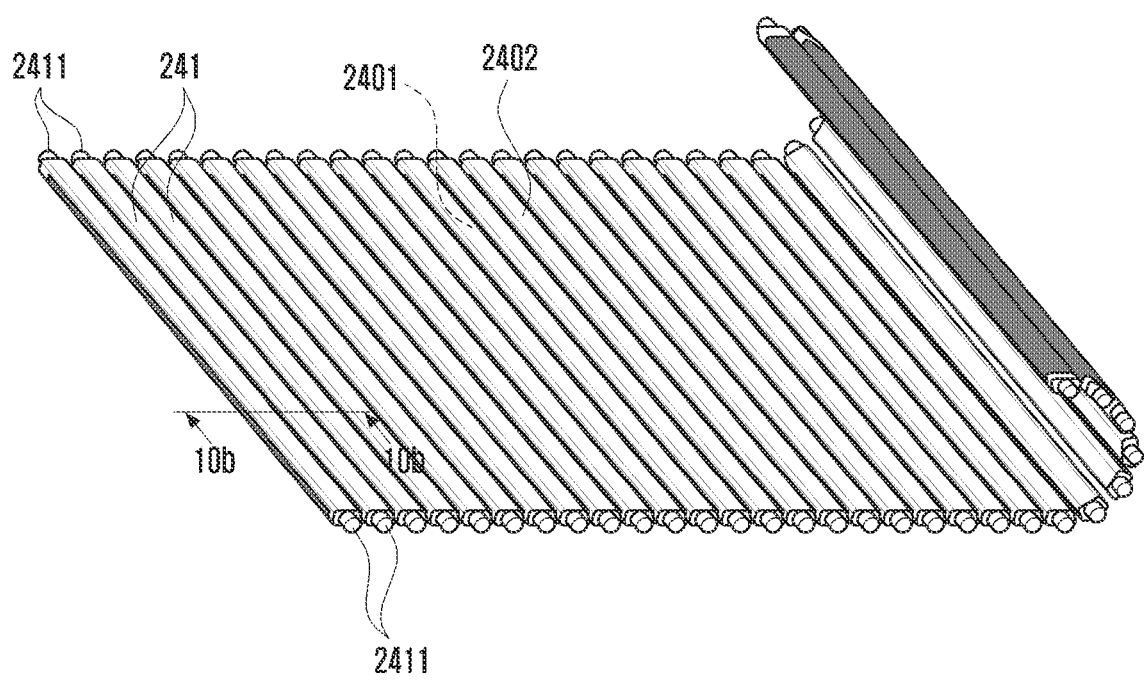
FIG. 10A is a perspective view illustrating a bendable member according to an embodiment of the disclosure.

FIG. 10A is a perspective view illustrating a bendable member according to an embodiment of the disclosure.

Figure 10B:
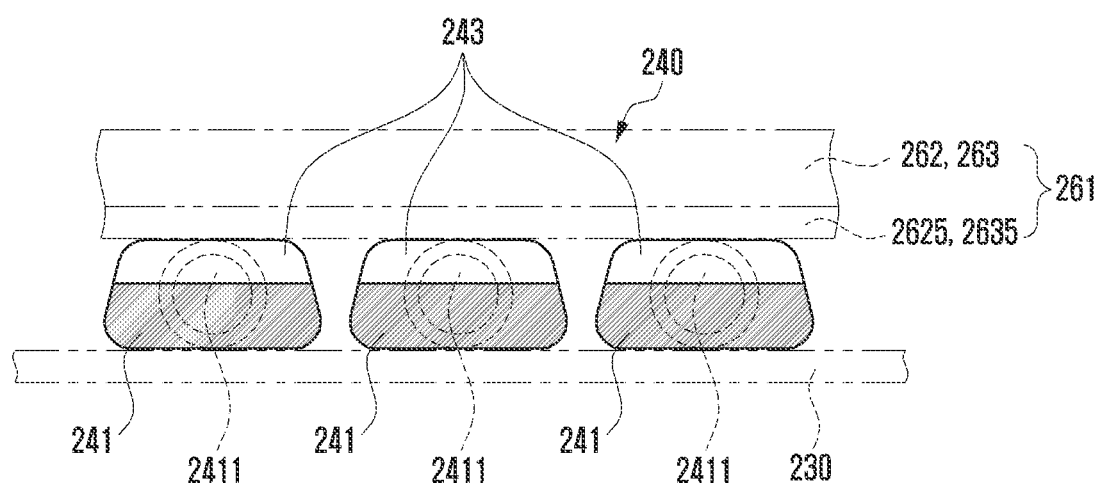
FIG. 10B is a partial cross-sectional view of a bendable member taken along line 10b-10b in FIG. 10A according to an embodiment of the disclosure.

FIG. 10B is a partial cross-sectional view of a bendable member taken along line 10b-10b in FIG. 10A according to an embodiment of the disclosure.

Referring to FIGS. 10A and 10B, the bendable member 240 may include multiple bars 241, which are rotatably connected to each other. According to an embodiment, the bendable member 240 may include a top surface 2401 by the multiple bars 241 and a rear surface 2402 facing away from the top surface 2401. According to an embodiment, the top surface 2401 may face a flexible display 230, and the rear surface 2402 may face the internal space of the electronic device 200 (e.g., the first internal space 2101 and/or the second internal space 2201 in FIG. 5). According to an embodiment, the multiple bars 241 may be formed of a metal material and/or a polymer. Each of the multiple bars 241 may include guide protrusions 2411 protruding at opposite ends thereof to be guided along a guide structure (e.g., the guide rails 242 in FIG. 4) disposed in the first housing 210 and/or the second housing 210 in the internal space of the electronic device 200.

According to various embodiments, each of the multiple bars 241 may include a second friction reduction structure 243. According to an embodiment, the second friction reduction structure 243 may be disposed on the rear surface 2402 of the bendable member 240, which faces the support structure 261 of the support assembly (e.g., the support assembly 260 in FIG. 7A). According to an embodiment, the second friction reduction structure 243 may also include at least one of a POM layer, an acetal layer, or a Teflon layer disposed on each of the multiple bars 241. Therefore, when the bendable member 240 is supported by the support structure 261 of the support assembly 260, the first friction reduction members 2625 and 2635 disposed on the first links (e.g., the first link 262 in FIG. 8B) and/or the second links (e.g., the second link 263 in FIG. 8B) and the second friction reduction structure 243 disposed on the bendable member 240 are brought into contact with each other, whereby the frictional resistance between the first links 262 and/or the second links 263 and the bendable member 240 according to the sliding operation can be reduced.

Figure 11:
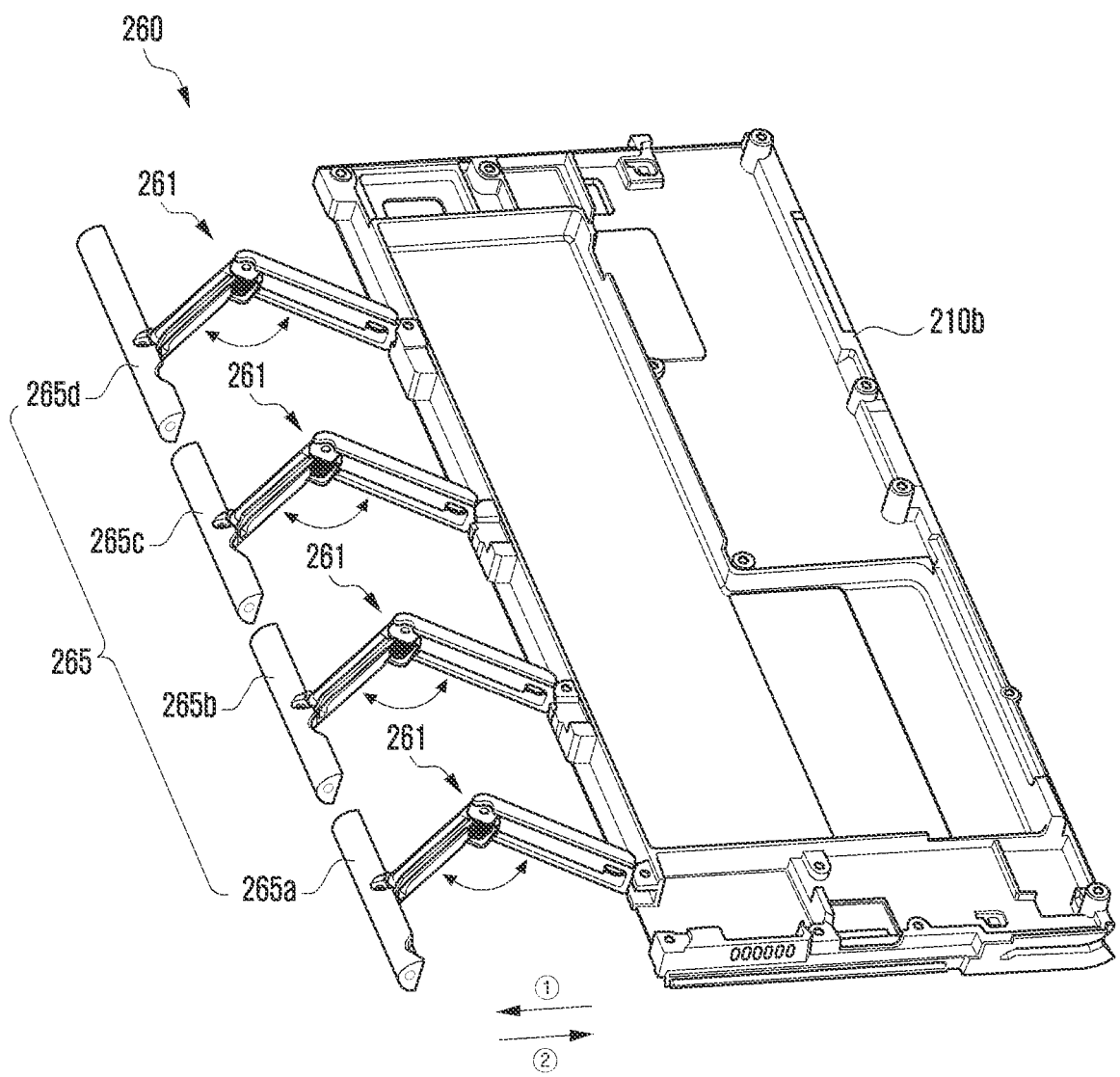
FIG. 11 is a perspective view illustrating the state in which a support assembly is coupled to a bracket housing according to an embodiment of the disclosure.

FIG. 11 is a perspective view illustrating the state in which a support assembly is coupled to a bracket housing according to an embodiment of the disclosure.

In describing the support assembly 260 of FIG. 11, the components that are substantially the same as those of the support assembly 260 of FIG. 7A are denoted by the same reference numerals, and a detailed description thereof may be omitted.

Referring to FIG. 11, the support assembly 260 may include support structures 261 movably fixed to the second bracket housing 210b and pressed in the direction in which the second housing 220 is slid out (direction ①), and a pressing member 265 movably fixed to the support structures 261 and configured to press a bendable member (e.g., the bendable member 240 in FIG. 6A) in a contact manner According to an embodiment, the pressing member 265 may include multiple pressing members 265a, 265b, 265c, and 265d coupled to correspond to the support members 261, respectively.

Figure 12:
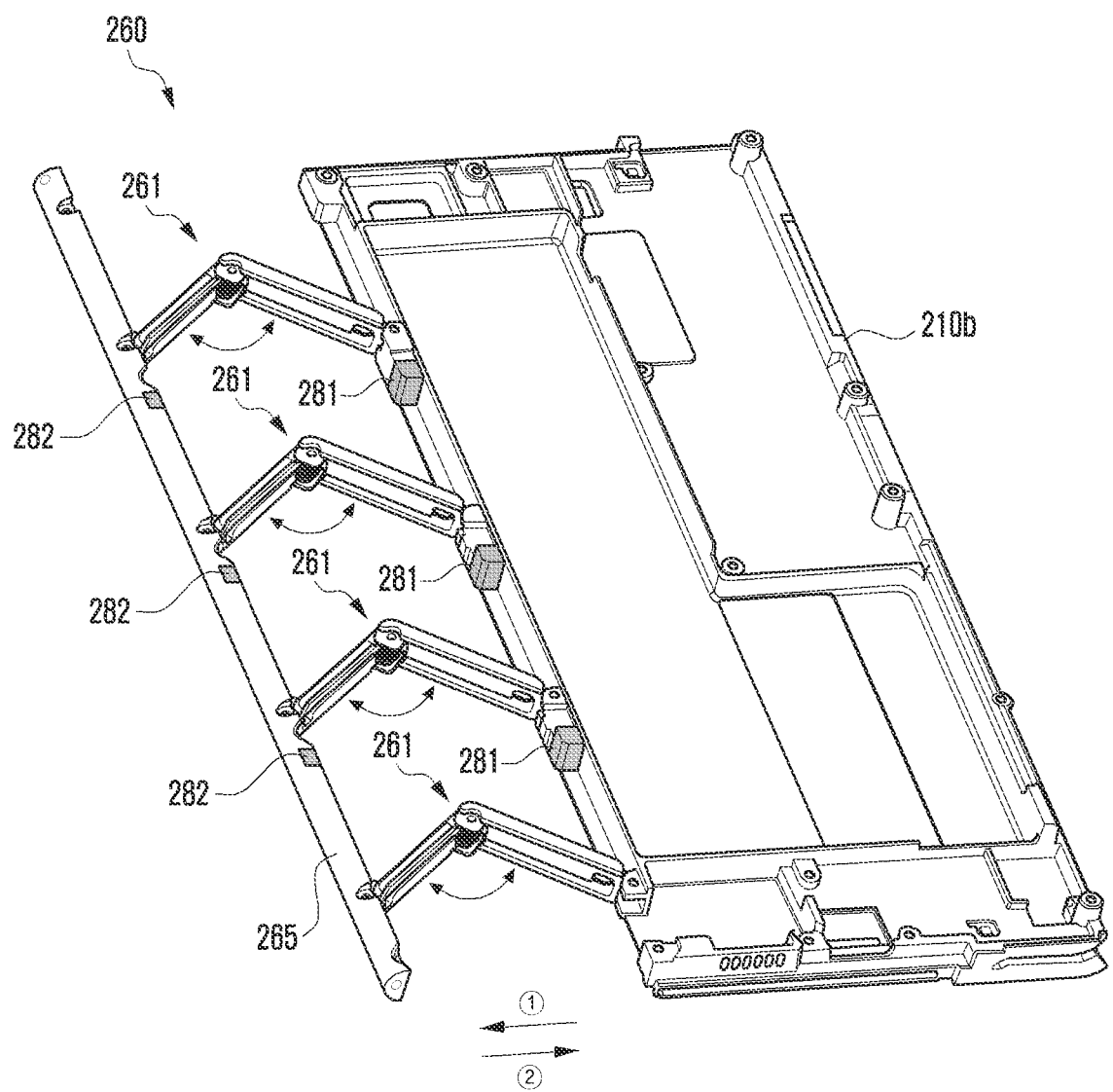
FIG. 12 is a perspective view illustrating a slide-out prevention structure of a second housing provided between a support assembly and a bracket housing according to an embodiment of the disclosure.

FIG. 12 is a perspective view illustrating a slide-out prevention structure of a second housing provided between a support assembly and a bracket housing according to an embodiment of the disclosure.

In describing the support assembly 260 of FIG. 12, the components that are substantially the same as those of the support assembly 260 of FIG. 7A are denoted by the same reference numerals, and a detailed description thereof may be omitted.

Referring to FIG. 12, the support assembly 260 may include support structures 261 movably fixed to the second bracket housing 210b and pressed in the direction in which the second housing 220 is slid out (direction ①), and a pressing member 265 movably fixed to the support structures 261 and configured to press a bendable member (e.g., the bendable member 240 in FIG. 6A) in a contact manner According to an embodiment, the electronic device 200 may include a slide-out prevention structure disposed between the support assembly 260 and the second bracket housing 210b so as to maintain the slide-in state of the second housing 220. According to an embodiment, the slide-out prevention structure may be replaced with the regulation structure of the second housing (e.g., the second housing 220 in FIG. 6D) using a locker (e.g., the locker 270 in FIG. 6D).

According to various embodiments, the slide-out prevention structure may include at least one first magnet 281 disposed in the second bracket housing 210d and at least one second magnet 282 disposed at a corresponding position of the pressing member 265 at which the at least one second magnet 282 is affected by the magnetic force of the at least one first magnet 281 in the slide-in state. According to an embodiment, the first magnet 281 and the second magnet 282 may be arranged such that an attractive force acts therebetween in the slide-in state. According to an embodiment, the attractive force between the first magnet 281 and the second magnet 282 may be set to the strength of magnetic force capable of overcoming the force applied when the support structures 261 are to be unfolded from the slide-in state. Accordingly, when the electronic device 200 is shifted from the slide-out state to the slide-in state by the user, the slide-in state may be maintained by the attractive force between the first magnet 281 and the second magnet 282. Meanwhile, when the electronic device 200 is pressed with a force greater than the attractive force between the two magnets 281 and 282 along the direction in which the flexible display 230 is slid out by the user from the slide-in state, the attractive force applied by the two magnets 281 and 282 can be released, and the electronic device 200 can be shifted to the slide-out state by the pressing force applied when the support structures 261 are to be unfolded. In some embodiments, the second magnet 282 may be disposed in at least a portion of the support structure 261. In some embodiments, the first magnet 281 and/or the second magnet 282 may be replaced with an electromagnet.

Figure 13:
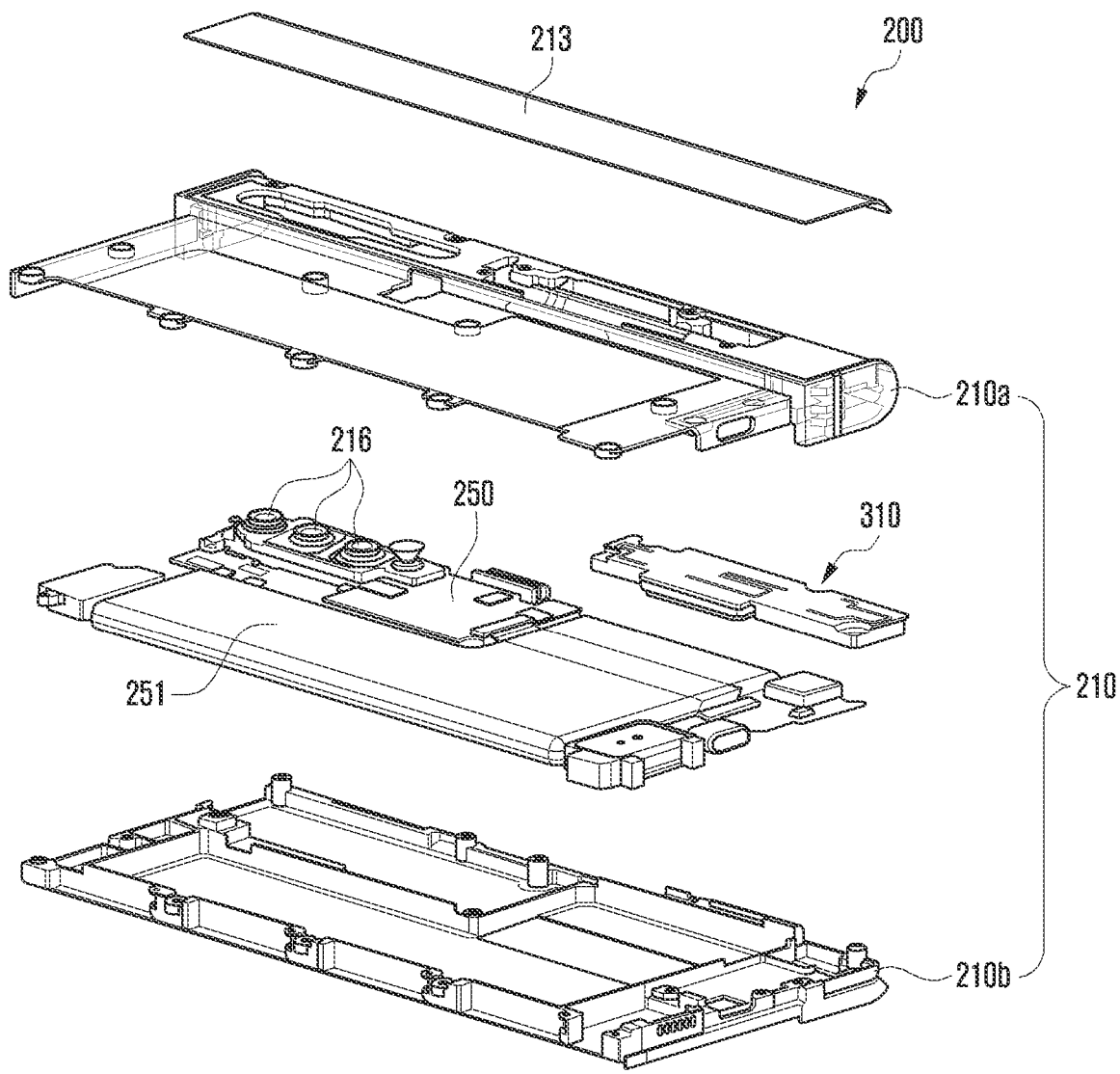
FIG. 13 is an exploded perspective view illustrating an electronic device including a component assembly according to an embodiment of the disclosure.

FIG. 13 is an exploded perspective view illustrating an electronic device including a component assembly according to an embodiment of the disclosure.

Referring to FIG. 13, the electronic device 200 may include a first housing 210 and a second housing (e.g., the second housing 220 in FIG. 14A), which is coupled to be slidable by a designated reciprocating distance. According to an embodiment, the first housing 210 may include a first bracket housing 210a and a second bracket housing 210b coupled to the first bracket housing 210a. According to an embodiment, the first housing 210 may include a first space (e.g., the first space 2101 in FIG. 17) provided by coupling the first bracket housing 210a and the second bracket housing 210b. According to an embodiment, the first housing 210 may include at least one electronic component disposed in the first space 2101. According to an embodiment, the at least one electronic component may include a main board 250, a camera module 216 disposed on the main board 250, a battery 251 disposed near the main board 250, and a component assembly 310. According to an embodiment, the component assembly 310 may be configured as a single assembly by arranging at least two electronic components (e.g., an antenna module 312 and a socket module 313 in FIG. 15) to be stacked on each other. According to an embodiment, at least one first electronic component included in the component assembly 310 may perform a corresponding function in the first space 2101 of the first housing 210. According to an embodiment, at least one second electronic component included in the component assembly 310 may be disposed to face the outside through at least one opening (e.g., the opening 212d in FIG. 14B) provided in the first housing 210. According to an embodiment, the at least one first electronic component may perform a corresponding function in the first space 2101 regardless of the opening. For example, the at least one first electronic component may include an antenna module (e.g., the antenna module 312 of FIG. 15). According to an embodiment, the at least one second electronic component may include at least one of the speaker module (e.g., the speaker 207 in FIG. 18A), a microphone module (e.g., the microphone 203 in FIG. 18A), a sensor module (e.g., the sensor module 217 in FIG. 3A), a socket module (e.g., the socket module 313 in FIG. 15), and a connector port (e.g., the connector port 208 of FIG. 18A), each of which faces the outside of the electronic device 200 through an opening (e.g., the opening 212d in FIG. 14B) so as to perform a corresponding function.

Figure 14A:
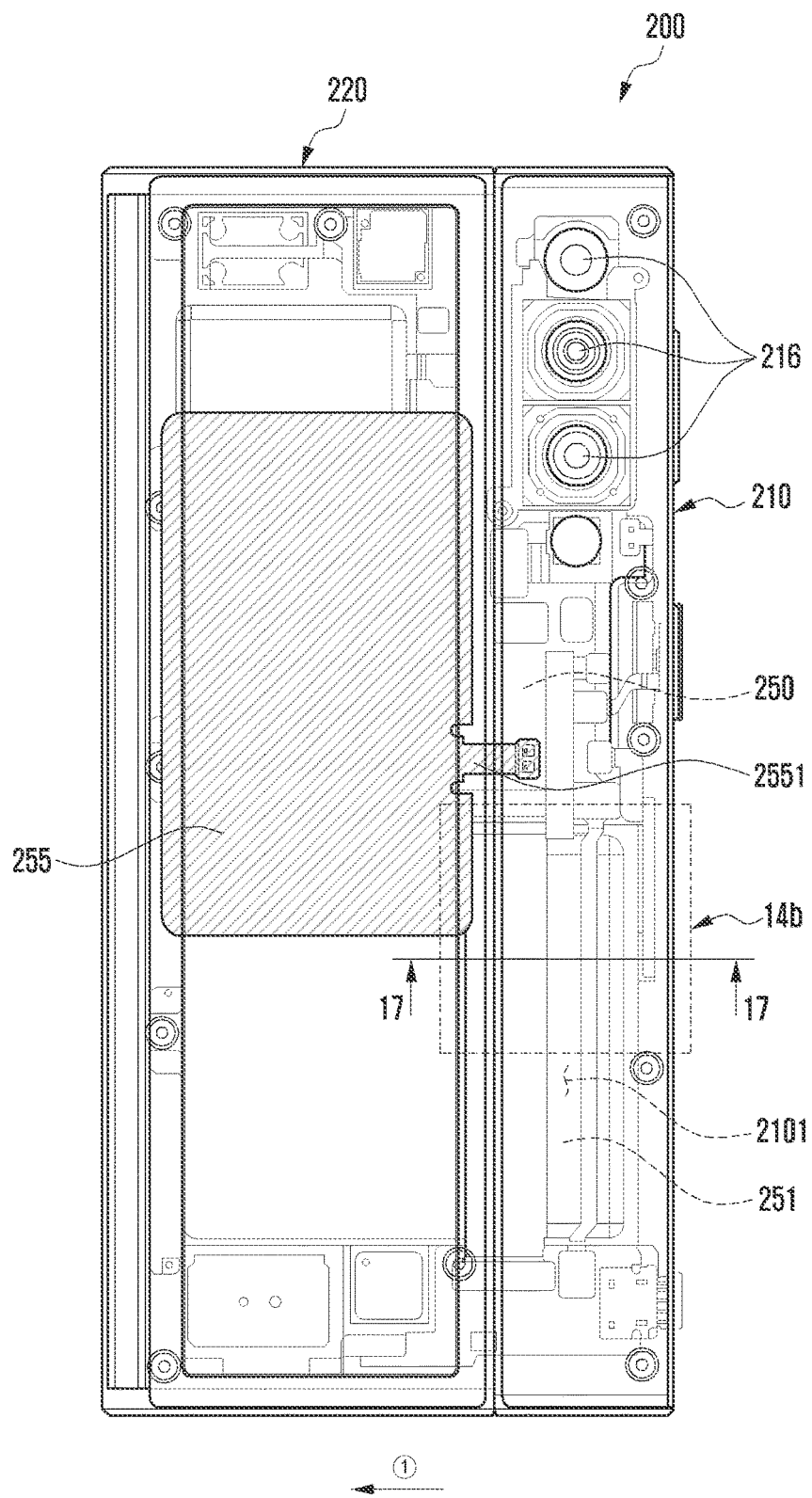
FIG. 14A is a plan view illustrating the rear surface of an electronic device in which a component assembly is arranged according to an embodiment of the disclosure.

FIG. 14A is a plan view illustrating the rear surface of an electronic device in which a component assembly is arranged according to an embodiment of the disclosure.

Figure 14B:
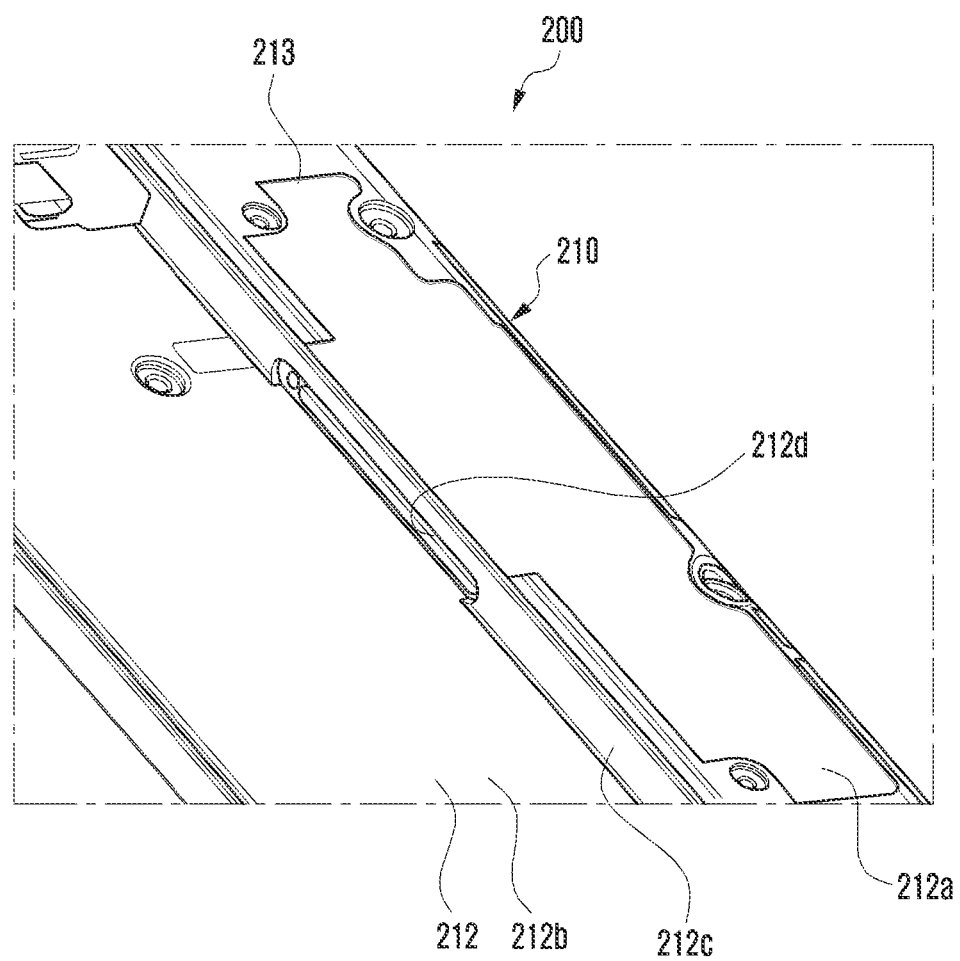
FIG. 14B is an enlarged view of the area 14b in FIG. 14A according to an embodiment of the disclosure.

FIG. 14B is an enlarged perspective view of a portion of the area 14b in FIG. 14A according to an embodiment of the disclosure.

Figure 17:
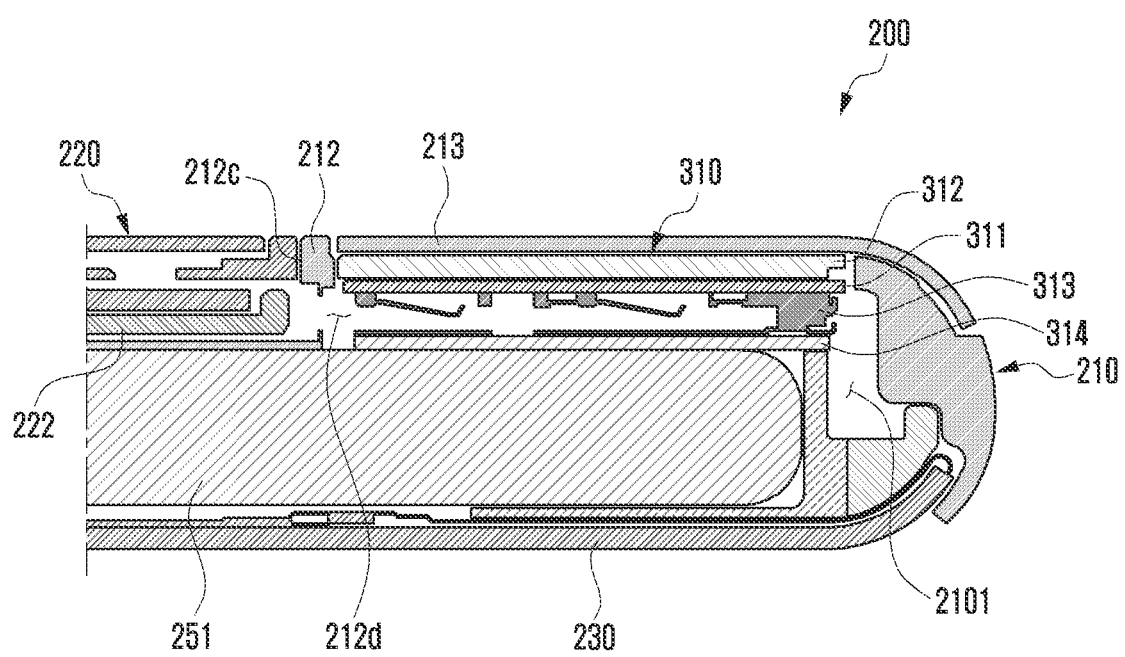
FIG. 17 is a cross-sectional view of an electronic device taken along line 17-17 in FIG. 14 according to an embodiment of the disclosure.

Referring to FIGS. 14A and 14B, the electronic device 200 may include a first housing 210 including a first space (e.g., the first space 2101 in FIG. 17) and a second housing 220, which is disposed so as to be slidable by a predetermined reciprocating distance from the first housing 210 and includes a second space (e.g., the second space 2201 in FIG. 17). According to an embodiment, the first housing 210 may include a first support member 212 at least a portion of which extends into the first space 2101. According to an embodiment, the second housing 220 may include a second support member (e.g., the second support member 222 in FIG. 17) extending into the second space 2201. According to an embodiment, the first support member 212 may include a non-overlapping portion 212a extending from the non-overlapping portion 212a and disposed so as to be visible from the outside in the slide-in state, an overlapping portion 212b disposed so as to be invisible from the outside by being disposed so as to overlap at least a portion of the second support member 220, and a stepped portion 212c connecting the non-overlapping portion 212a and the overlapping portion 212b to each other. According to an embodiment, in the slide-in state, the stepped portion 212c may be covered so as to be invisible from the outside through the second support member 222. In some embodiments, the rear surface (e.g., the rear surface 200b in FIG. 3A) of the electronic device 200 may form a substantially flat surface when the second support member 222 is connected to the first support member 212a via the stepped portion 212c.

According to various embodiments, the electronic device 200 may include an opening 212d disposed in the stepped portion 212c of the first support member 212 of the first housing 210 and connects the first space 2101 to the outside. According to an embodiment, in the slide-out state, the opening 212d may face the outside, and in the slide-in state, the opening 212d may be closed by the second support member 222 so as to be disconnected from the outside. According to an embodiment, at least some electronic components (e.g., a socket module) of the component assembly (e.g., the component assembly 310 in FIG. 13) disposed in the first space 2101 of the first housing 210 may be disposed to be connected to the opened 212d. Accordingly, some electronic components included in the component assembly 310 may perform functions related to the outside of the electronic device 200 while the electronic device 200 is in the slide-out state. For example, when some electronic components included in the component assembly 310 include a socket module (e.g., the socket module 313 in FIG. 15), an external card member (e.g., a SIM card or a memory card) may be mounted on or removed from the socket module 313 through the opening 212d while the electronic device 200 is in the slide-out state. According to an embodiment, while the electronic device 200 is in the slide-in state, the opening 212d is covered by the second support member 222 so as to be invisible from the outside, which may be helpful for improving the aesthetics of the electronic device 200.

Figure 15:
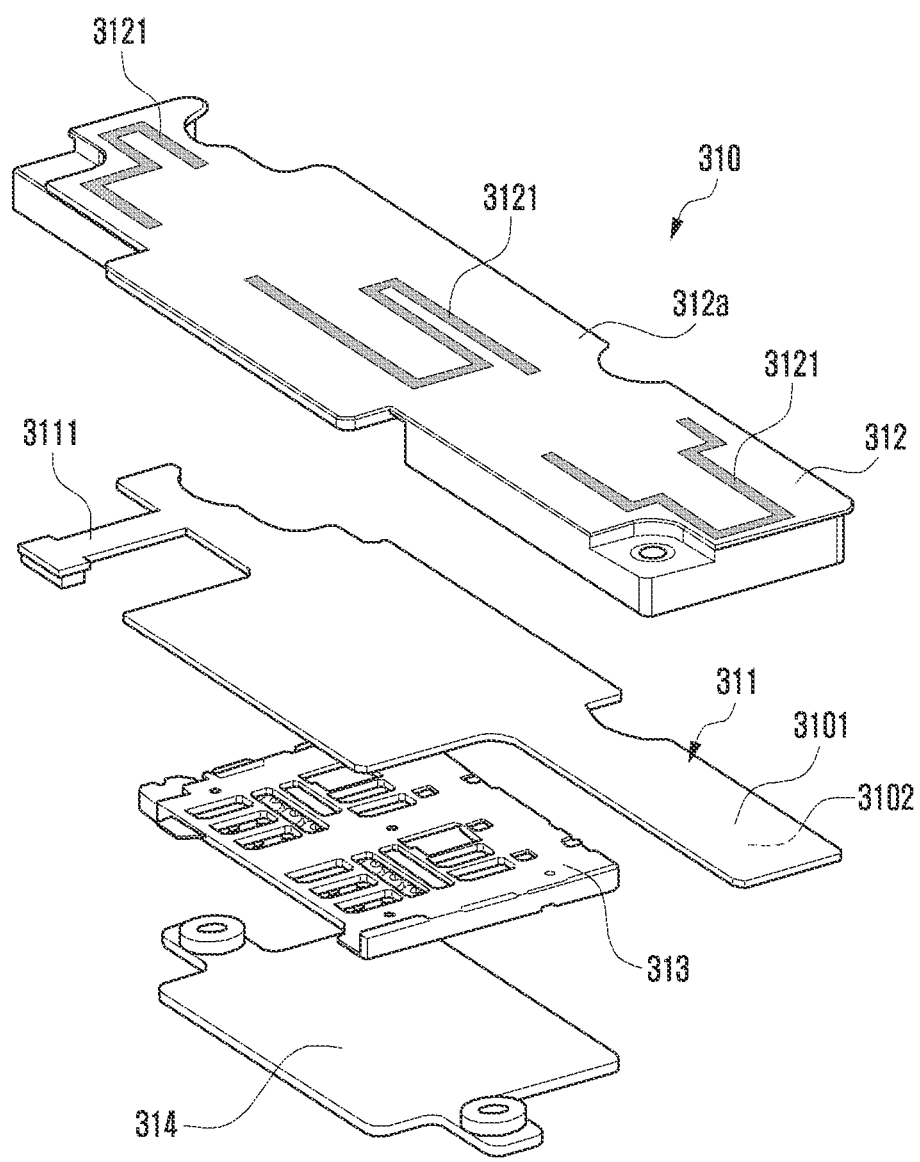
FIG. 15 is an exploded perspective view of a component assembly according to an embodiment of the disclosure.

FIG. 15 is an exploded perspective view of a component assembly according to an embodiment of the disclosure.

Figure 16:
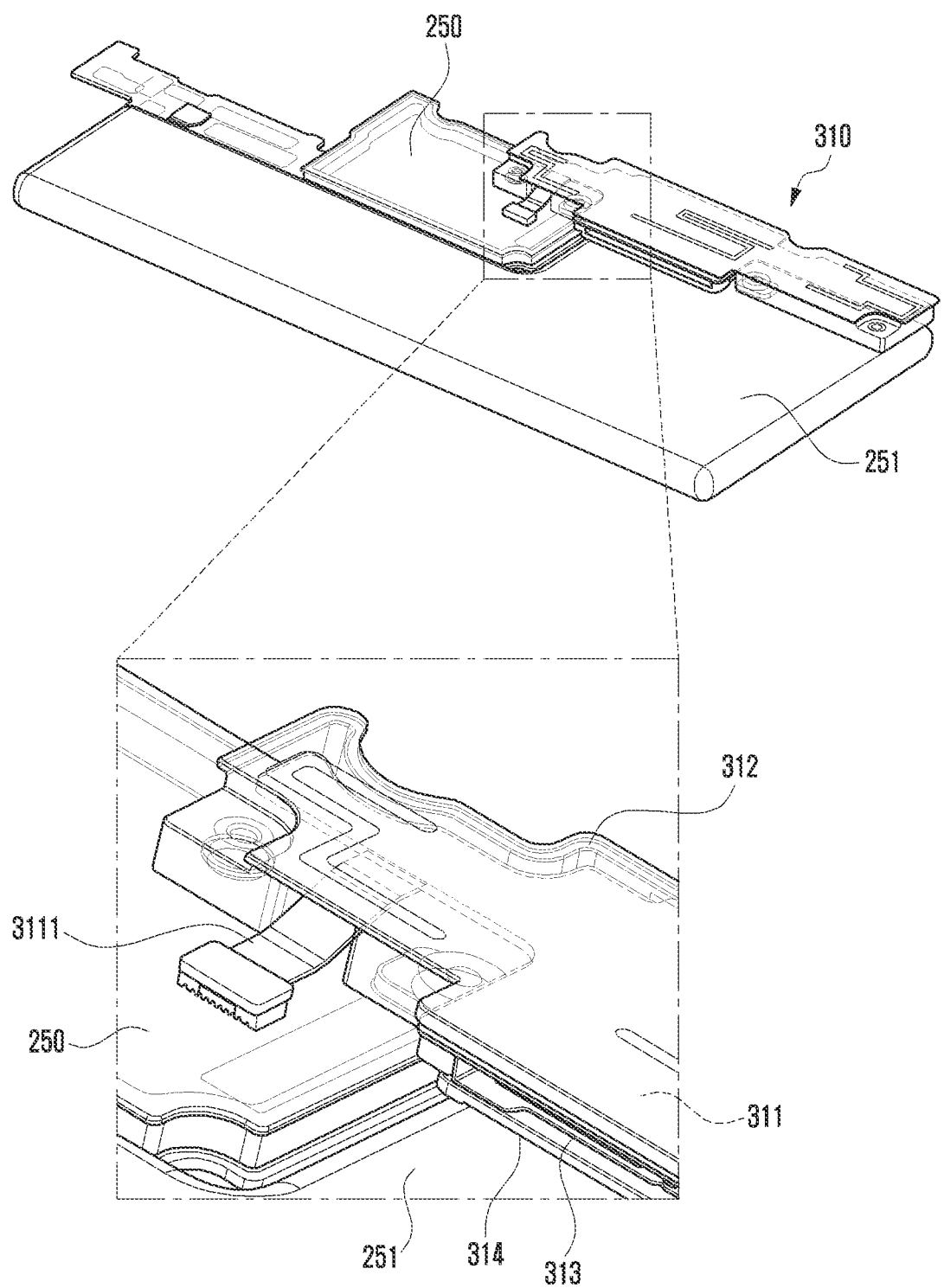
FIG. 16 is a perspective view illustrating the state in which the component assembly is connected to a main board according to an embodiment of the disclosure.

FIG. 16 is a perspective view illustrating the state in which the component assembly is connected to a main board according to an embodiment of the disclosure.

Referring to FIGS. 15 and 16, the component assembly 310 may include a board including a first board surface 3101, a second board surface 3102 facing away from the first board surface 3101, an antenna module 312 as a first electronic component disposed on the first board surface 3101, and a socket module 313 as a second electronic component disposed on the second board surface 3102. According to an embodiment, the board 311 may be electrically connected to the main board 250 via an extension (e.g., an FPCB) that is drawn out or extends from the board 311.

According to various embodiments, the antenna module 312 may include a dielectric structure 312a (e.g., an antenna carrier) disposed on the first board surface 3101 and at least one conductive pattern 3121 (e.g., an antenna pattern) disposed on the dielectric structure 312a. The at least one conductive pattern 3121 may be set to transmit and/or receive a wireless signal in a predetermined frequency band via a wireless communication circuit (e.g., the wireless communication module 192 in FIG. 1) disposed in the first space of the first housing 210 (e.g., the first space 2101 in FIG. 17). According to an embodiment, the conductive pattern 2121 may include at least one of a laser direct structuring (LDS) pattern provided on the dielectric structure 312a, a conductive plate attached to the outer surface of the dielectric structure 312a, or an FPCB including an antenna pattern. In some embodiments, the at least one conductive pattern 3121 may be disposed directly on the board 311. According to an embodiment, the socket module 313 may be fixed to the second board surface 3102 through an electrical connection process such as soldering, and may be finished by a bracket 314 made of a non-conductive material.

According to various embodiments, the component assembly 310 may be disposed in the first space 2101 at a position at which the component assembly 310 does not overlap other electronic components, such as the main board 250 and the battery 251 when the first substrate surface 3101 is viewed from above. In some embodiments, the component assembly 310 may be disposed so as to at least partially overlap the main substrate 250 when the first board surface 3101 is viewed from above. In some embodiments, the component assembly 310 may be disposed to overlap the battery 251 when the first substrate surface 3101 is viewed from above. According to an embodiment, the board 311 of the component assembly 310 may be disposed in the first space 2101 of the first housing 210, and may be electrically connected to the main board 250 via the extension 3111 extending from the board 311. Accordingly, the antenna module 312 and the socket module 313 mounted on the board 311 may also be electrically connected to the main board 250.

FIG. 17 is a cross-sectional view of an electronic device taken along line 17-17 in FIG. 14 according to an embodiment of the disclosure.

Referring to FIG. 17, the electronic device 200 may include a component assembly 310 disposed in the first space 2101 of the first housing 210. According to an embodiment, the component assembly 310 may be disposed in the first space 2101 such that the antenna module 312 disposed on the board 311 faces the first rear cover 213 and the socket module 313 faces the battery 251. According to an embodiment, the socket module 313 may be disposed to be connected to the opening 212d provided in the stepped portion 212c of the first support member 212. Accordingly, while the electronic device 200 is in the slide-in state, the opening 212d is covered so as to be invisible from the outside through the second support member 222 of the second housing 220, which may be helpful for forming a beautiful appearance of the electronic device 200. According to an embodiment, while the electronic device 200 is in the slide-out state, the opening 212d is exposed so as to be visible from the outside. Thus, the opening 212d may serve as a space for inserting or removing at least one card device into or from the socket device 313.

Figure 18A:
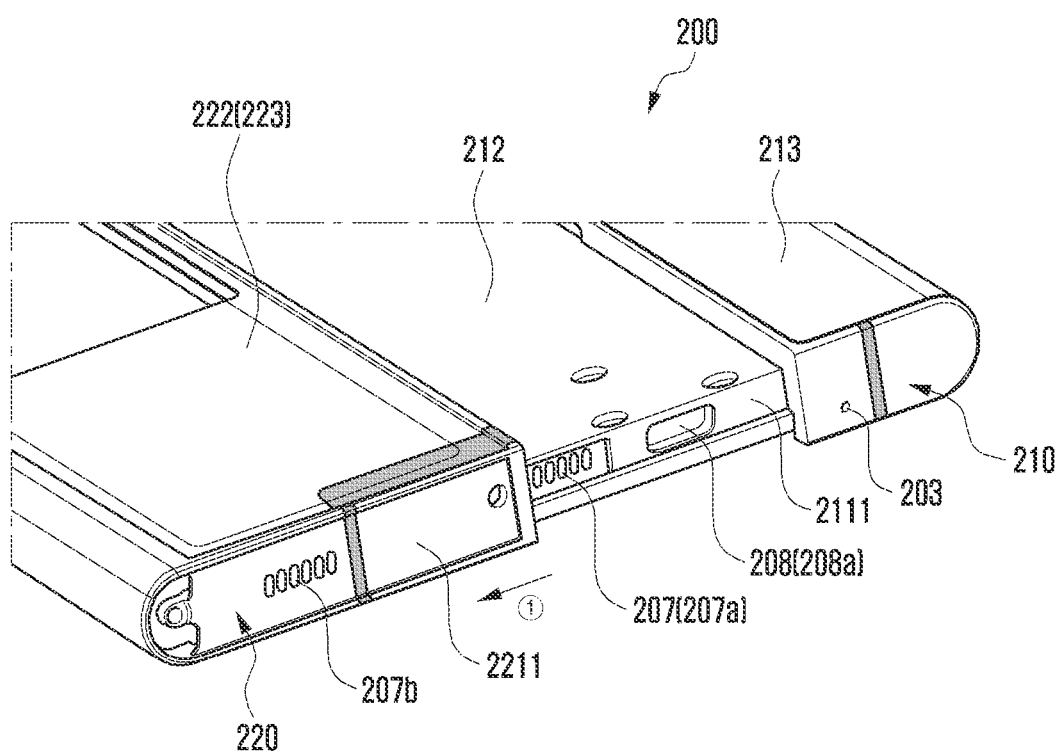
FIG. 18A is a perspective view illustrating a portion of an electronic device in the slide-out state according to an embodiment of the disclosure.
Figure 18B:
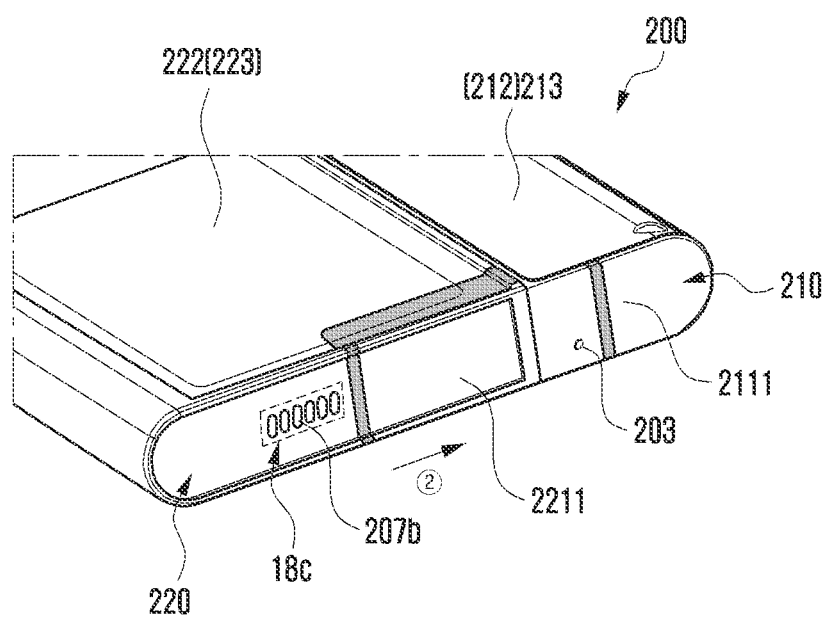
FIG. 18B is a perspective view illustrating a portion of an electronic device in the slide-in state according to an embodiment of the disclosure.
Figure 18C:
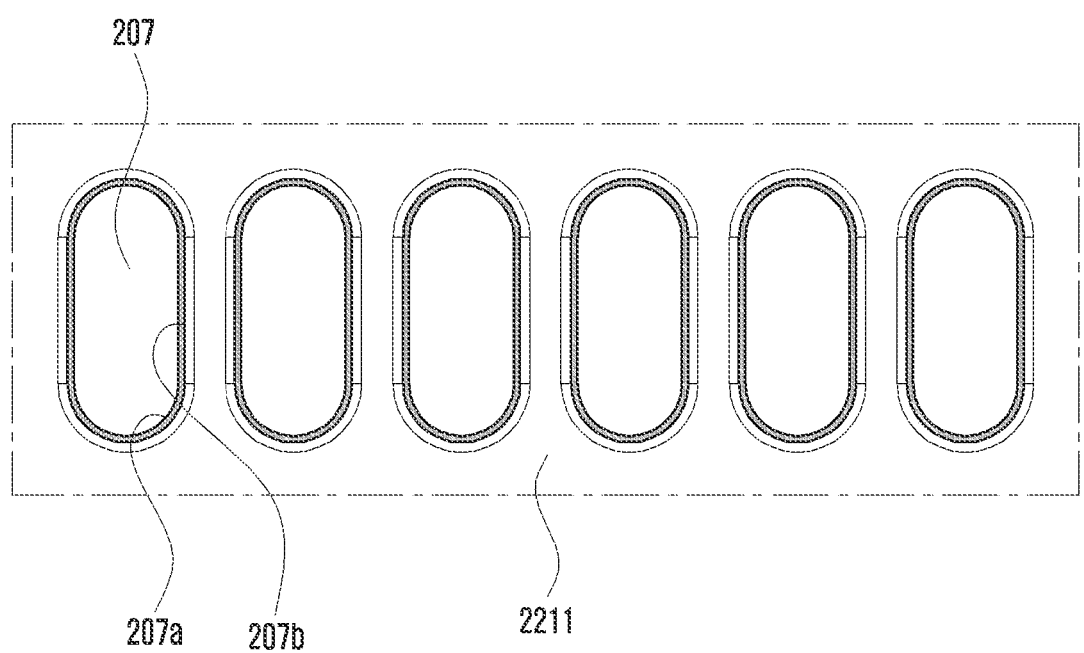
FIG. 18C is an enlarged view of the area 18c in FIG. 18B according to an embodiment of the disclosure.

FIG. 18A is a perspective view illustrating a portion of an electronic device in the slide-out state according to an embodiment of the disclosure, FIG. 18B is a perspective view illustrating a portion of an electronic device in the slide-in state according to an embodiment of the disclosure, and FIG. 18C is an enlarged view of the area 18c in FIG. 18B according to an embodiment of the disclosure;

Referring to FIGS. 18A to 18C, the electronic device 200 may include a first housing 210 including a first side member (e.g., the first side member 211 in FIG. 2A) and a second side housing 220 coupled to the first housing 210 to be slid by a predetermined reciprocating distance and including a second side member (e.g., the second side member 221 in FIG. 2A). According to an embodiment, the electronic device 200 may include a speaker 207 disposed in the first space 2101 and configured to output sound through a first speaker hole 207a, which is an opening provided in the first side surface 2111 of the first side member 211 of the first housing 210, and a connector port 208 connected to the outside through a first connector port hole 208a, which is another opening provided in the first side surface 2111. According to an embodiment, the first speaker hole 207a and the first connector port hole 208a may be disposed so as to be visible from the outside through the first side surface 2111 in the slide-out state. According to one embodiment, in the slide-in state, the first speaker hole 207a and the first connector port hole 208a may be covered by at least a portion of the fourth side surface 2211 of the second side member 221 of the second housing 220. According to an embodiment, the second housing 220 may include a second speaker hole 207b, which is disposed at a corresponding position in the fourth side surface to correspond to the first speaker hole 207a in the first side surface 2111 in the slide-in state. According to an embodiment, the size of the second speaker hole 207b may be equal to or larger than the size of the first speaker hole 207a so as to prevent the sound performance of the speaker 207 from being deteriorated, which may be caused when the first speaker hole 207a is partially covered by the fourth side surface 2211 in the slide-in state. Accordingly, the speaker 207 disposed in the first space 2101 emits sound to the outside through the first speaker hole 207a and the second speaker hole 207b, even in the slide-in state, whereby the convenience of use of the electronic device can be improved. According to an embodiment, the first connector port hole 208a may be invisible from the outside by being covered by the fourth side surface 2211 in the slide-in state.

According to an embodiment, the electronic device 200 may include a sliding structure in which at least a portion of the flexible display (e.g., the flexible display 230 in FIG. 2) is accommodated in the second space of the second housing 220 (e.g., the second space 2201 in FIG. 17) according to a sliding operation, and the speaker 207 is disposed in the first space 2101 of the first housing 210, whereby the speaker 207 can be firmly fixed in the first space 2101 without considering the arrangement relationship with the flexible display 230. In addition, even in the slide-in state, it is possible to prevent performance degradation of the speaker by providing an external connection structure using the first speaker hole 207a in the first housing 210 and the second speaker hole 207b in the second housing 220 as openings.

Figure 19A:
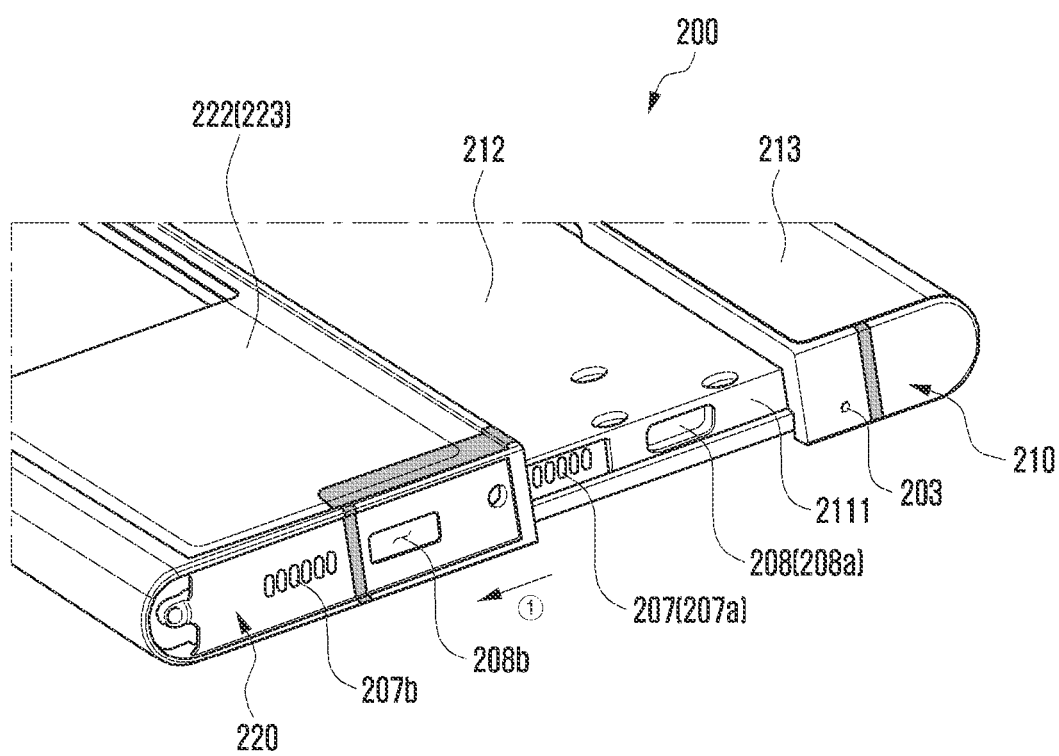
FIG. 19A is a perspective view illustrating a portion of an electronic device in the slide-out state according to an embodiment of the disclosure.
Figure 19B:
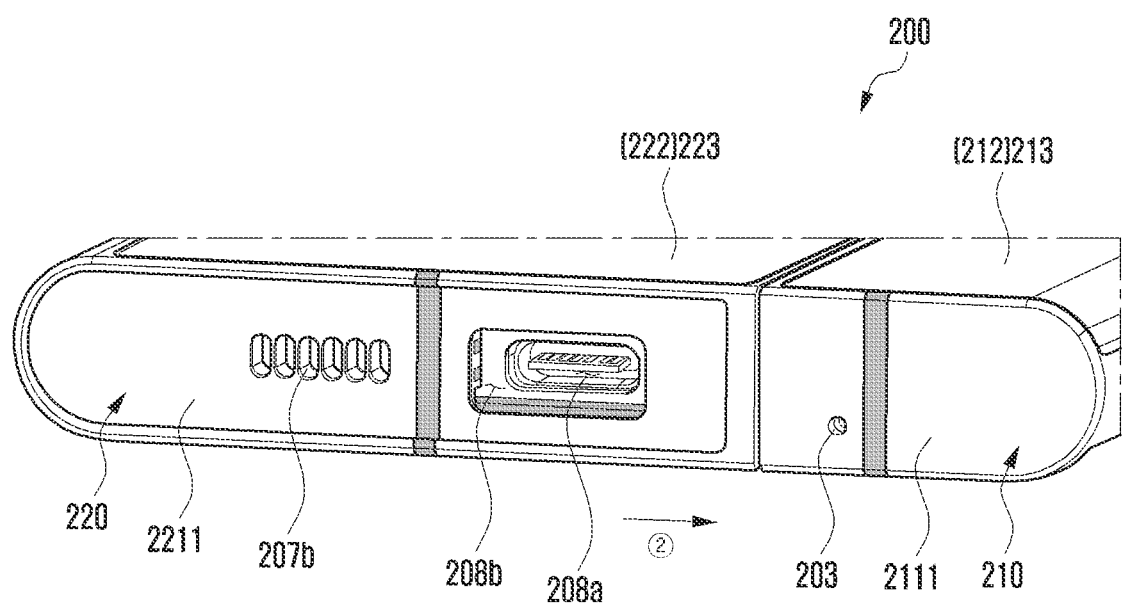
FIG. 19B is a perspective view illustrating a portion of an electronic device in the slide-in state according to an embodiment of the disclosure.

FIG. 19A is a perspective view illustrating a portion of an electronic device in the slide-out state according to an embodiment of the disclosure, and FIG. 19B is a perspective view illustrating a portion of an electronic device in the slide-in state according to an embodiment of the disclosure.

In describing the electronic device of FIGS. 19A and 19B, the components that are substantially the same as those of the electronic device of FIGS. 18A and 18B are denoted by the same referential numerals, and a detailed description thereof may be omitted.

Referring to FIGS. 19A and 19B, the electronic device 200 may include a second connector port hole 208b disposed in the fourth side surface 2211 of the second housing 220. According to an embodiment, the second connector port hole 208b may be disposed at a position corresponding to the first connector port hole 208a disposed in the first side surface 2111 of the first housing 210 while the electronic device is in the slide-in state. Accordingly, even in the slide-in state, the connector port 208 of the electronic device 200 is capable of accommodating a connector of an external device (e.g., a charging device) through the first connector port hole 208a and the second connector port hole 208b, which makes it possible to smoothly perform data transmission and/or charging operation. According to an embodiment, the second connector port hole 208*b* is larger than the first connector port hole 208*a*. Thus, a connector of an external device can be accommodated in the first connector port hole 208*a* through the second connector port hole 208*b*.

Figure 20A:
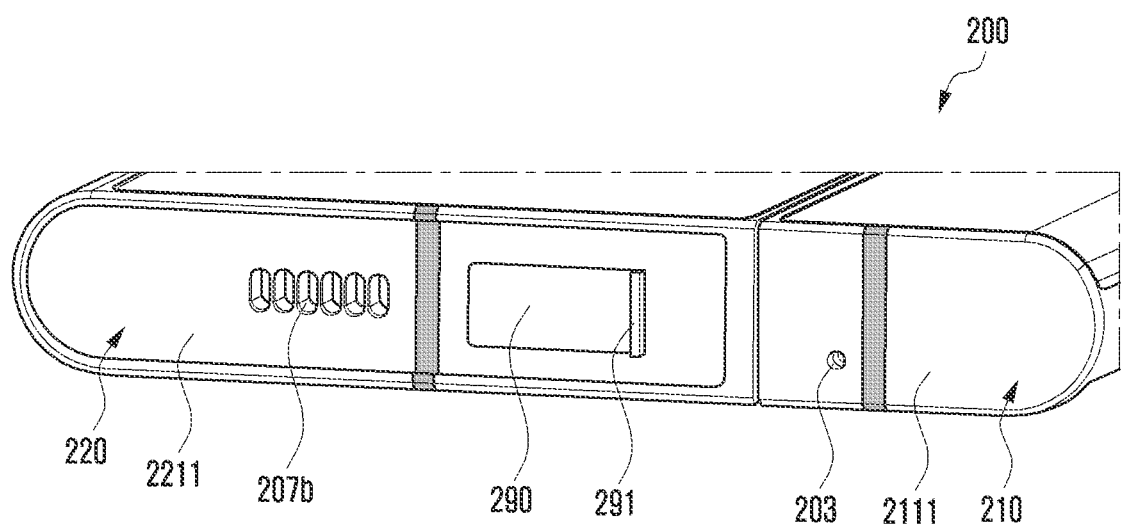
FIG. 20A is a perspective view illustrating a portion of an electronic device in the slide-out state according to an embodiment of the disclosure.
Figure 20B:
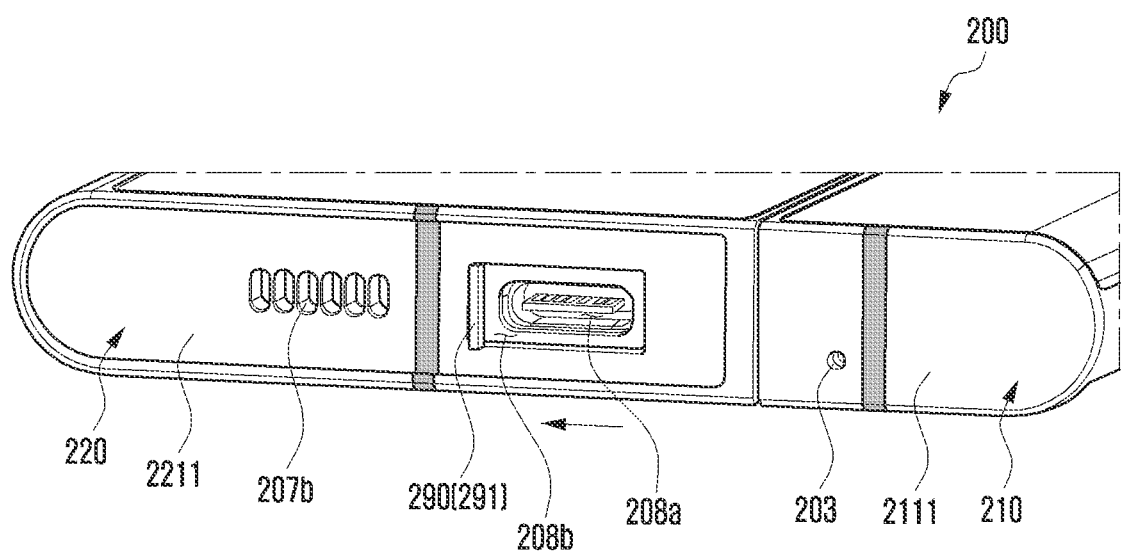
FIG. 20B is a perspective view illustrating a portion of an electronic device in the slide-in state according to an embodiment of the disclosure.

FIG. 20A is a perspective view illustrating a portion of an electronic device in the slide-out state according to an embodiment of the disclosure, and FIG. 20B is a perspective view illustrating a portion of an electronic device in the slide-in state according to an embodiment of the disclosure.

In describing the electronic device of FIGS. 20A and 20B, the components that are substantially the same as those of the electronic device of FIGS. 19A and 19B are denoted by the same referential numerals, and a detailed description thereof may be omitted.

Referring to FIGS. 20A and 20B, the electronic device 200 may include a protective cover 290 disposed on the fourth side surface 2211 of the second housing 220 so as to seal the second connector port hole 208*b* in the slide-in state. According to an embodiment, the protective cover 290 may be disposed in the second housing 220 in a sliding manner so as to move to open or close the second connector port hole 208*b*. According to an embodiment, the protective cover 290 may include an operation unit 291 (e.g., a handle) protruding from one side thereof to the outside, thereby enhancing the convenience of operation. Accordingly, when the connector port 208 is not used, the second connector port hole 208*b* is maintained in the state of being closed by the protective cover 290, which makes it possible to prevent the introduction of foreign matter from the outside. In some embodiments, the protective cover 290 may be disposed to be removable from the second housing 220.

Figure 21A:
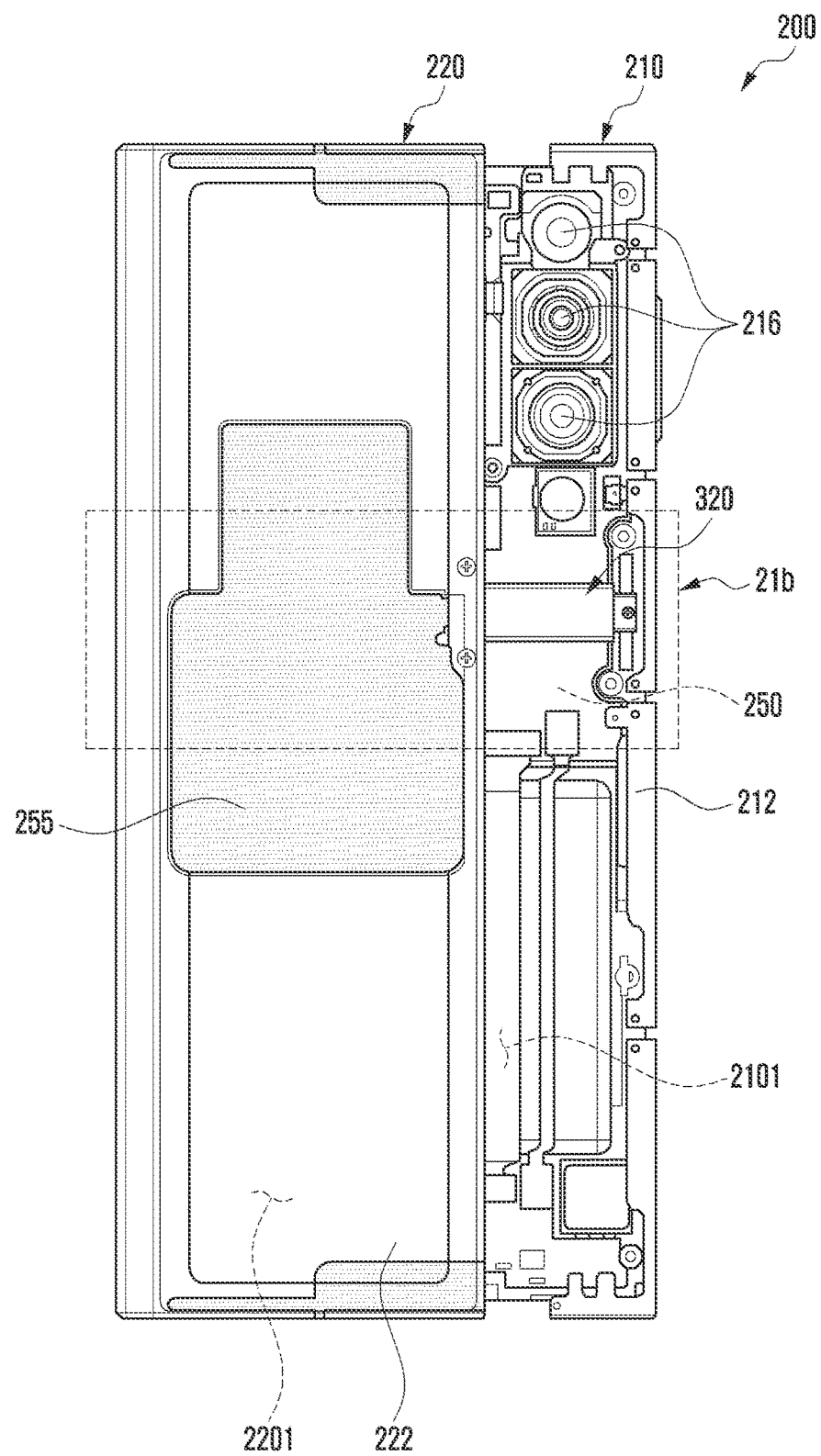
FIG. 21A is a view illustrating the configuration of an electronic device, in which an arrangement relationship between an electrical structure and a conduit structure is illustrated in the slide-in state according to an embodiment of the disclosure.
Figure 21B:
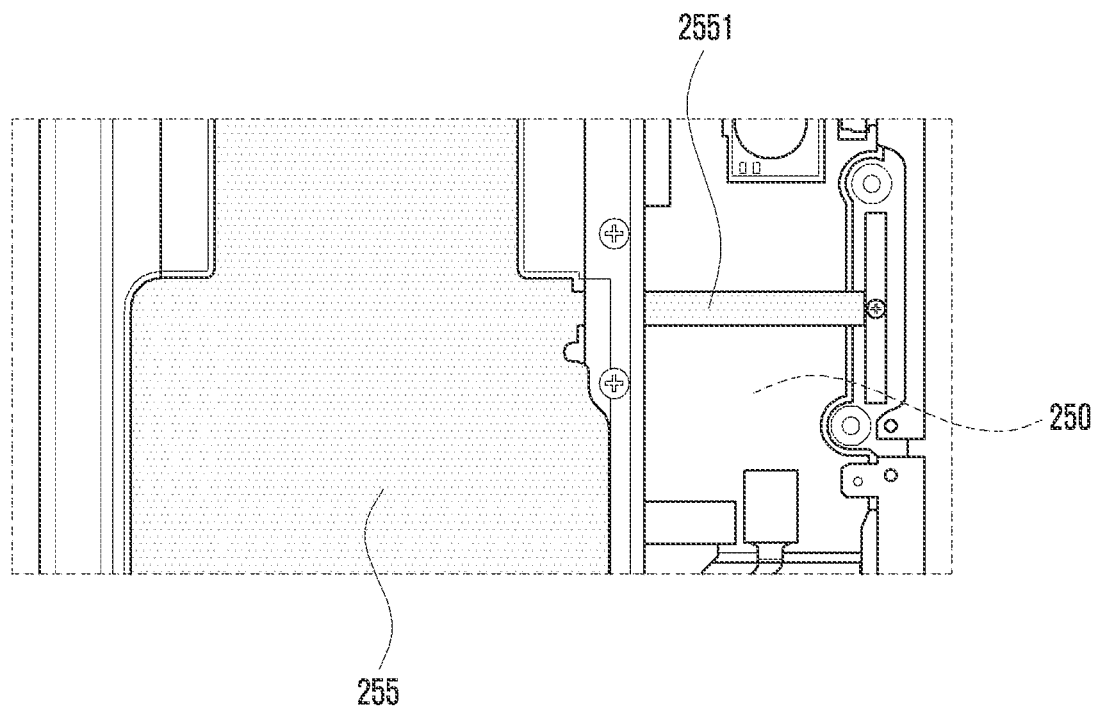
FIG. 21B is an enlarged view illustrating an arrangement relationship of a conductive member in the state in which a conduit structure is omitted in an area 21b of FIG. 21A according to an embodiment of the disclosure.

FIG. 21A is a view illustrating the configuration of an electronic device, in which an arrangement relationship between an electrical structure and a conduit structure is illustrated in the slide-in state according to an embodiment of the disclosure, and FIG. 21B is an enlarged view illustrating an arrangement relationship of a conductive member in the state in which a conduit structure is omitted in an area 21*b* of FIG. 21A according to an embodiment of the disclosure.

Figure 22A:
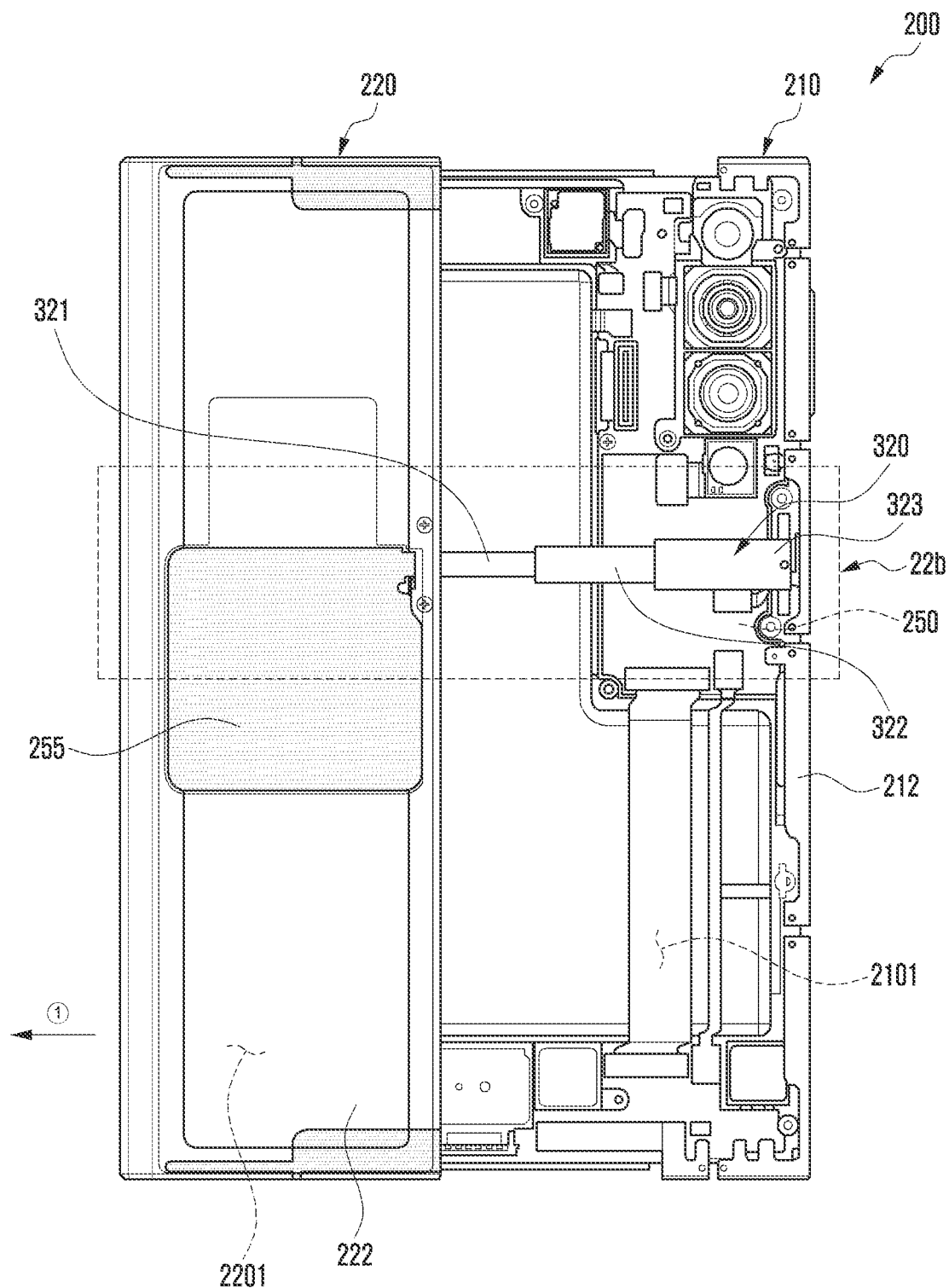
FIG. 22A is a view illustrating the configuration of an electronic device, in which an arrangement relationship between an electrical structure and a conduit structure is illustrated in the slide-out state according to an embodiment of the disclosure.
Figure 22B:
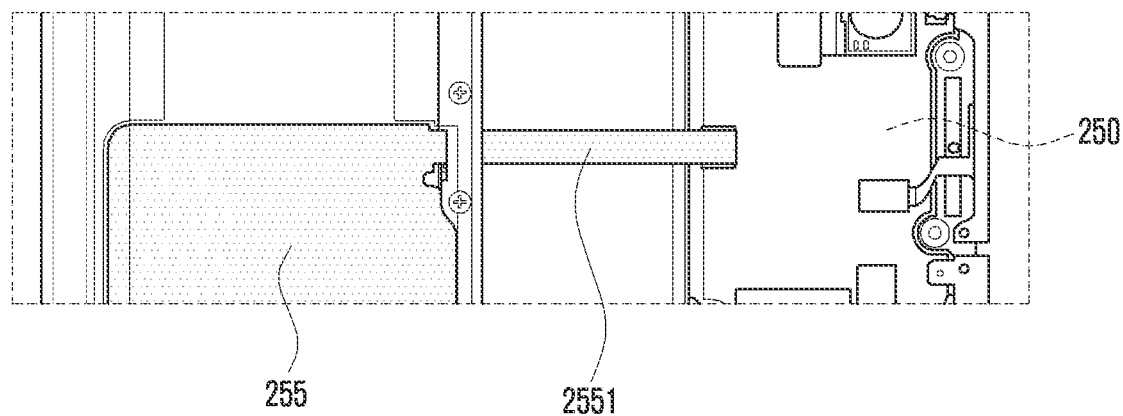
FIG. 22B is an enlarged view illustrating an arrangement relationship of a conductive member in the state in which a conduit structure is omitted in the area 22b of FIG. 22A according to an embodiment of the disclosure.

FIG. 22A is a view illustrating the configuration of an electronic device, in which an arrangement relationship between an electrical structure and a conduit structure is illustrated in the slide-out state according to an embodiment of the disclosure, and FIG. 22B is an enlarged view illustrating an arrangement relationship of a conductive member in the state in which a conduit structure is omitted in the area 22*b* of FIG. 22A according to an embodiment of the disclosure.

Referring to FIGS. 21A, 21B, 22A, and 22B, the electronic device 200 may include a first housing 210 and a second housing 220 coupled to the first housing 210 to be slidable by a predetermined reciprocating distance. According to an embodiment, the electronic device 200 may include a main board 250 and at least one electronic component (e.g., a camera module 216), which are disposed in the first space 2101 of the first housing 210. According to an embodiment, the electronic device 200 may include an electrical structure 255 disposed in the second space 2201 of the second housing 220 and electrically connected to the main board 250 via a flexible printed circuit board (FPCB) 2551. According to an embodiment, the FPCB 2551 may extend from the electrical structure 255 of the second housing 220 to the first space 2101 of the first housing 210. According to an embodiment, the FPCB 2551 may be have a bendable shape so as to accommodate a sliding distance in which the second housing 220 is shifted from the slide-in state to the slide-out state. According to an embodiment, the electrical structure 255 may include an antenna disposed in the second housing 220. According to an embodiment, the electrical structure 255 may include an antenna for wireless power consortium (WPC), magnetic secure transmission (MST), or near field communication (NFC). In some embodiments, the electrical structure 255 may be disposed between the second support member 222 and the second rear cover (e.g., the second rear cover 223 in FIG. 3A) in the second housing 220.

According to various embodiments, the electronic device 200 may include a sensing structure configured to detect the position of the second housing 220 during the slide-in state, the slide-out state, and/or the operating state of the second housing 220. According to an embodiment, as the sensing structure, the electronic device 200 may include an FPCB 2551 extending from the electrical structure 255 to the main board 250 and disposed in a curved shape, and a sensing member (e.g., the sensing member 256 in FIG. 23A) configured to detect contact with the second housing 220 varying according to the sliding operation of the FPCB 2551. According to an embodiment, the FPCB 2551 may include a conductive portion (e.g., a ground layer or a separate conductive pattern), and the sensing member 256 may include a touch sensor configured to detect the conductive portion of the FPCB 2551. In some embodiments, the sensing member 256 may have a sensing structure including multiple channels for detecting the conductive portion, rather than the touch sensor. According to an embodiment, the sensing member 256 may include multiple channels (e.g., 64 or more channels) configured to detect a change amount of a capacitance value that varies depending on a contact area that comes into contact with the conductive portion of the FPCB 2551. According to an embodiment, the sensing member 256 may be disposed in a manner in which multiple conductive channels are disposed on the main board 250. In some embodiments, the sensing member 256 may detect only a portion (e.g., an end) of the conductive portion of the FPCB 2551. In some embodiments, the sensing member 256 may be disposed separately from the main board 250, and may be electrically connected to the main board 250. According to an embodiment, the FPCB 2551 may be disposed to be at least partially in contact with the sensing member 256. For example, the FPCB 2551 may be formed in a "U" shape, in which one end of the FPCB 2551 may be electrically connected to the electrical structure 255 and the other end may be electrically connected to the main board 250. In some embodiments, the FPCB 2551 may extend integrally from electrical structure 255. According to an embodiment, at least a portion of the FPCB 2551 may be disposed to be substantially in contact with the sensing member 256. According to an embodiment, the FPCB 2551 may be arranged such that the contact of the sensing member 256 is variable according to the movement of the second housing 220. Accordingly, the FPCB 2551 may be disposed in the state of being curved in a "U" shape such that opposite ends thereof are oriented in the same first direction (direction ①).

According to various embodiments, the electronic device 200 may include a protruding/receding conduit structure 320 disposed so as to induce the contact between the FPCB 2551 and the sensing member 256 to be uniformly changed according to the movement of the first housing 210 and to protect the sensing member 256. According to an embodiment, the conduit structure 320 may be coupled such that multiple conduits 321, 322, and 323, which are open at one sides thereof and have different sizes, protrude and recede with respect to each other. Accordingly, the length of the conduit structure 320 may be varied depending on whether the electronic device is in the slide-in state or in slide-out state. According to an embodiment, the conduit structure 320 may be disposed on the main board 250 in the first space 2101 of the first housing 210. According to an embodiment, the conduit structure 320 may include an internal space (e.g., the internal space 3201 in FIG. 24A) for accommodating the FPCB 2551, and may prevent the FPCB 2551 from being separated from the sensing member 256 during operation by being disposed to cover the sensing member 256. According to an embodiment, the conduit structure 320 may include a coupling structure for the conduits 321, 322, and 323, in which the coupling structure has an internal space (e.g., the internal space 3201 in FIG. 24A), the size of which gradually decreases in the first direction (direction ①). In some embodiments, the conduit structure 320 may include a coupling structure for the conduits, in which the conduit structure 320 has an internal space (e.g., the internal space 3201 in FIG. 24A), the size of which gradually decreases in a direction opposite to the first direction (direction ①). In some embodiments, the conduit structure 320 may include a coupling structure for the conduits, in which the coupling structure has an internal space (e.g., the internal space 3201 in FIG. 24A), the size of which is always constant regardless of protruding and receding of the conduits. According to an embodiment, the conduit structure 320 may include a first conduit 321 fixed to the second housing 220, a second conduit 322, which accommodates the first conduit 321 to be capable of protruding and receding, and a third conduit 323, which accommodates the second conduit 322 to be capable of protruding and receding and is fixed to the first housing 210. According to an embodiment, the first conduit 321 may be fixed to the second support member 222 of the second housing. According to an embodiment, the third conduit 323 may be fixed to the first support member 212 of the first housing 210. In some embodiments, the conduit structure 320 may have a coupling structure in which two conduits or four or more conduits are coupled to be capable of protruding and receding.

Figure 23A:
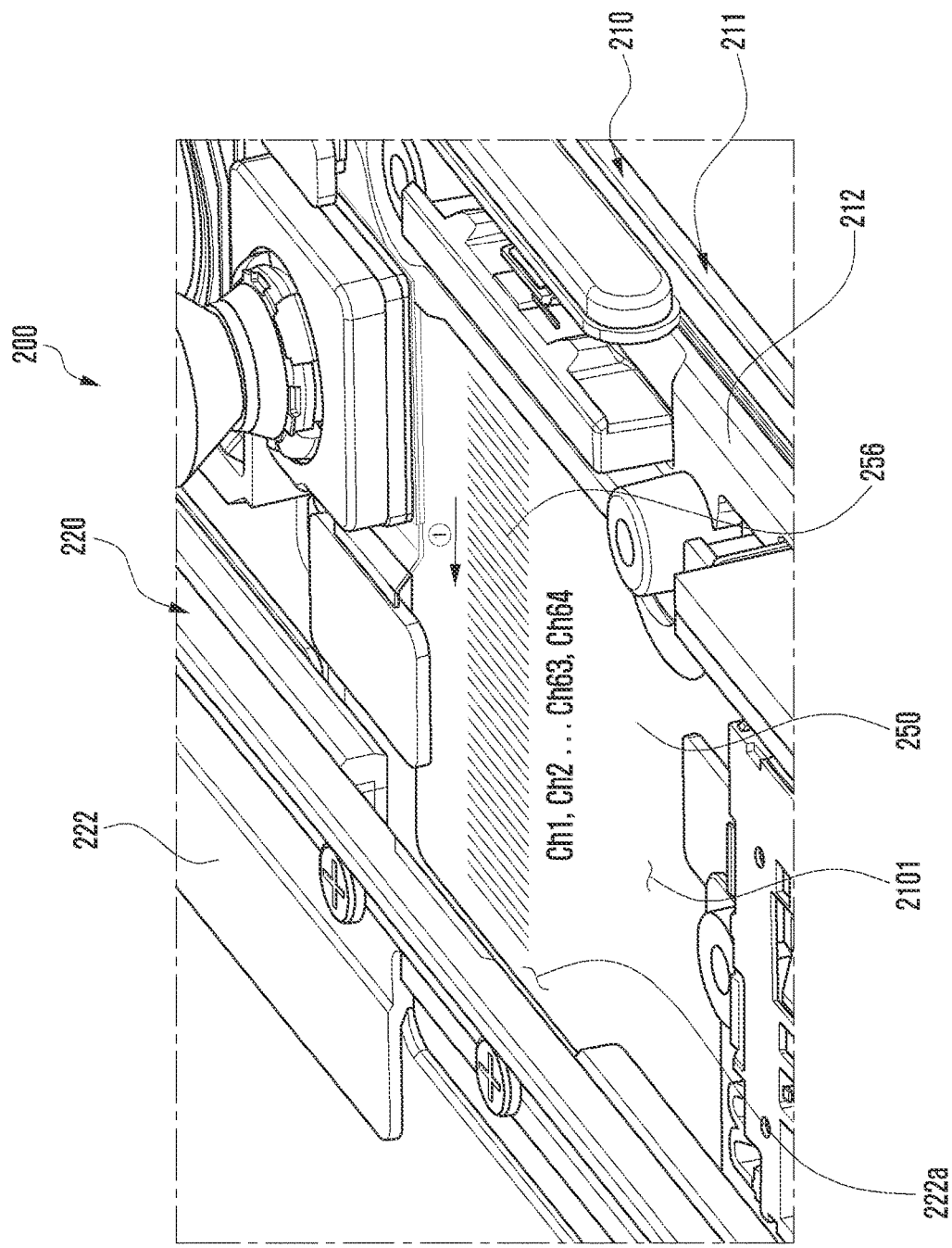
FIG. 23A is a perspective view illustrating a portion of an electronic device including a sensing member according to an embodiment of the disclosure.

FIG. 23A is a perspective view illustrating a portion of an electronic device including a sensing member according to an embodiment of the disclosure.

Figure 23B:
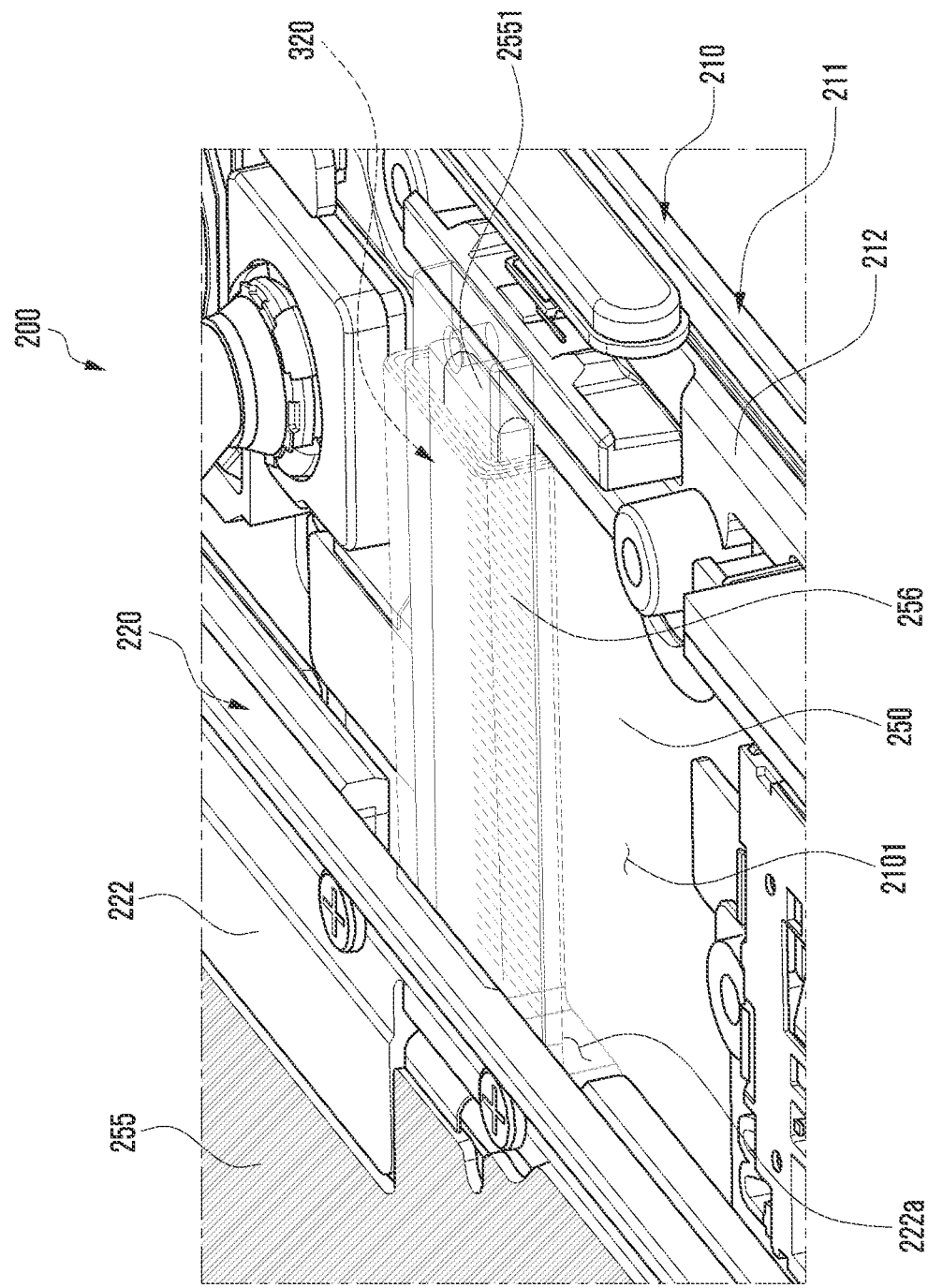
FIG. 23B is a perspective view illustrating a portion of an electronic device including a conduit structure according to an embodiment of the disclosure.

FIG. 23B is a perspective view illustrating a portion of an electronic device including a conduit structure according to an embodiment of the disclosure.

Referring to FIGS. 23A and 23B, the electronic device 200 may include a main board 250 disposed in the first space 2101 of the first housing 210 and a sensing member 256 disposed on the main board 250. In some embodiments, the sensing member 256 may be disposed on another board (e.g., an FPCB) disposed separately from the main board 250 in the first space 2101 of the electronic device 200. For example, the sensing member 256 may include a sensor 256 (e.g., a touch sensor) including multiple channels each having a length for detecting a conductive portion of the FPCB 2551 that is substantially at least partially in contact therewith. According to an embodiment, the sensing member 256 has a capacitance that is changed when the conductive portion of the FPCB 2551 comes into surface contact, line contact, or point contact with the sensing member 256. According to an embodiment, the second housing 220 includes an opening portion 222a through which the FPCB 2551 is drawn out from the electrical structure 255 disposed in the second space 2201 to the first space 2101. According to an embodiment, the opening portion 222a may be formed by changing the shape of the second support member 222 of the second housing 220. According to an embodiment, the electronic device 200 may include a protruding/receding conduit structure 320 disposed in an area overlapping the sensing member 256 when the main board 250 is viewed from above, and configured to accommodate the FPCB 2551 in the internal space thereof (e.g., the internal space 3201 in FIG. 24A). Accordingly, the FPCB 2551 is disposed to be supported by the conduit structure 320, which may be helpful for preventing the FPCB 2551 from being separated from the sensing member 256 during operation.

Figure 24A:
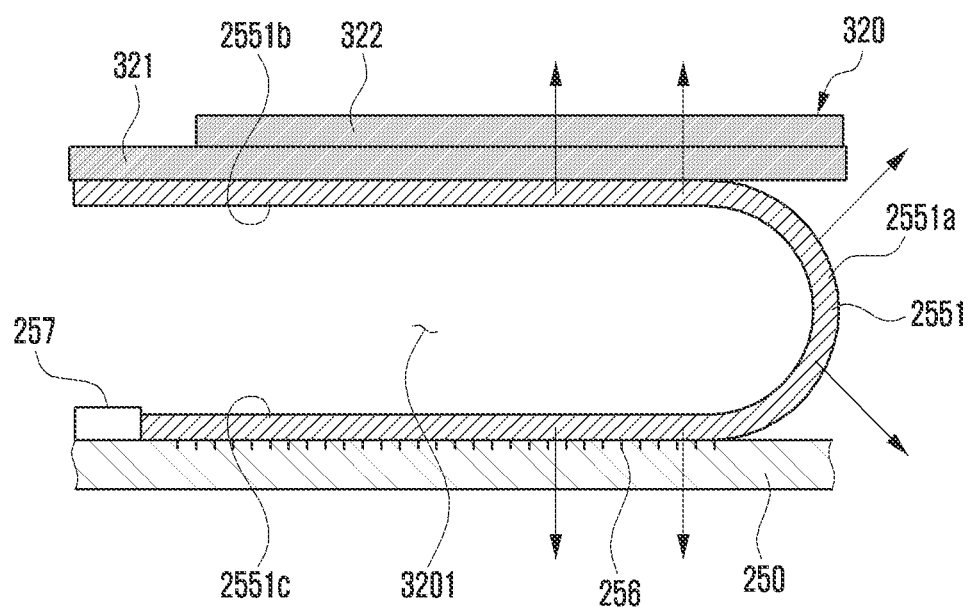
FIG. 24A is a view illustrating an arrangement relationship of a conductive member according to a protruding and receding operation of a conduit structure according to an embodiment of the disclosure.
Figure 24B:
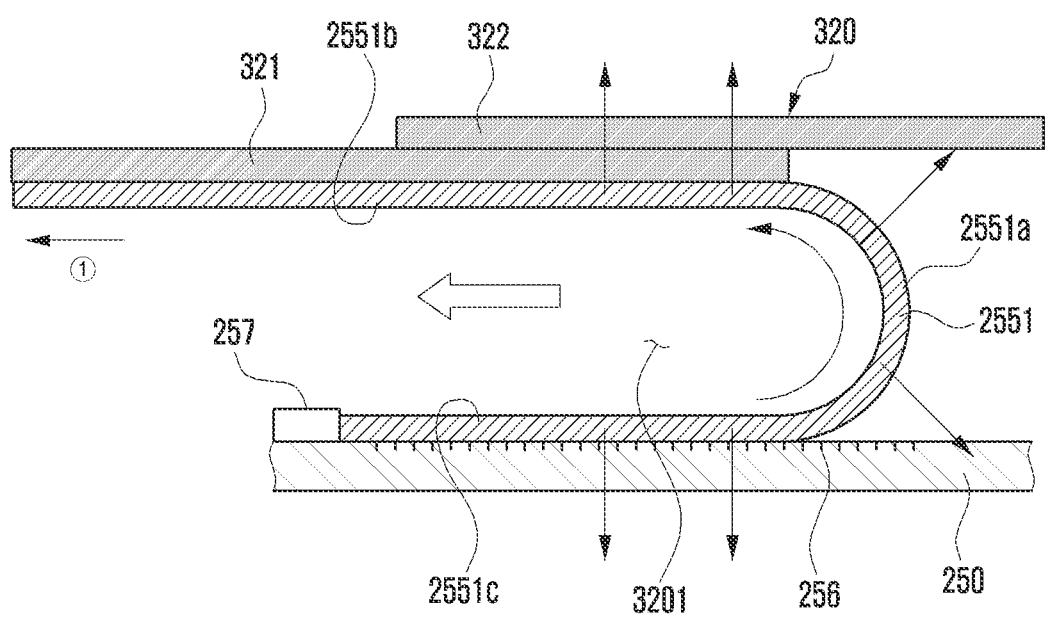
FIG. 24B is a view illustrating an arrangement relationship of a conductive member according to a protruding and receding operation of a conduit structure according to an embodiment of the disclosure.

FIG. 24A is a view illustrating an arrangement relationship of a conductive member according to a protruding and receding operation of a conduit structure according to an embodiment of the disclosure, and FIG. 24B is a view illustrating an arrangement relationship of a conductive member according to a protruding and receding operation of a conduit structure according to an embodiment of the disclosure.

Referring to FIGS. 24A and 24B, the FPCB 2551 may be disposed in the internal space 3201 of the conduit structure 320 to be at least partially in contact with the sensing member 256 of the main board 250. According to one embodiment, in the internal space 3201 of the conduit structure 320, with respect to a bent portion 2551a, one side portion 2551b of the FPCB 2551 may be in contact with the inner surface of the conduit structure 320, and the other side portion 2551c of the FPCB 2551 may be contact in contact with the sensing member 256 of the main board 250. Accordingly, the one side portion 2551b and the other side portion 2551c of the FPCB 2551 may be in tight contact with the inner wall of the conduit structure 320 and the outer surface of the main board 250 by the elastic force of the bent portion 2551a, which is to be unfolded. Through the tight contact structure of the FPCB 2551, the FPCB 2551 can be in contact with the main board 250, in which, when the one side portion 2551b of the FPCB 2551 is moved, the other side portion 2551 can also be moved by substantially the same amount. According to an embodiment, one end of the FPCB 2551 may be fixed to the main board 250 using a fixing member 257 (e.g., a connector).

According to various embodiments, when the electronic device is shifted from the slide-in state (the state of FIG. 24A) to the slide-out state (the state of FIG. 24B), the one side portion 2551b of the FPCB 2551 connected to the electrical structure 255 disposed in the second housing 220 may be moved in the first direction (direction ①) along the inner surface of the conduit structure 320 by the protruding/receding operation structure of the conduits 321 and 322. At the same time, the contact of the other side portion 2551c of the FPCB 2551 with the sensor member 256 disposed on the main board 250 may be variable. For example, the sensing member 256 may detect a change in contact with the FPCB 2551 so as to determine the slide-out state of the electronic device 200. In some embodiments, while the electronic device 200 is being shifted from the slide-in state to the slide-out state, the sensing member 256 may detect the sliding position of the second housing 220 in real time.

According to various embodiments, the electronic device 200 may include at least one processor (e.g., the processor 120 in FIG. 1) operatively connected to the sensing member 256 and the flexible display (e.g., the flexible display 230 in FIG. 2A). According to an embodiment, the at least one processor 120 may determine the slide-in state, the slide-out state, or a state during the shifting operation of the electronic device 200 using a sensing member 256, which detects contact with the FPCB 2551. According to an embodiment, the at least one processor 120 may detect the current display area of the flexible display 230 using the sensing member 256, which detects contact with the FPCB 2551, and may control the flexible display 230 to display at least one object in the current display area. According to an embodiment, the at least one processor 120 may control at least one application using the sensing member 256, which detects contact with the FPCB 2551. According to an embodiment, the at least one application may include a program related to sound input/output through a speaker and/or a microphone and/or a program related to tactile output through a vibration motor.

Figure 25A:
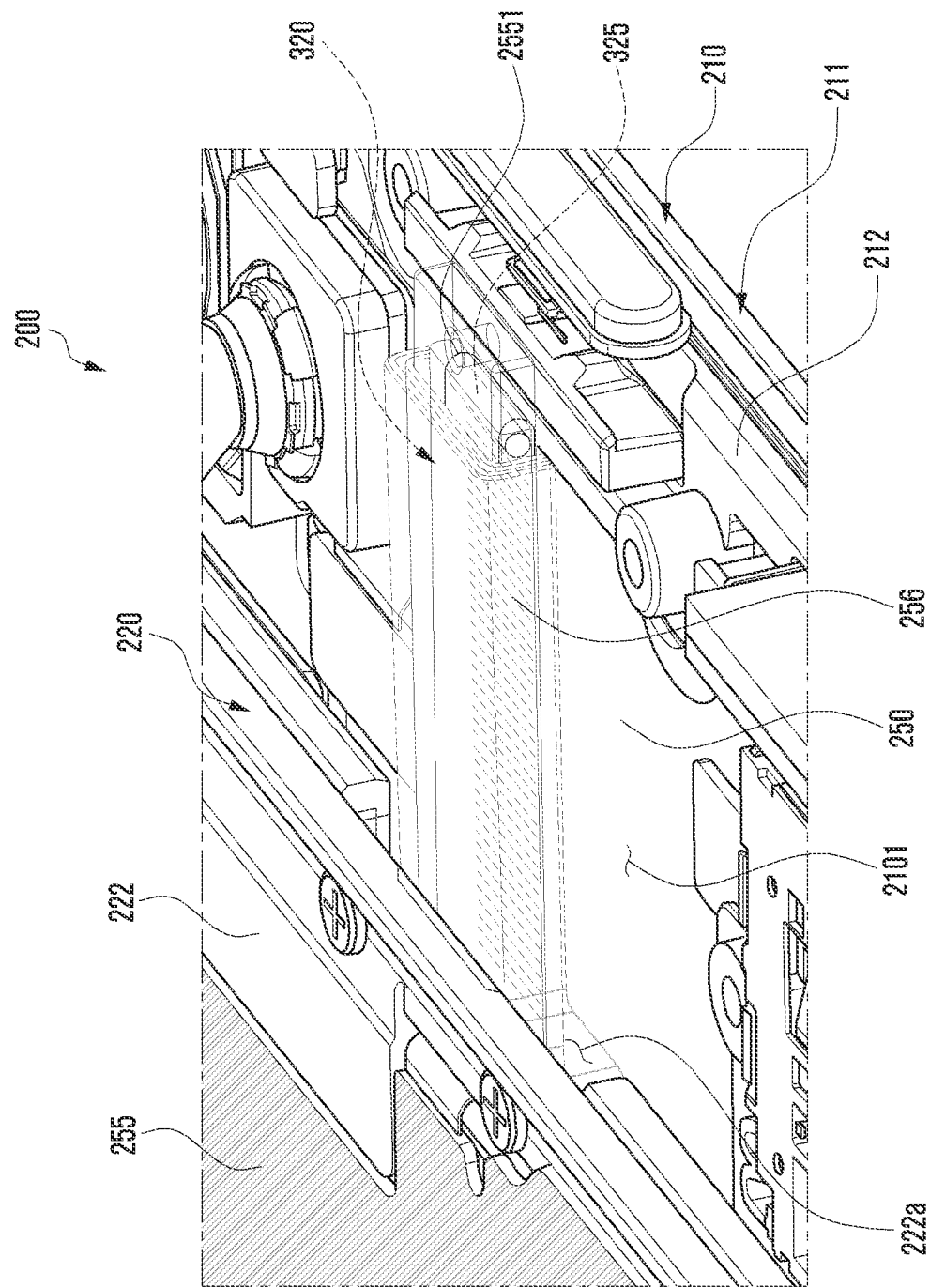
FIG. 25A is a perspective view illustrating a portion of an electronic device including a conduit structure according to an embodiment of the disclosure.
Figure 25B:
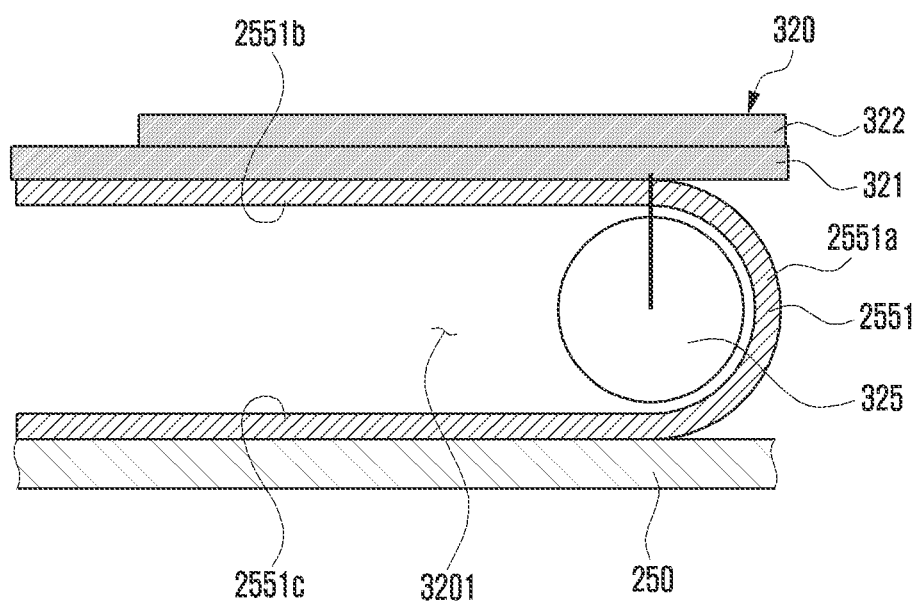
FIG. 25B is a view illustrating an arrangement relationship of a conductive member according to a protruding and receding operation of a conduit structure including a support roller according to an embodiment of the disclosure.

FIG. 25A is a perspective view illustrating a portion of an electronic device including a conduit structure according to an embodiment of the disclosure. FIG. 25B is a view illustrating an arrangement relationship of a conductive member according to a protruding and receding operation of a conduit structure including a support roller according to an embodiment of the disclosure, and FIG. 25C is a view illustrating an arrangement relationship of a conductive member according to a protruding and receding operation of a conduit structure including a support roller according to an embodiment of the disclosure.

Figure 25C:
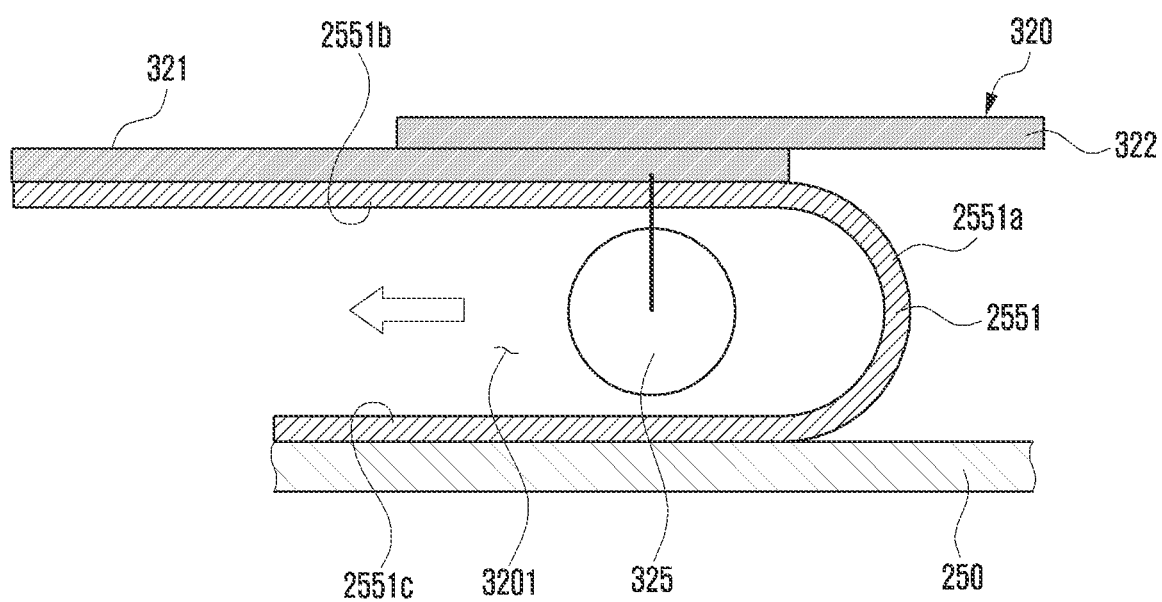
FIG. 25C is a view illustrating an arrangement relationship of a conductive member according to a protruding and receding operation of a conduit structure including a support roller according to an embodiment of the disclosure.

In describing the sensing structure of FIGS. 25A to 25C, the components that are substantially the same as those of the sensing structure of FIGS. 24A and 24B are denoted by the same referential numerals, and a detailed description thereof may be omitted.

Referring to FIGS. 25A to 25C, the sensing structure may include a support roller 325 disposed in the internal space 3201 of the conduit structure 320. According to an embodiment, the support roller 325 may be disposed between the bent portion 2551a and the one side portion 2551b and the other side portion 2551c of the FPCB 2551. According to an embodiment, the support roller 325 continuously supports the bent portion 2551a of the FPCB 2551 in the internal space of the conduit 321 fixed to the second housing 220 among the multiple pipes 321 and 322 such that the movement amount of the FPCB 2551 is substantially the same as the movement amount of the second housing 220, which may be helpful for inducing a high sensing resolution.

Figure 26A:
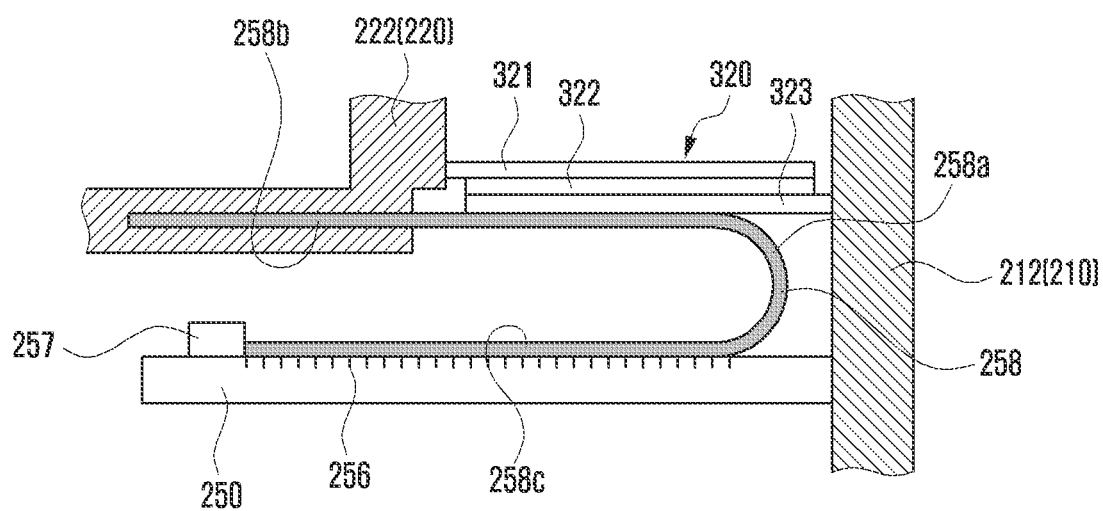
FIG. 26A is a view illustrating an arrangement member of a conductive member when an electronic device is in the slide-in state according to an embodiment of the disclosure.
Figure 26B:
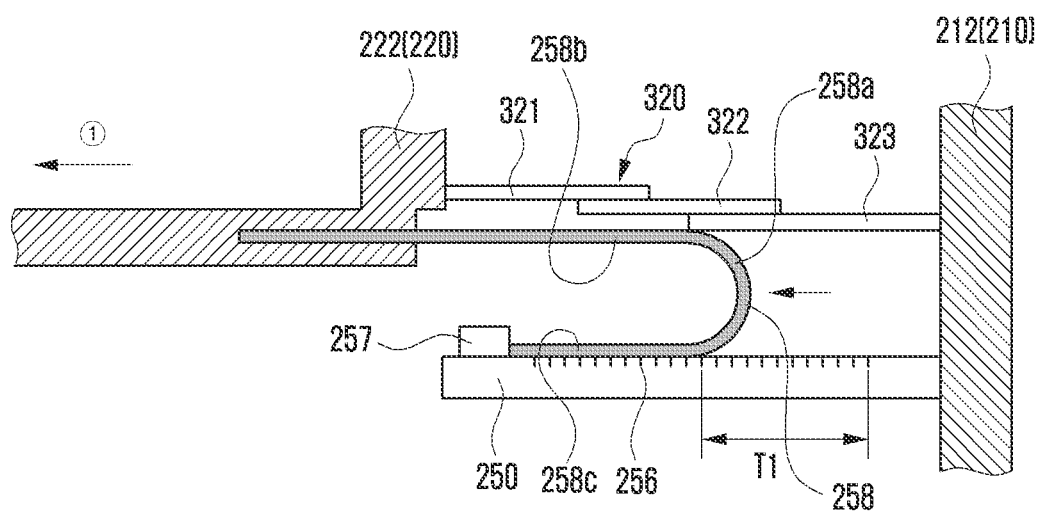
FIG. 26B is a view illustrating an arrangement relationship of a conductive member when an electronic device is in the slide-out state according to an embodiment of the disclosure.

FIG. 26A is a view illustrating an arrangement member of a conductive member when an electronic device is in the slide-in state according to an embodiment of the disclosure, and FIG. 26B is a view illustrating an arrangement relationship of a conductive member when an electronic device is in the slide-out state according to an embodiment of the disclosure.

In describing the sensing structure of FIGS. 26A and 26B, the components that are substantially the same as those of the sensing structure of FIGS. 24A and 24B are denoted by the same referential numerals, and a detailed description thereof may be omitted.

Referring to FIGS. 26A and 26B, as a member to be detected that is detected by the sensing member 256, the FPCB 2551 may be replaced by a separately disposed conductive member 258. According to an embodiment, the conductive member 258 may include an elastic metal plate or a conductive film. Accordingly, in the state of being bent in a "U" shape, one end of the conductive member 258 may be fixed to the second support member 222 of the second housing 220, and the other end may be fixed to the fixing portion 257 of the main board 250. According to an embodiment, in the internal space 3201 of the conduit structure 320 including the multiple conduit lines 321, 322, and 323, which are coupled to be capable of protruding and receding, with reference to the bend portion 258a, one side portion 258b of the conductive member 258 may be in contact with the inner surface of the conduit structure, and the other side portion 258c of the conductive member 258 may be in contact with the sensing member 256 of the main board. Accordingly, the one side portion 258b and the other side portion 258b of the conductive member may be in tight contact with the inner wall of the conduit structure 320 and the outer surface of the main board 250 by the elastic force of the bent portion 258a, which is to be unfolded, and may be moved by a predetermined reciprocating distance Ti while being in contact with the sensing member 256.

According to various embodiments, an electronic device (e.g., the electronic device 200 in FIG. 5) may include a first housing (e.g., the first housing 210 in FIG. 5) including a first space (e.g., the first space 2201 in FIG. 5), a second housing (e.g., the second housing 220 in FIG. 5) coupled to be slidable in a first direction (e.g., the direction ①) in FIG. 5) from the first housing and including a second space (e.g., the second space 2201 in FIG. 5), a bendable member (e.g., the bendable member 240 of FIG. 5) connected to the first housing. The bendable member is at least partially accommodated in the second space in a slid-in state and is at least partially coplanar to the first housing in a slid-out state, a flexible display (e.g., the flexible display 230 of FIG. 5) including a first portion (e.g., the first portion 230a in FIG. 2B) disposed to be visible from the outside in the slid-in state, and a second portion (e.g., the second portion 230b in FIG. 2B) extending from the first portion and accommodated in the second space to be invisible from the outside through at least a portion of the bendable member, and a support assembly (e.g., the support assembly 260 in FIG. 6A) disposed to be oriented from the first housing toward the second space and configured to press the second housing in the slid-out direction. In the slid-in state, a portion of the first housing may be accommodated in the second space to be invisible, and a remaining portion may be disposed to be visible from the outside.

According to various embodiments, in the slid-out state, the second portion of the flexible display may be exposed to the outside to be visible while being supported by at least a portion of the bendable member.

According to various embodiments, the first housing may include a first side member and a first support member extending from the first side member to the first space, and the first side member may include the first side surface, a second side surface extending from the first side surface in a second direction perpendicular to the first direction, and a third side surface extending from the second side surface in a direction parallel to the first side surface.

According to various embodiments, the second housing may include a second side member and a second support member extending from the second side member to the first space, and the second side member may include a fourth side surface facing at least a portion of the first side surface, a fifth side surface extending from the fourth side surface and disposed parallel to the second side surface, and a sixth side surface extending from the fifth side surface and facing at least a portion of the third side surface.

According to various embodiments, in the slid-in state, a portion of the first side surface and a portion of the third side surface may be exposed to be visible from the outside.

According to various embodiments, in the slid-in state, the first support member may include a non-overlapping portion exposed to the outside without overlapping the second support member, and an overlapping portion extending from the non-overlapping portion and overlapping the second support member.

According to various embodiments, in the slid-in state, the non-overlapping portion of the first support member and the second support member may be substantially coplanar to each other.

According to various embodiments, the first space may include a first sub-space corresponding to the non-overlapping portion and a second sub-space connected to the first sub-space and corresponding to the overlapping portion.

According to various embodiments, the first sub-space may be larger than the second sub-space.

According to various embodiments, the electronic device may further include at least one first electronic component disposed in the first sub-space, at least one second electronic component disposed in the second sub-space, and at least one third electronic component disposed over the first sub-space and the second sub-space.

According to various embodiments, the at least one first electronic component may include at least one of at least one camera module, at least one sensor module, or a main board.

According to various embodiments, the electronic device may further include a support assembly disposed to be oriented from the first housing toward the second space and configured to press the second housing in a slid-out direction.

According to various embodiments, the support assembly may include at least one support structure disposed in the first housing, and configured to support at least a portion of the bendable member and to press the bendable member in the slid-out direction, and a pressing member disposed on the support structure and configured to press the bendable member.

According to various embodiments, the at least one support structure may include a first link having a predetermined length and including a first hinge arm and a second hinge arm at respective opposite ends thereof, a second link having a predetermined length and including a third hinge arm and a fourth hinge arm at respective opposite ends thereof, and an elastic member configured to press the first link and the second link to be unfolded to a predetermined angle. The first link may be disposed such that the first hinge arm is rotatably fixed to the housing, and the second link may be disposed such that the third hinge arm is rotatably fixed to the first hinge arm.

According to various embodiments, the pressing member may include one end rotatably fixed to the fourth hinge arm and the other end being in contact with the bendable member so that the pressing member can press the second housing in the slid-out direction.

According to various embodiments, the first link and/or the second link may be at least partially in contact with the bendable member.

According to various embodiments, the electronic device may further include a friction reduction member disposed on a contact surface of the first link member and/or the second link with the bendable member and/or on a contact surface of the bendable member with the first link member and/or the second link member.

According to various embodiments, the friction reduction member may include a POM layer, an acetal layer, or a Teflon layer disposed on the contact surfaces.

According to various embodiments, the elastic member may include a torsion spring that is fixed to rotation shafts of the second hinge arm and the third hinge arm and presses the first link and the second link to be unfolded to the predetermined angle.

According to various embodiments, the electronic device may further include a first engagement portion provided on the second hinge arm of the second link of the first link and a second engagement portion formed on the third hinge arm of the second link, and the first link and the second link are regulated to be unfolded to the designated angle through a structure in which the first engagement portion and the second engagement portion are engaged with each other, and the predetermined angle may be determined to be less than 180 degrees.

According to various embodiments, the electronic device may further include a locker disposed in the first housing to be movable and configured to be engaged with an engagement step disposed at a corresponding position on the second housing in the slid-in state, and through the engagement operation of the locker, the pressing force of the support assembly in the slid-out direction may be regulated.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a first housing including a first space;
   a second housing including a second space, the second housing coupled to the first housing such that the second housing is slidable in a first direction including a slid-out direction;
   a bendable support member connected to the first housing, wherein the bendable support member is at least partially accommodated in the second space in a slid-in state and is at least partially coplanar to a part of the first housing in a slid-out state;
   a flexible display including a first area disposed to be visible when the second housing is in the slid-in state and a second area extending from the first area and accommodated in the second space through at least a portion of the bendable support member; and
   a support assembly disposed to be oriented from the first housing toward the second space and including a first link rotatably coupled to the first housing and second link rotatably coupled to the first link,
   wherein, in the slid-in state, a portion the first housing is disposed in the second space of the second housing to be invisible and a remaining portion of the first housing is disposed to be visible from outside, and
   wherein both a portion of the first link and a portion of the second link are configured to press a portion of a rear surface of the bendable support member during shifting from the slid-in state to the slid-out state to maintain a flat surface of the flexible display.

2. The electronic device of claim 1, wherein, in the slid-out state, the second area of the flexible display is exposed from the second space while being supported by at least a portion of the bendable support member.

3. The electronic device of claim 1,
   wherein the first housing includes a first side member and a first support member extending from the first side member to the first space, and
   wherein the first side member includes a first side surface, a second side surface extending from the first side surface in a second direction perpendicular to the first direction, and a third side surface extending from the second side surface in a direction parallel to the first side surface.

4. The electronic device of claim 3,
wherein the second housing includes a second side member and a second support member extending from the second side member to the second space, and
wherein the second side member includes a fourth side surface facing at least a portion of the first side surface, a fifth side surface extending from the fourth side surface and disposed parallel to the second side surface, and a sixth side surface extending from the fifth side surface and facing at least a portion of the third side surface.

5. The electronic device of claim 4, wherein, in the slid-in state, a portion of the first side surface and a portion of the third side surface are exposed from the second space.

6. The electronic device of claim 4, wherein, in the slid-in state, the first support member includes a non-overlapping portion exposed from the second space without overlapping the second support member, and an overlapping portion extending from the non-overlapping portion and overlapping the second support member.

7. The electronic device of claim 6, wherein, in the slid-in state, the non-overlapping portion of the first support member and the second support member are substantially coplanar to each other.

8. The electronic device of claim 6, wherein the first space includes a first sub-space corresponding to the non-overlapping portion and a second sub-space connected to the first sub-space and corresponding to the overlapping portion.

9. The electronic device of claim 8, wherein the first sub-space is larger than the second sub-space.

10. The electronic device of claim 8, further comprising:
at least one first electronic component disposed in the first sub-space;
at least one second electronic component disposed in the second sub-space; and
at least one third electronic component disposed over the first sub-space and the second sub-space.

11. The electronic device of claim 1, wherein the support assembly includes:
at least one support structure disposed in the first housing, and configured to support at least a portion of the bendable support member and to press the bendable support member in the slid-out direction, and
a pressing member disposed on the support structure and configured to press the bendable support member.

12. The electronic device of claim 11, wherein the at least one support structure includes:
the first link having a predetermined length and including a first hinge arm and a second hinge arm at respective opposite ends thereof,
the second link having a predetermined length and including a third hinge arm and a fourth hinge arm at respective opposite ends thereof, and
an elastic member configured to press the first link and the second link to be unfolded to a predetermined angle,
wherein the first link is disposed such that the first hinge arm is rotatably fixed to the first housing, and
wherein the second link is disposed such that the third hinge arm is rotatably fixed to the first hinge arm.

13. The electronic device of claim 12, wherein the pressing member includes one end rotatably fixed to the fourth hinge arm and another end being in contact with the bendable support member, thereby pressing the second housing in the slid-out direction.

14. The electronic device of claim 12, wherein the first link or the second link is at least partially in contact with the bendable support member.

15. The electronic device of claim 1, further comprising:
a locking mechanism disposed in the first housing to be movable and configured to be engaged with an engagement step disposed at a corresponding position on the second housing in the slid in state,
wherein, through an engagement operation of the locking mechanism, a pressing force of the support assembly in the slid-out direction is regulated.

16. The electronic device of claim 10, wherein the at least one first electronic component includes at least one of at least one camera module, at least one sensor module, or a main board.

17. The electronic device of claim 14, further comprising:
a friction reduction member disposed on a contact surface of the first link and/or the second link with the bendable support member and/or on a contact surface of the bendable support member with the first link and/or the second link.

18. The electronic device of claim 17, wherein the friction reduction member includes a POM layer, an acetal layer, or a Teflon layer disposed on the contact surfaces.

19. The electronic device of claim 13, wherein the elastic member may include a torsion spring that is fixed to rotation shafts of the second hinge arm and the third hinge arm and presses the first link and the second link to be unfolded to the predetermined angle.

20. The electronic device of claim 13, further comprising:
a first engagement portion provided on the second hinge arm of the second link of the first link; and
a second engagement portion formed on the third hinge arm of the second link,
wherein the first link and the second link are regulated to be unfolded to the predetermined angle through a structure in which the first engagement portion and the second engagement portion are engaged with each other, and
wherein the predetermined angle may be determined to be less than 180 degrees.

* * * * *